US012777670B2

(12) United States Patent
Zhang et al.

(10) Patent No.: US 12,777,670 B2
(45) Date of Patent: Oct. 27, 2026

(54) SEMICONDUCTOR STRUCTURE AND METHOD FOR FORMING THE SAME

(71) Applicant: TAIWAN SEMICONDUCTOR MANUFACTURING COMPANY, LTD., Hsinchu (TW)

(72) Inventors: Da-Zhi Zhang, Hsinchu (TW); Chun-An Lu, Hsinchu County (TW); Chung-Yu Chiang, Yuanlin Township, Changhua County (TW); Po-Nien Chen, Miaoli County (TW); Hsiao-Han Liu, Miaoli County (TW); Jhon-Jhy Liaw, Zhudong Township, Hsinchu County (TW); Chih-Yung Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 701 days.

(21) Appl. No.: 18/167,423

(22) Filed: Feb. 10, 2023

(65) Prior Publication Data

US 2024/0105849 A1 Mar. 28, 2024

Related U.S. Application Data

(60) Provisional application No. 63/410,006, filed on Sep. 26, 2022.

(51) Int. Cl.

| | |
|---|---|
| ***H10D 30/62*** | (2025.01) |
| ***H10D 30/01*** | (2025.01) |
| ***H10D 84/01*** | (2025.01) |
| ***H10D 84/03*** | (2025.01) |

(Continued)

(52) U.S. Cl.

CPC ....... *H10D 30/6211* (2025.01); *H10D 30/024* (2025.01); *H10D 84/013* (2025.01); *H10D 84/0158* (2025.01); *H10D 84/038* (2025.01); *H10W 20/42* (2026.01); *H10W 20/435* (2026.01)

(58) Field of Classification Search

CPC ............... H10W 20/42; H10W 20/435; H10D 84/0151; H10D 84/0188; H10D 84/013; H10D 84/0149; H10D 84/0158; H10D 84/834; H10D 30/6211; H10D 30/024

See application file for complete search history.

(56) References Cited

U.S. PATENT DOCUMENTS

| | | | | |
|---|---|---|---|---|
| 9,653,583 | B1 * | 5/2017 | Zhao | H01L 21/31053 |
| 2019/0109045 | A1 * | 4/2019 | Xie | H10D 30/6219 |
| 2020/0044070 | A1 * | 2/2020 | Wang | H10D 30/024 |

* cited by examiner

*Primary Examiner* — Tuan A Hoang

(74) *Attorney, Agent, or Firm* — Cooper Legal Group, LLC

(57) ABSTRACT

A method for forming a semiconductor structure is provided. The method for forming the semiconductor structure includes forming a fin structure over a substrate in a first direction, forming a first gate stack, a second gate stack and a third gate stack across the fin structure, removing the first gate stack to form a trench, depositing a cutting structure in the trench, and forming a first contact plug between the cutting structure and the second gate stack and a second contact plug between the second gate stack and the third gate stack. The fin structure is cut into two segments by the trench. A first dimension of the first contact plug in the first direction is greater than a second dimension of the second contact plug in the first direction.

20 Claims, 42 Drawing Sheets

(51) Int. Cl.

| | |
|---|---|
| ***H10W 20/41*** | (2026.01) |
| ***H10W 20/42*** | (2026.01) |

SEMICONDUCTOR STRUCTURE AND METHOD FOR FORMING THE SAME

PRIORITY CLAIM

This application claims the benefit of U.S. Provisional Application No. 63/410,006, filed on Sep. 26, 2022 and entitled "SEMICONDUCTOR STRUCTURE AND METHOD FOR FORMING THE SAME," which is incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C-1, 2D-1, 2E-1, 2F-1 and 2G-1 are cross-sectional views of the semiconductor structure taken along line X-X of FIGS. 2A, 2B, 2C, 2D, 2E, 2F and 2G, respectively, in accordance with some embodiments of the disclosure.

FIGS. 2A-2, 2B-2, 2C-2, 2D-2, 2E-2, 2F-2 and 2G-2 are cross-sectional views of the semiconductor structure taken along line Y1-Y1 of FIGS. 2A, 2B, 2C, 2D, 2E, 2F and 2G, respectively, in accordance with some embodiments of the disclosure.

FIGS. 2A-3, 2B-3, 2C-3, 2D-3, 2E-3, 2F-3 and 2G-3 are cross-sectional views of the semiconductor structure taken along line Y2-Y2 of FIGS. 2A, 2B, 2C, 2D, 2E, 2F and 2G, respectively, in accordance with some embodiments of the disclosure.

FIG. 3 is a modification of the semiconductor structure of FIG. 2G-1, in accordance with some embodiments of the disclosure.

FIGS. 4B-1 and 4C-1 are cross-sectional views of the semiconductor structure taken along line X-X of FIGS. 4B and 4C, respectively, in accordance with some embodiments of the disclosure.

FIG. 4C-2 is a cross-sectional view of the semiconductor structure taken along line Y1-Y1 of FIG. 4C, in accordance with some embodiments of the disclosure.

FIG. 4C-3 is a cross-sectional view of the semiconductor structure taken along line Y2-Y2 of FIG. 4C, in accordance with some embodiments of the disclosure.

FIGS. 5B-1 and 5C-1 are cross-sectional views of the semiconductor structure taken along line X-X of FIGS. 5B and 5C, respectively, in accordance with some embodiments of the disclosure.

FIG. 5C-2 is a cross-sectional view of the semiconductor structure taken along line Y1-Y1 of FIG. 5C, in accordance with some embodiments of the disclosure.

FIG. 5C-3 is a cross-sectional view of the semiconductor structure taken along line Y2-Y2 of FIG. 5C, in accordance with some embodiments of the disclosure.

FIG. 6-1 is a cross-sectional view of the semiconductor structure taken along line X-X of FIG. 6, in accordance with some embodiments of the disclosure.

FIG. 8-1 is a cross-sectional view of the semiconductor structure taken along line X-X of FIG. 8, in accordance with some embodiments of the disclosure.

FIG. 9-1 is a cross-sectional view of the semiconductor structure taken along line X-X of FIG, in accordance with some embodiments of the disclosure.

DETAILED DESCRIPTION

Figure 1:
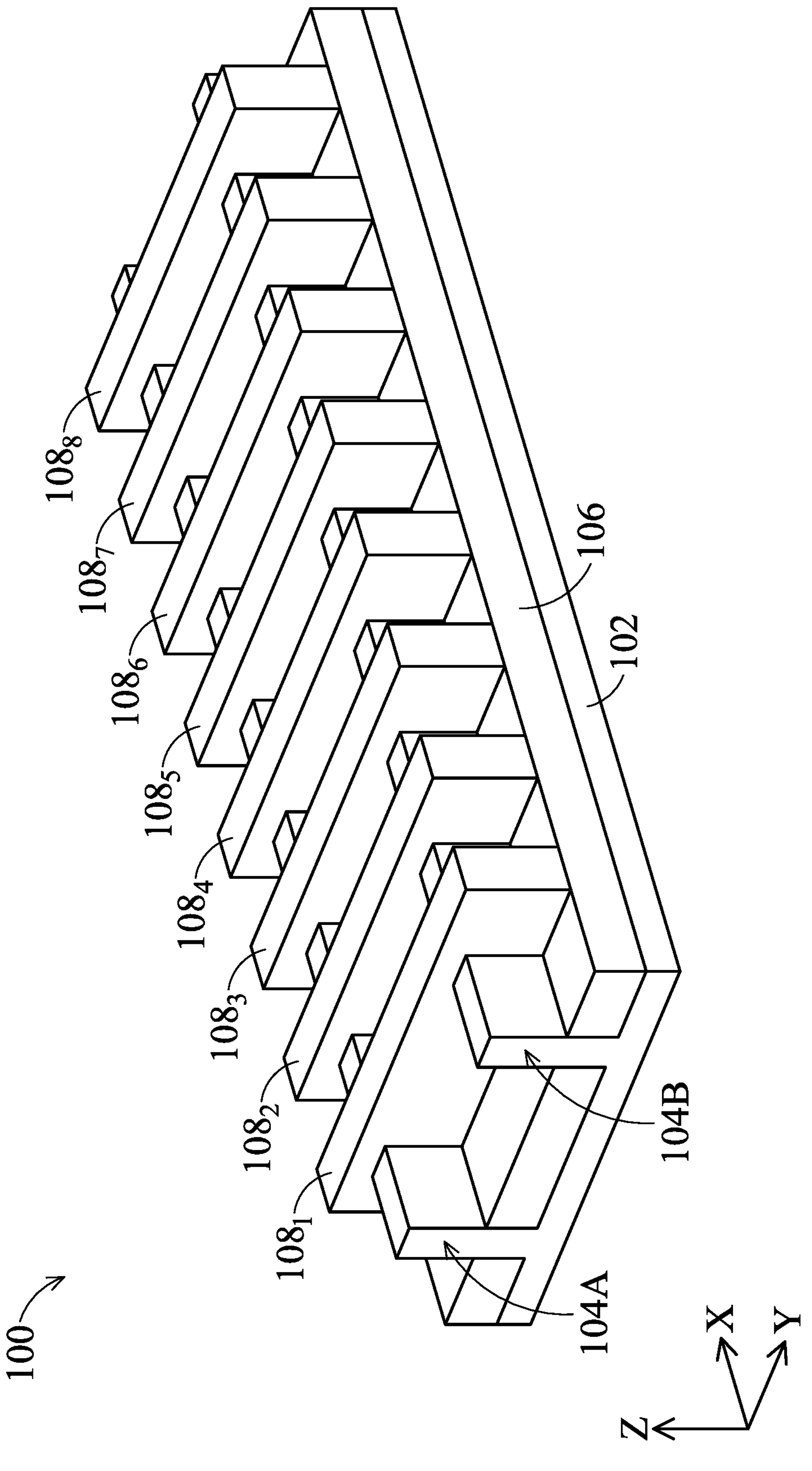
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more lithography processes, including double-patterning or multi-patterning processes Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of a semiconductor structure and a method for forming the same are provided. The semiconductor structure includes a functional circuit in a cell region, a fin cutting structure on the cell edge, and a contact plug within a cell region immediately adjacent to the cell edge. The contact plug is formed with a wider dimension by reducing the distance between the contact plug and the fin cutting structure while keeping the distance between the contact plug and an adjacent final gate stack of the functional circuit constant. Therefore, the resistance of the functional circuit in the cell region may be reduced, while the parasitic capacitance of the functional circuit may be not increased.

FIG. 1 is a perspective view of a semiconductor structure 100, in accordance with some embodiments of the disclosure. The semiconductor structure 100 includes a substrate 102 and fin structures 104 (including 104A and 104B) over the substrate 102, as shown in FIG. 1, in accordance with some embodiments. The fin structures 104A and 104B are the active regions of the semiconductor structure 100, in accordance with some embodiments.

For a better understanding of the semiconductor structure 100, the X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The fin structures 104A and 104B extend in the X direction, in accordance with some embodiments. That is, the fin structures 104A and 104B have longitudinal axes parallel to the X direction, in accordance with some embodiments. The X direction may also be referred to as the channel-extending direction. The current of the resulting semiconductor devices (i.e., FinFETs) flows in the X direction through the channel.

Each of the fin structures 104A and 104B is defined as several channel regions and source/drain regions, where the channel regions and the source/drain regions are alternately arranged, in accordance with some embodiments. In this disclosure, a source/drain refers to a source and/or a drain. The number of channel regions and source/drain regions may be dependent on the demands on the design of the circuit and/or performance considerations of the semiconductor device.

Gate structures 108 (including $\mathbf{108}_{1-8}$) are formed with longitudinal axes parallel to the Y direction and extending across and/or surrounding the channel regions of the fin structures 104A and 104B, in accordance with some embodiments. The source/drain regions of the fin structures 104A and 104B are exposed from the gate structures 108, in accordance with some embodiments. The Y direction may also be referred to as a gate-extending direction.

FIGS. 2A, 2B, 2C, 2D, 2E, 2F and 2G are plan views illustrating the formation of a semiconductor structure 100 at various intermediate stages, in accordance with some embodiments of the disclosure.

Figure 2A:
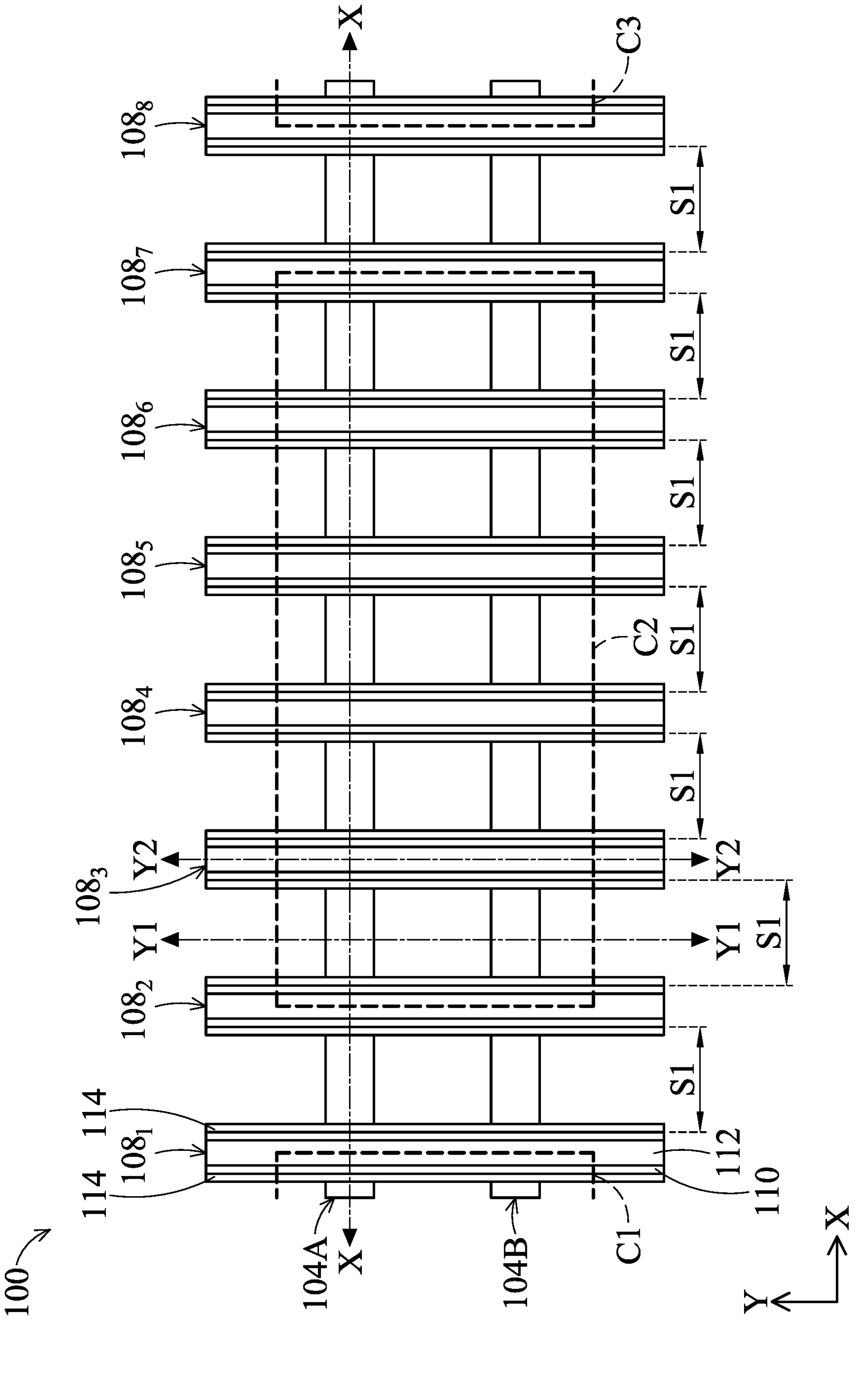
FIGS. 2A, 2B, 2C, 2D, 2E, 2F and 2G are plan views illustrating the formation of a semiconductor structure at various intermediate stages, in accordance with some embodiments of the disclosure.
Figures 1, 2A:
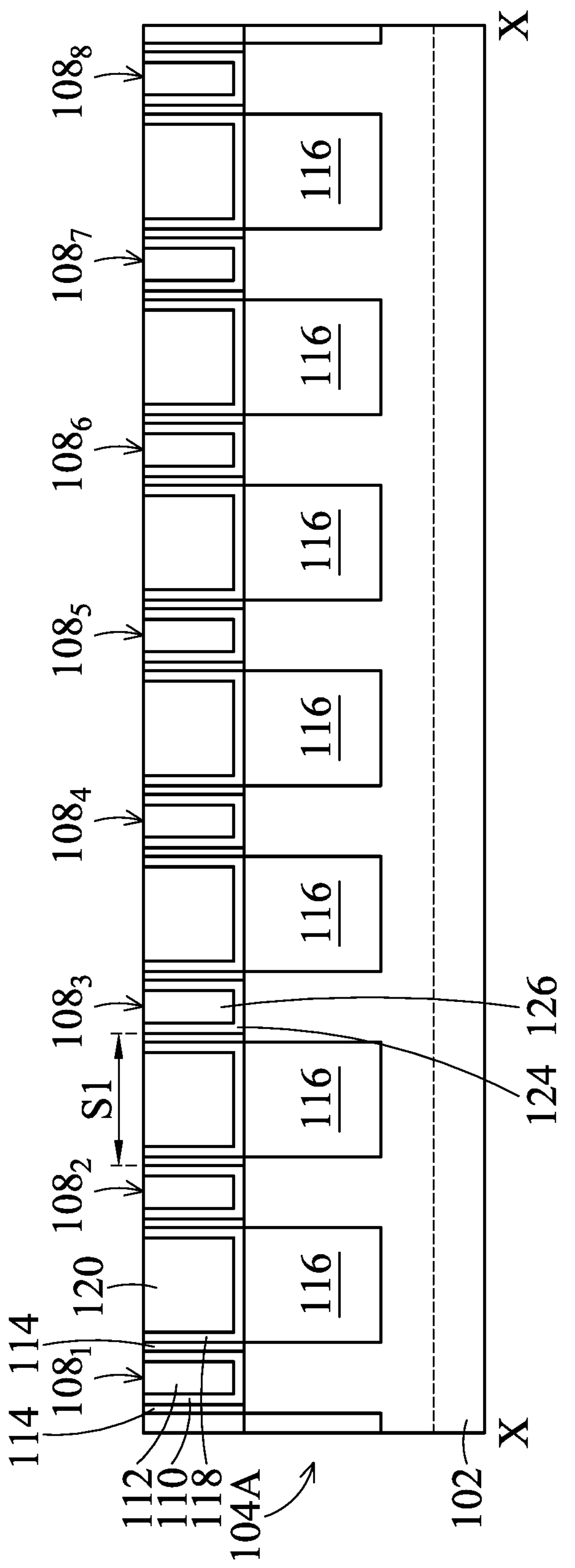
Figures 2, 2A, 3:
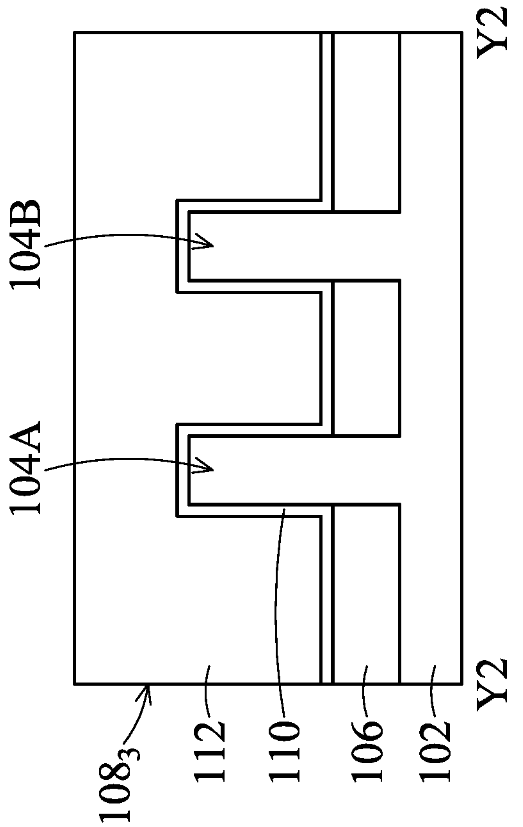
Figures 2, 2A:
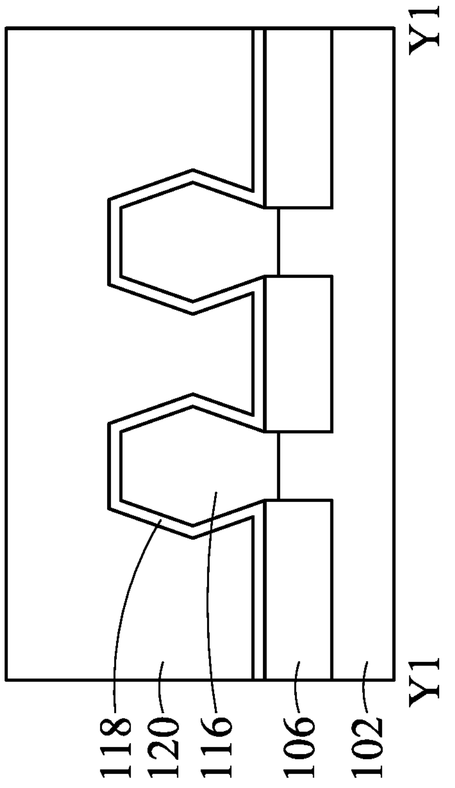

FIGS. 2A through 2A-3 illustrate a semiconductor structure 100 after the formation of fin structures 104, an isolation structure 106, dummy gate structures 108, gate spacer layers 114, source/drain features 116, contact etching stop layer (CESL) 118, and first interlayer dielectric layer 120, in accordance with some embodiments. FIGS. 2A-1, 2A-2 and 2A-3 are cross-sectional views of the semiconductor structure 100 taken along line X-X, line Y1-Y1 and line Y2-Y2 of FIG. 2A, respectively. It should be noted that the plan views in the present disclosure only illustrate some components of the semiconductor structure 100 for illustrative purposes, some other components of the semiconductor structure 100 may be shown in the cross-sectional views.

The semiconductor structure 100 includes a substrate 102, fin structures 104 (including 104A and 104B) and an isolation structure 106 over the substrate 102, and the dummy gate structures (including $\mathbf{108}_{1-8}$) over the fin structures 104 and the isolation structure 106, as shown in FIGS. 2A through 2A-3, in accordance with some embodiments. In some embodiments, the fin structures 104A and 104B extend in the X direction. The fin structures 104A and 104B have longitudinal axes parallel to the X direction, in accordance with some embodiments. That is, the dimensions (lengths) of the fin structures 104A and 104B in the X direction are greater than the dimensions (widths) of the fin structures 104A and 104B in the Y direction.

The dummy gate structures $\mathbf{108}_{1-8}$ extend across and surround the channel regions of the fin structures 104A and 104B, in accordance with some embodiments. In some embodiments, the dummy gate structures $\mathbf{108}_{1-8}$ extend in the Y direction. The dummy gate structures $\mathbf{108}_{1-8}$ have longitudinal axes parallel to the Y direction, in accordance with some embodiments. That is, the dimensions (lengths) of the dummy gate structures $\mathbf{108}_{1-8}$ in the Y direction are greater than the dimensions (widths) of the dummy gate structures $\mathbf{108}_{1-8}$ in the X direction.

The semiconductor structure 100 is used to form an integrated circuit which includes several functional circuits interconnected with each other, in accordance with some embodiments. Some regions of the substrate 102 (or the semiconductor structure 100) are defined as cell regions C1, C2 and C3, as shown in FIG. 2A, in accordance with some embodiments. The edges (or boundaries) of the cell regions C1, C2 and C3 are dictated as dashed lines, in accordance with some embodiments. FIG. 2A only shows portions of the cell regions C1 and C3. Functional circuits are to be formed in the cell regions C1, C2 and C3, in accordance with some embodiments.

The cell regions C1, C2 and C3 are sequentially arranged in a row (in the X direction) and spaced apart from one another, in accordance with some embodiments. In some embodiments, the cell regions C1, C2 and C3 have the same cell height (in the Y direction). The cell regions C1, C2 and C3 may have rectangular shapes in the plan view, and the edges of the cell regions C1, C2 and C3 extend in the X direction and the Y direction, in accordance with some embodiments.

In some embodiments, an edge of the cell region C1 extending in the Y direction is aligned with the dummy gate structure $108_1$. In some embodiments, the edges of the cell region C2 with respect to the X direction (extending in the Y direction) are aligned with the dummy gate structures $108_2$ and $108_7$. In some embodiments, an edge of the cell region C3 extending in the Y direction is aligned with the dummy gate structure $108_8$. In some embodiments, the cell regions C1, C2 and C3 may be a NAND cell, a NOR cell, an inverter cell, and/or another applicable cell region. In an embodiment, the cell region C2 is an INVD4 (inverter with a driving strength of 4) cell which includes four functional gates.

The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The formation of the fin structures 104A and 104B includes patterning the substrate 102 thereby forming trenches, in accordance with some embodiments. The portions of the substrate 102 that protrude from between the trenches serve as the fin structures 104A and 104B, in accordance with some embodiments. The patterning process may include photolithography and etching processes.

The isolation structure 106 is formed over the substrate 102 to partially fill the trenches, as shown in FIGS. 2A-2 and 2A-3, in accordance with some embodiments. The isolation structure 106 may be also referred to as shallow trench isolation (STI) feature. The bottom surface of the isolation structure 106 is illustrated as a dash line in FIG. 2A-1. In some embodiments, the isolation structure 106 is made of dielectric material such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof.

In some embodiments, the formation of the isolation structure 106 includes depositing a dielectric material for the isolation structure 106 to overfill the trenches. In some embodiments, the dielectric material is deposited using chemical vapor deposition (CVD) (such as such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, and/or a combination thereof.

The dielectric material formed over the tops of the fin structures 104A and 104B is planarized, for example, using CMP, etching back process, or a combination thereof, in accordance with some embodiments. The dielectric material is further recessed using an etching process to expose the sidewalls of the fin structures 104A and 104B, in accordance with some embodiments. A remainder of the dielectric material serves as the isolation structure 106, in accordance with some embodiments.

The dummy gate structures $108_{1-8}$ are configured as sacrificial structures and will be replaced with final gate stacks, in accordance with some embodiments. In some embodiments, the distances S1 between the neighboring dummy gate structures $108_{1-8}$ are substantially the same. In some embodiments, the distances S1 are in a range from about 15 nm to about 50 nm.

Each of the dummy gate structures $108_{1-8}$ includes a dummy gate dielectric layer 110 and a dummy gate electrode layer 112 formed over the dummy gate dielectric layer 110, as shown in FIGS. 2A, 2A-1 and 2A-3, in accordance with some embodiments. In some embodiments, the dummy gate dielectric layer 110 is made of one or more dielectric materials, such as silicon oxide (SiO), silicon nitride (SiN), silicon oxynitride (SiON), $HfO_2$, HfZrO, HfSiO, HfSiO, HfAlO, and/or a combination thereof. In some embodiments, the dielectric material is formed using ALD, CVD, thermal oxidation, physical vapor deposition (PVD), another suitable technique, and/or a combination thereof.

In some embodiments, the dummy gate electrode layer 112 is made of semiconductor material such as polysilicon, poly-silicon germanium. In some embodiments, the dummy gate electrode layer 112 is made of a conductive material such as metallic nitrides, metallic silicides, metals, and/or a combination thereof. In some embodiments, the material for the dummy gate electrode layer 112 is formed using CVD, another suitable technique, and/or a combination thereof.

In some embodiments, the formation of the dummy gate structures $108_{1-8}$ includes globally and conformally depositing a dielectric material for the dummy gate dielectric layer 110 over the semiconductor structure, depositing a material for the dummy gate electrode layer 112 over the dielectric material, planarizing the material for the dummy gate electrode layer 112, and patterning the dielectric material and the material for the dummy gate electrode layer 112 into the dummy gate structures $108_{1-8}$.

The patterning process includes forming a patterned hard mask layer (not shown) over the material for the dummy gate electrode layer 112 to overlap the channel regions of the fin structures 104A and 104B, in accordance with some embodiments. The material for the dummy gate electrode layer 112 and the dielectric material, uncovered by the patterned hard mask layer, is etched away until the source/drain regions of the fin structures 104A and 104B are exposed, in accordance with some embodiments.

Gate spacer layers 114 are formed along the sidewalls of the dummy gate structures $108_{1-8}$, as shown in FIGS. 2A and 2A-1, in accordance with some embodiments. The gate spacer layers 114 are used to offset the subsequently formed source/drain features and separate the source/drain features from the gate structure, in accordance with some embodiments. In some embodiments, the gate spacer layers 114 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the formation of the gate spacer layers 114 includes globally and conformally depositing a dielectric material for the gate spacer layers 114 over the semiconductor structure, followed by an anisotropic etching process. In some embodiments, the etching process is performed without an additional photolithography process. The portions of the dielectric material that remain on the sidewalls of the dummy gate structures $\mathbf{108}_{1\text{-}8}$ serve as the gate spacer layers 114, in accordance with some embodiments.

Source/drain features 116 are formed over the source/drain regions of the fin structures 104A and 104B, as shown in FIGS. 2A-1 and 2A-2, in accordance with some embodiments. The formation of the source/drain features 116 includes recessing the source/drain regions of the fin structures 104A and 104B using the dummy gate structures $\mathbf{108}_{1\text{-}8}$ and the gate spacer layers 114 as masks to form source/drain recesses on opposite sides of the dummy gate structures $\mathbf{108}_{1\text{-}8}$, in accordance with some embodiments. The source/drain recesses extend into the isolation structure 106, in accordance with some embodiments.

Afterward, the source/drain features 116 are grown on the exposed surfaces of the fin structures 104A and 104B in the source/drain recesses using an epitaxial growth process, in accordance with some embodiments. The epitaxial growth process may be molecular beam epitaxy (MBE), metal organic chemical vapor deposition (MOCVD), vapor phase epitaxy (VPE), or another suitable technique. In some embodiments, the source/drain features 116 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 116 are in-situ doped during the epitaxial growth process.

For example, the n-type source/drain features for n-type semiconductor devices are doped with the n-type dopant during the epitaxial growth process. For example, the n-type dopant may be phosphorous (P) or arsenic (As). For example, the n-type source/drain features may be the epitaxially grown Si doped with phosphorous to form silicon:phosphor (Si:P) source/drain features and/or arsenic to form silicon:arsenic (Si:As) source/drain feature. For example, the p-type source/drain features for p-type semiconductor devices are doped with the p-type dopant during the epitaxial growth process. For example, the p-type dopant may be boron (B) or $BF_2$. For example, the p-type source/drain features may be the epitaxially grown SiGe doped with boron (B) to form silicon germanium:boron (SiGe:B) source/drain feature.

A contact etching stop layer 118 is formed over the semiconductor structure 100 to cover the source/drain features 116, as shown in FIGS. 2A-1 and 2A-2, in accordance with some embodiments. In some embodiments, the contact etching stop layer 118 extends along and covers the top surface of the isolation structure 106 and the sidewalls of the gate spacer layers 114.

In some embodiments, the contact etching stop layer 118 is made of dielectric material, such as silicon nitride (SiN), silicon oxynitride (SiON), silicon oxide ($SiO_2$), silicon carbide (SiC), oxygen-doped silicon carbide (SiC:O), oxygen-doped silicon carbonitride (Si(O)CN), or a combination thereof. In some embodiments, a dielectric material for the contact etching stop layer 118 is globally and conformally deposited using CVD (such as LPCVD, PECVD, HDP-CVD, or HARP), ALD, another suitable method, or a combination thereof.

A first interlayer dielectric layer 120 is formed over the contact etching stop layer 118, as shown in FIGS. 2A-1 and 2A-2, in accordance with some embodiments. In some embodiments, the first interlayer dielectric layer 120 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the first interlayer dielectric layer 120 and the contact etching stop layer 118 are made of different materials and have a great difference in etching selectivity.

In some embodiments, the dielectric material for the first interlayer dielectric layer 120 is deposited using such as CVD (such as HDP-CVD, PECVD, HARP or FCVD), another suitable technique, and/or a combination thereof. The dielectric materials for the contact etching stop layer 118 and the first interlayer dielectric layer 120 above the top surfaces of the dummy gate structures $\mathbf{108}_{1\text{-}8}$ are removed using such as CMP, in accordance with some embodiments.

Figure 2B:
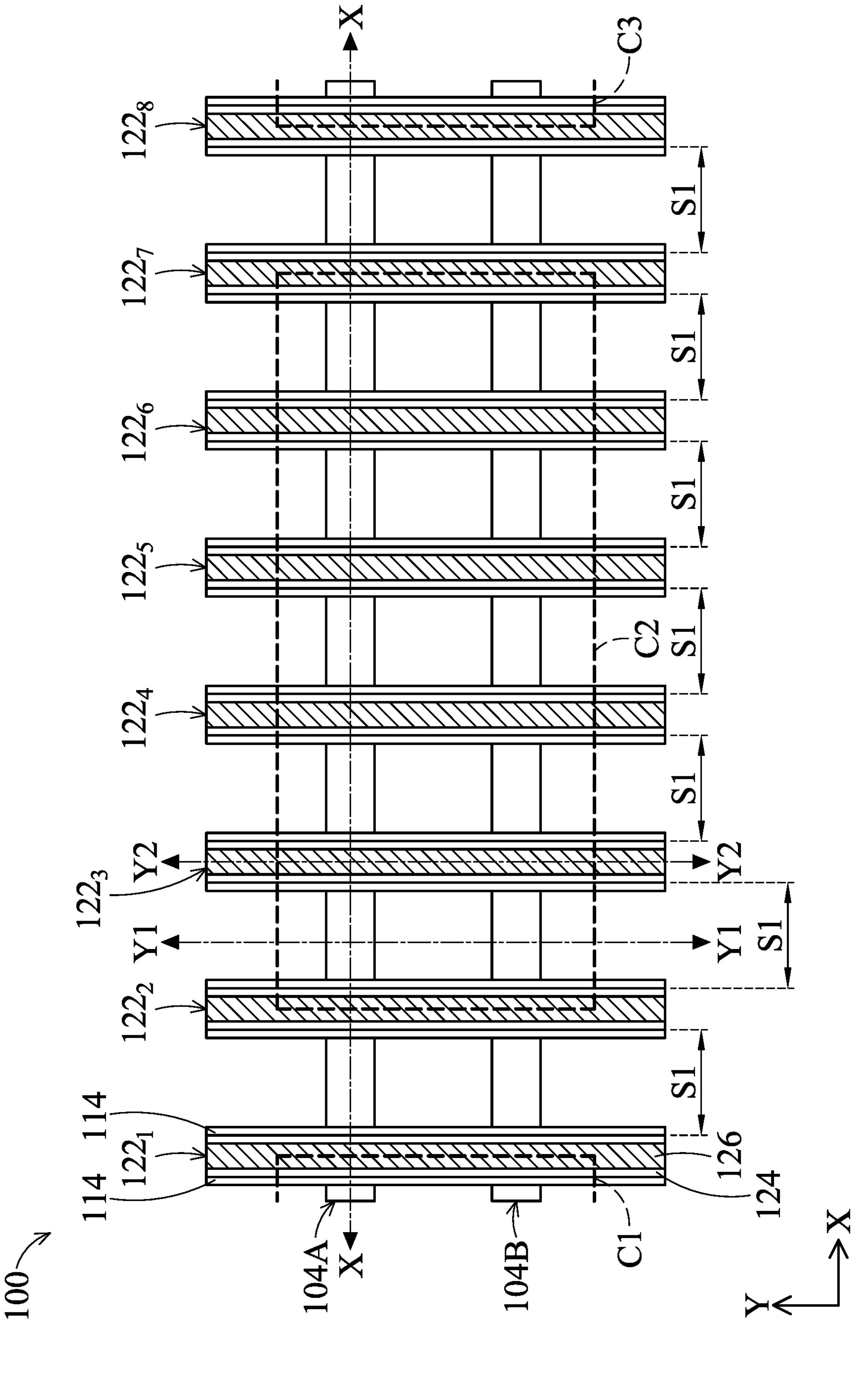
Figures 1, 2B:
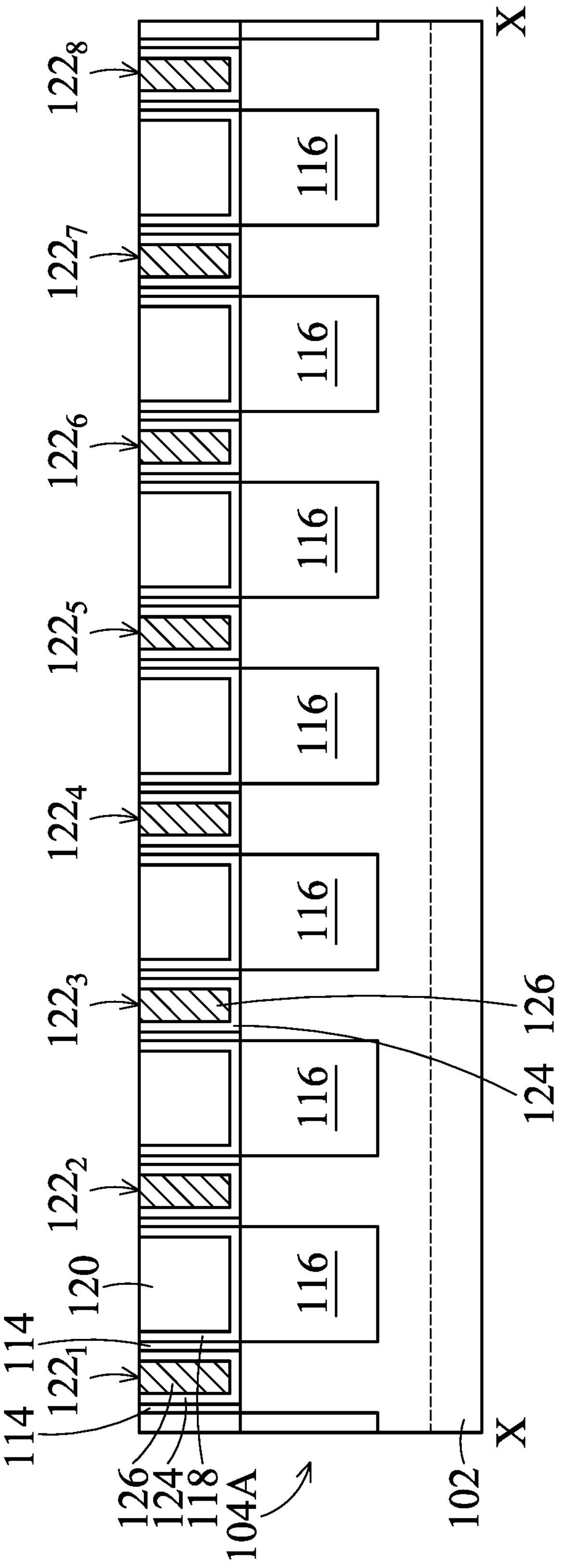
Figures 2, 2B:
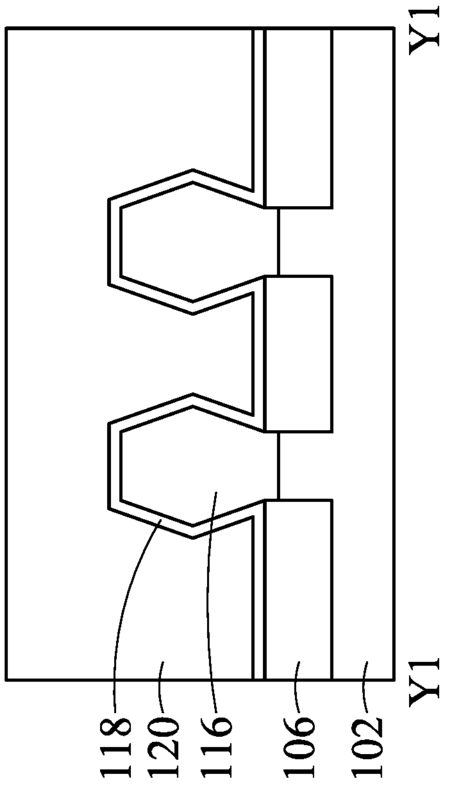
Figures 2, 2B, 3:
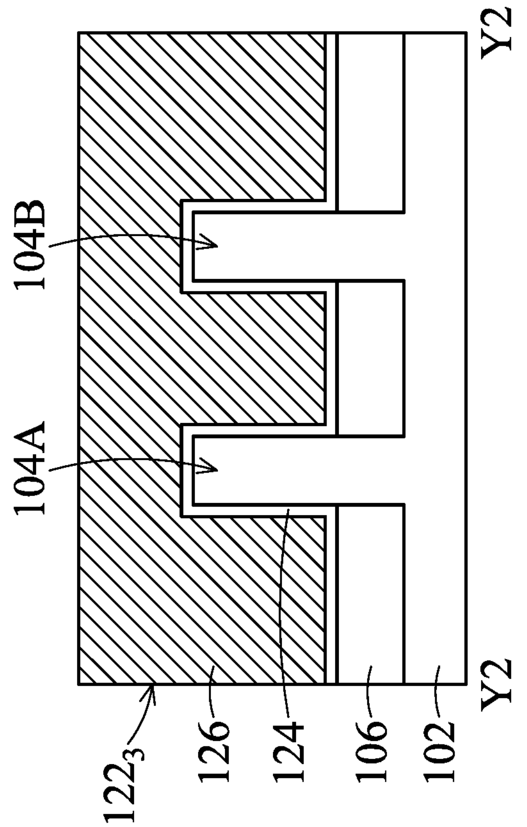

FIGS. 2B through 2B-3 illustrate a semiconductor structure 100 after the formation of final gate stacks 122, in accordance with some embodiments. FIGS. 2B 1, 2B-2 and 2B-3 are cross-sectional views of the semiconductor structure 100 taken along line X-X, line Y1-Y1 and line Y2-Y2 of FIG. 2B, respectively.

The dummy gate structures $\mathbf{108}_{1\text{-}8}$ are removed using one or more etching processes to form gate trenches (not shown), in accordance with some embodiments. The gate trenches expose the channel regions of the fin structures 104A and 104B, in accordance with some embodiments. The gate trenches also expose the inner sidewalls of the gate spacer layers 114 facing the channel regions, in accordance with some embodiments. In some embodiments, the etching process includes one or more etching processes. For example, when the dummy gate electrode layer 112 is made of polysilicon, a wet etchant such as a tetramethylammonium hydroxide (TMAH) solution may be used to selectively remove the dummy gate electrode layer 112. For example, the dummy gate dielectric layer 110 may be thereafter removed using a plasma dry etching, a dry chemical etching, and/or a wet etching.

Final gate stacks $\mathbf{122}_{1\text{-}8}$ are formed in the gate trenches, as shown in FIGS. 2B, 2B-1 and 2B-3, in accordance with some embodiments. The final gate stacks $\mathbf{122}_{1\text{-}8}$ extend across and surround the channel regions of the fin structures 104A and 104B, in accordance with some embodiments. In some embodiments, the final gate stacks $\mathbf{122}_{1\text{-}8}$ extend in the Y direction. The final gate stacks $\mathbf{122}_{1\text{-}8}$ have longitudinal axes parallel to the Y direction, in accordance with some embodiments. That is, the dimensions (lengths) of the final gate stacks $\mathbf{122}_{1\text{-}8}$ in the Y direction are greater than the dimensions (widths) of the final gate stacks $\mathbf{122}_{1\text{-}8}$ in the X direction.

In some embodiments, each of the final gate stacks $\mathbf{122}_{1\text{-}8}$ includes a gate dielectric layer 124 and a metal gate electrode layer 126 formed over the gate dielectric layer 124, as shown in FIGS. 2B, 2B-1 and 2B-3, in accordance with some embodiments. The gate dielectric layer 124 is formed to partially fill the gate trenches, in accordance with some embodiments. In some embodiments, the gate dielectric layer 124 may include an interfacial layer and a high-k dielectric layer formed over the interfacial layer. The interfacial layer may be made of a chemically formed silicon oxide by one or more cleaning processes such as including ozone (03), ammonia hydroxide-hydrogen peroxide-water mixture, and/or hydrochloric acid-hydrogen peroxide-water mixture.

In some embodiments, the high-k dielectric layer is made of dielectric material with high dielectric constant (k value), for example, greater than 3.9. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, (Ba, Sr)$TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

The metal gate electrode layer 126 is formed to fill remainders of the gate trenches, in accordance with some embodiments. In some embodiments, the metal gate electrode layer 126 is made of more than one conductive material, such as a metal, metal alloy, conductive metal oxide and/or metal nitride, another suitable conductive material, and/or a combination thereof. For example, the metal gate electrode layer 126 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layer 126 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 126 may be formed using ALD, PVD, CVD, e-beam evaporation, or another suitable technique. The metal gate electrode layer 126 may be formed separately for n-channel FinFETs and p-channel FinFETs, which may use different work function materials.

A planarization process such as CMP may be performed on the semiconductor structure 100 to remove the materials of the gate dielectric layer 124 and the metal gate electrode layer 126 formed above the top surface of the first interlayer dielectric layer 120, in accordance with some embodiments. After the planarization process, the top surfaces of the metal gate electrode layer 126, the gate spacer layers 114, the contact etching stop layer 118 and the first interlayer dielectric layer 120 are substantially coplanar, in accordance with some embodiments.

Portions of the final gate stacks 122 surrounding the fin structures 104 combine with the neighboring source/drain features 116 to form functional transistors (e.g., p-channel FinFETs or n-channel FinFETs), in accordance with some embodiments. The final gate stacks 122 engage the channel so that current can flow between the source/drain features 116 during operation. The functional transistors are located at the cross points between the fin structures 104 and the final gate stacks 122, in accordance with some embodiments. In some embodiments, the functional circuit in the cell region C2 includes eight functional transistors, which are located at the cross points between the fin structures 104A and 104B and the final gate stacks $\mathbf{122}_{3\text{-}6}$.

Figure 2C:
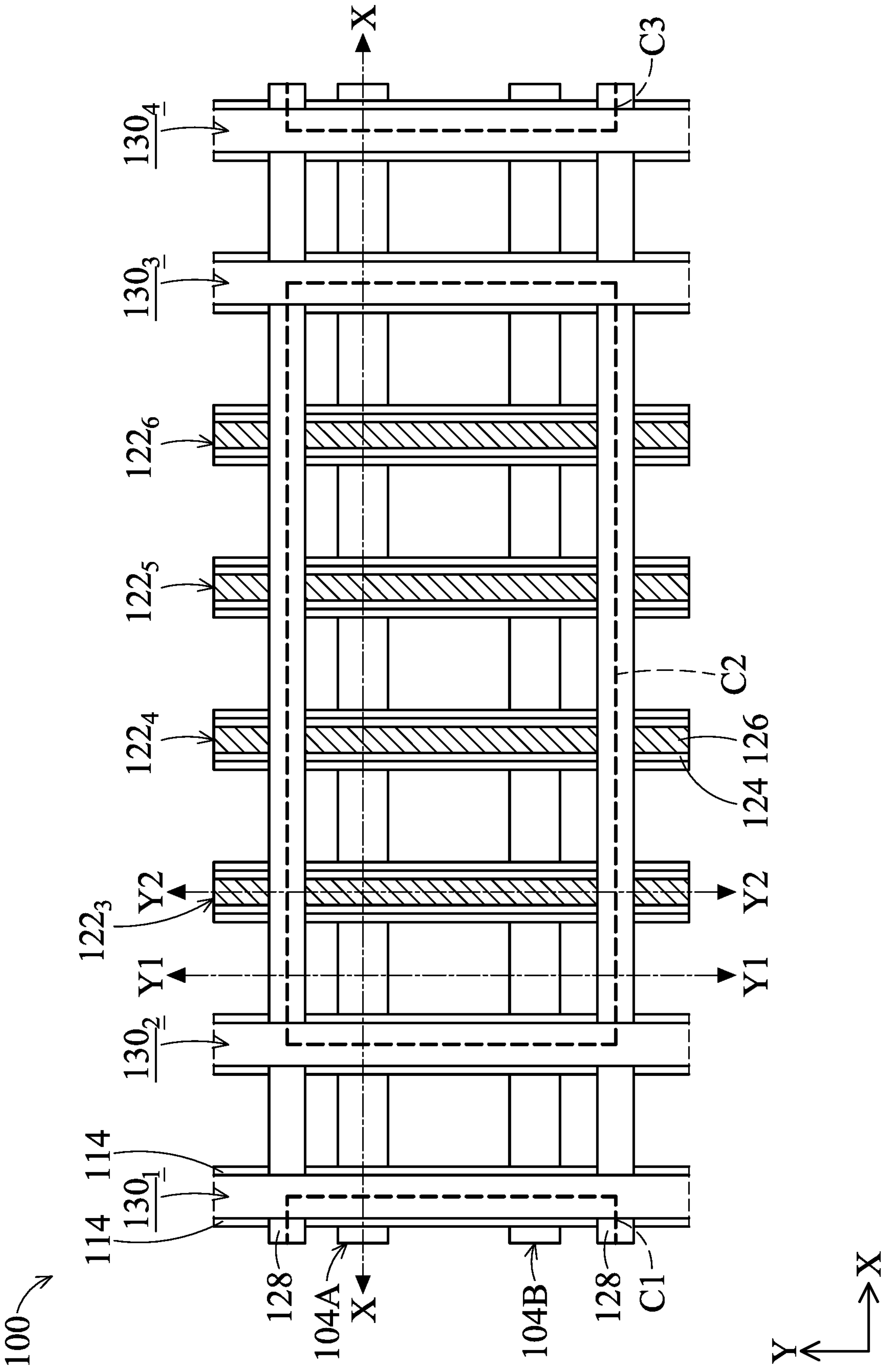
Figures 1, 2C:
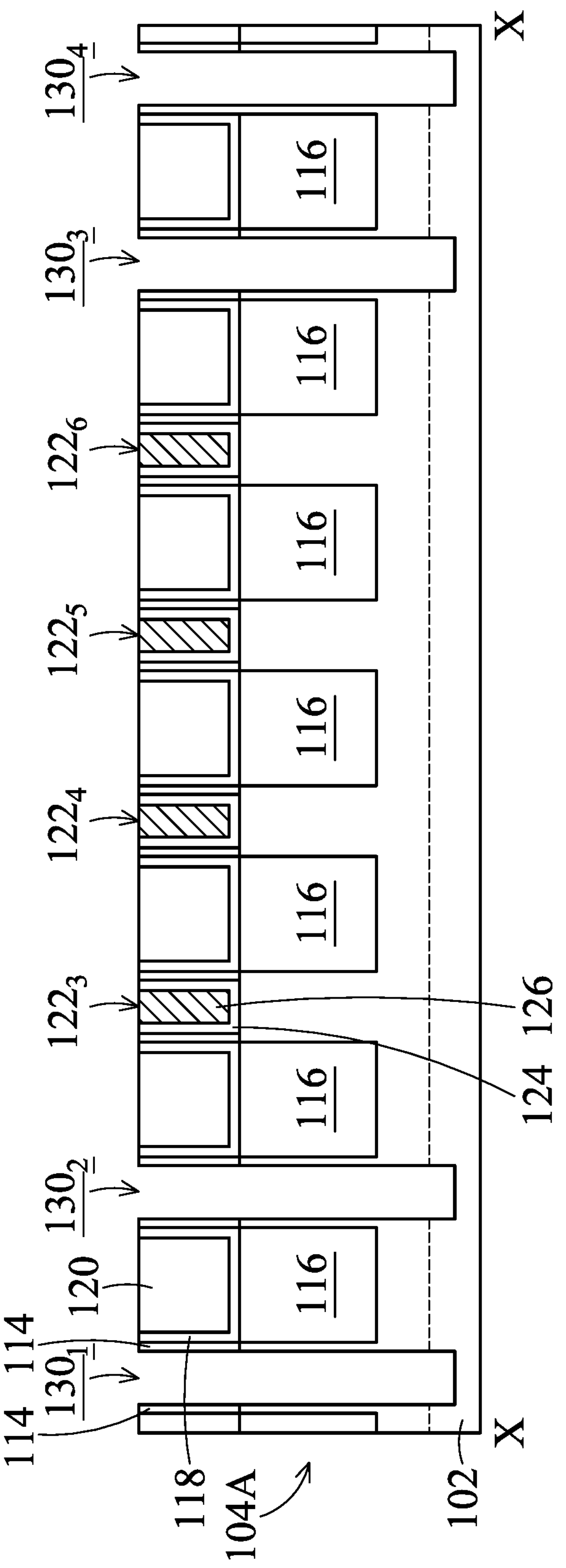
Figures 2, 2C, 3:
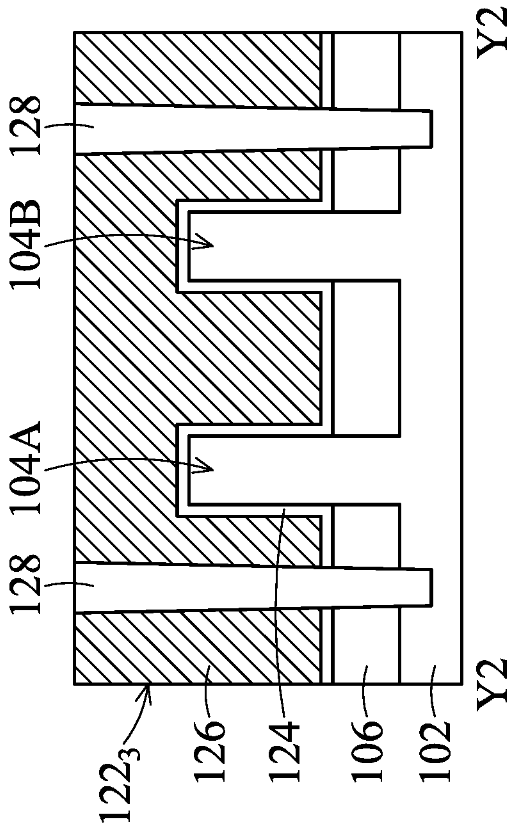
Figures 2, 2C:
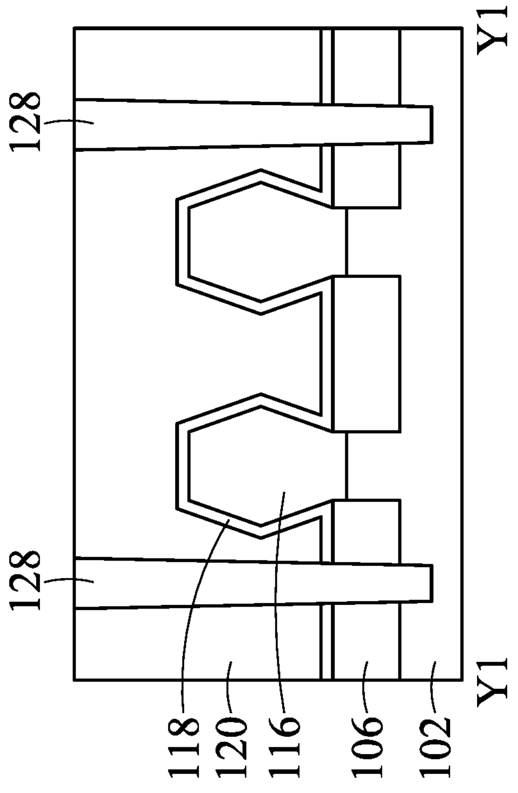

FIGS. 2C through 2C-3 illustrate a semiconductor structure 100 after the formation of gate cutting structures 128 and cutting trenches 130, in accordance with some embodiments. FIGS. 2C-1, 2C-2 and 2C-3 are cross-sectional views of the semiconductor structure 100 taken along line X-X, line Y1-Y1 and line Y2-Y2 of FIG. 2C, respectively.

Gate cutting structures 128 are formed in and/or through the final gate stacks $\mathbf{122}_{1\text{-}8}$, the gate spacer layers 114, the first interlayer dielectric layer 120 and the contact etching stop layer 118, as shown in FIGS. 2C, 2C-2 and 2C-3, in accordance with some embodiments. The gate cutting structures 128 extend into the substrate 102 and have bottom surfaces lower than the bottom surface of the isolation structure 106, in accordance with some embodiments. In some embodiments, the gate cutting structures 128 extend in the X direction. The gate cutting structures 128 have longitudinal axes parallel to the X direction, in accordance with some embodiments. That is, the dimensions (lengths) of the gate cutting structures 128 in the X direction are greater than the dimensions (widths) of the gate cutting structures 128 in the Y direction.

The gate cutting structures 128 are aligned with the edges (or the boundaries) of the cells C1, C2 and C3 with respect to the Y direction (extending in the X direction), in accordance with some embodiments. The gate cutting structures 128 may be also referred to as cut metal gate (CMG) pattern. The final gate stacks $\mathbf{122}_{1\text{-}8}$ are cut into several segments by the gate cutting structures 128, in accordance with some embodiments. The segments of the final gate stacks $\mathbf{122}_{1\text{-}8}$ are physically and electrically insulated from one another by the gate cutting structures 128, in accordance with some embodiments.

In some embodiments, the gate cutting structures 128 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. In some embodiments, the gate cutting structures 128 include dielectric material with k-value greater than 9, such as LaO, AlO, AlON, ZrO, HfO, ZnO, ZrN, ZrAlO, TiO, TaO, YO, and/or TaCN.

The formation of the gate cutting structures 128 includes patterning the final gate stacks $\mathbf{122}_{1\text{-}8}$, the gate spacer layers 114, the first interlayer dielectric layer 120, the contact etching stop layer 118, the isolation structure 106 and the substrate 102 to form cutting trenches (where the gate cutting structures 128 are to be formed) using photolithography and etching processes. The formation of the gate cutting structures 128 further includes depositing a dielectric material for the gate cutting structures 128 to overfill the cutting trenches, in accordance with some embodiments. In some embodiments, the deposition process is ALD, CVD (such as LPCVD, PECVD, HDP-CVD, or HARP), another suitable technique, or a combination thereof.

Afterward, a planarization process is then performed on the dielectric material for the gate cutting structures 128 until the first interlayer dielectric layer 120 is exposed, in accordance with some embodiments. The planarization may be CMP, etching back process, or a combination thereof.

Afterward, a cutting process is performed on the final gate stack $\mathbf{122}_1$, $\mathbf{122}_2$, $\mathbf{122}_7$ and $\mathbf{122}_8$ and the fin structures 104A and 104B, as shown in FIGS. 2C and 2C-1, in accordance with some embodiments. The cutting process includes patterning the semiconductor structure 100 to form cutting trenches 130 (including $\mathbf{130}_1$, $\mathbf{130}_2$, $\mathbf{130}_3$ and $\mathbf{130}_4$), in accordance with some embodiments. The cutting trenches 130 extend into the substrate 102 and have bottom surfaces lower than the bottom surface of the isolation structure 106, in accordance with some embodiments.

In some embodiments, the cutting trenches 130 extend in the Y direction. That is, the cutting trenches 130 has longitudinal axes parallel to the Y direction, in accordance with some embodiments. That is, the dimensions (lengths) of the cutting trenches 130 in the Y direction are greater than the dimensions (widths) of the cutting trenches 130 in the X direction.

In some embodiments, the cutting trench $130_1$ is aligned with an edge of the cell region C1 extending in the Y direction. In some embodiments, the cutting trenches $130_2$ and $130_3$ are aligned with the edges of the cell region C2 with respect to the X direction (extending in the Y direction). In some embodiments, the cutting trench $130_4$ is aligned with an edge of the cell region C3 extending in the Y direction. The fin structures 104A and 104B are cut into several segments by the cutting trenches $130_{1-4}$, in accordance with some embodiments. In some embodiments, the cutting trenches $130_{1-4}$ further cut through the gate cutting structures 128.

The cutting process includes forming a patterned mask layer over the semiconductor structure 100 using a photolithography process. The patterned mask layer has trench patterns corresponding to the cutting trenches 130, in accordance with some embodiments. An etching process is then performed using the patterned mask layer to remove portions of the gate cutting structures 128, the final gate stack $122_1$, $122_2$, $122_7$ and $122_8$, the fin structures 104A and 104B and the substrate 102 that are exposed from the trench patterns, in accordance with some embodiments. The etching processes may include dry etching such as reactive ion etch (RIE), neutral beam etch (NBE), inductive coupled plasma (ICP) etch, capacitively coupled plasma (CCP) etch, another suitable method, or a combination thereof. The patterned mask layer may be removed in the etching process, or by an additional process (such as an ashing process).

Figure 2D:
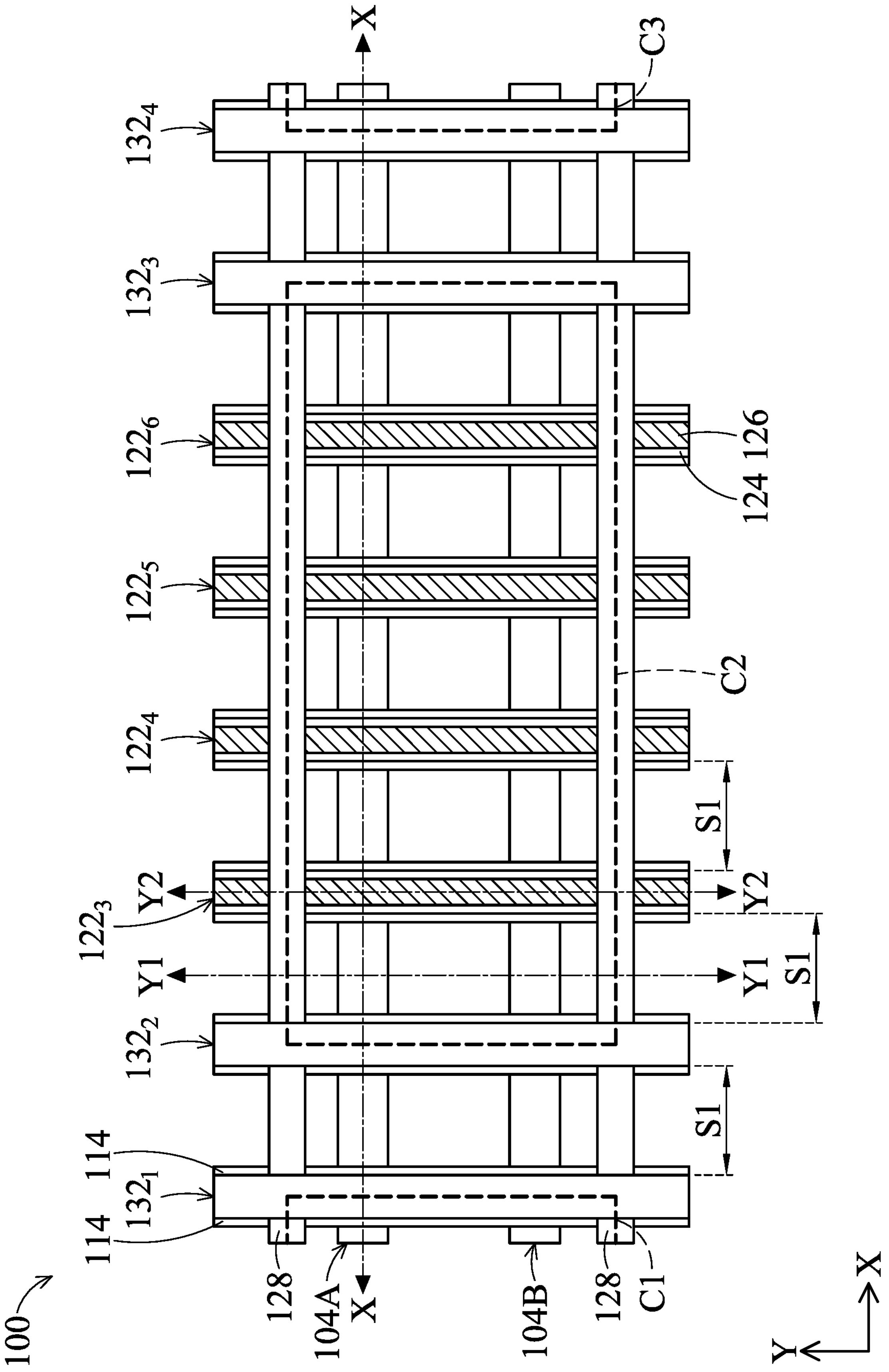
Figures 1, 2D:
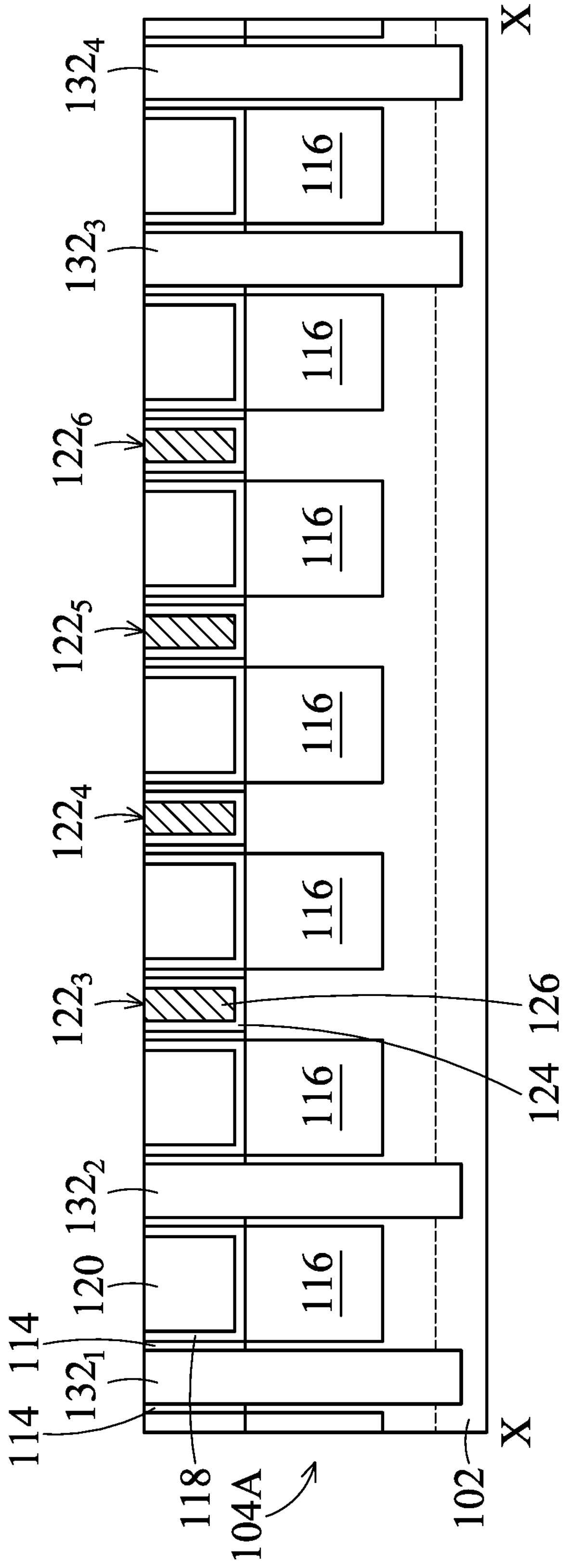
Figures 2, 2D, 3:
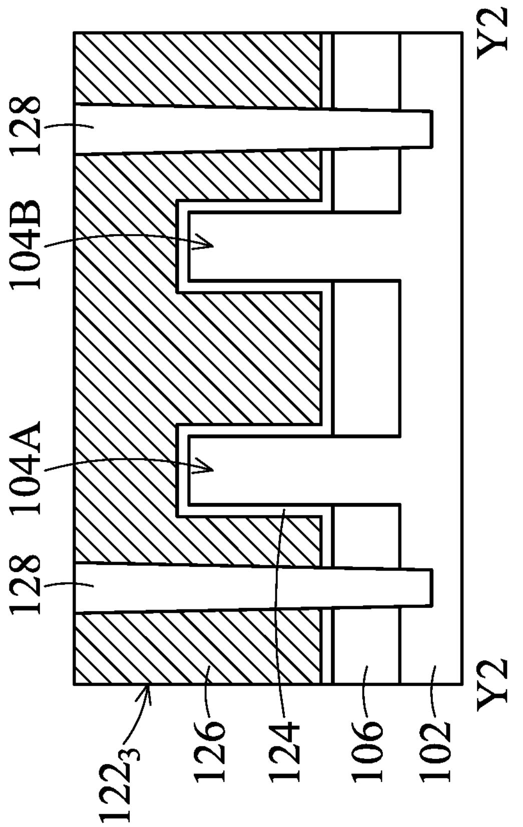
Figures 2, 2D:
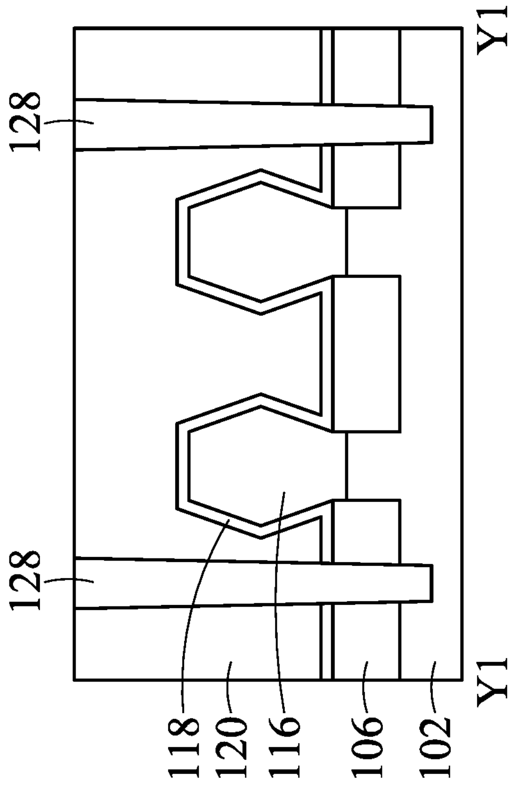

FIGS. 2D through 2D-3 illustrate a semiconductor structure 100 after the formation of fin cutting structures 132, in accordance with some embodiments. FIGS. 2D-1, 2D-2 and 2D-3 are cross-sectional views of the semiconductor structure 100 taken along line X-X, line Y1-Y1 and line Y2-Y2 of FIG. 2D, respectively.

Fin cutting structures 132 (including $132_{1-4}$) are formed in the cutting trenches $130_{1-4}$, as shown in FIGS. 2D and 2D-1, in accordance with some embodiments. In some embodiments, the fin cutting structure $132_1$ is aligned with an edge of the cell region C1 extending in the Y direction. In some embodiments, the fin cutting structures $132_2$ and $132_3$ are aligned with the edges of the cell region C2 with respect to the X direction (extending in the Y direction). In some embodiments, the fin cutting structure $132_4$ is aligned with an edge of the cell region C3 extending in the Y direction. In some embodiments, the fin cutting structures 132 are configured to prevent leakage between neighboring cell regions. The fin cutting structures 132 may be also referred to as cut metal on oxide definition edge (CMODE) pattern.

The fin cutting structures 132 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. In some embodiments, the fin cutting structures 132 include dielectric material with k-value greater than 9, such as LaO, AlO, AlON, ZrO, HfO, ZnO, ZrN, ZrAlO, TiO, TaO, YO, and/or TaCN.

The formation of the fin cutting structures 132 includes depositing a dielectric material for the fin cutting structures 132 to overfill the cutting trenches 130, in accordance with some embodiments. In some embodiments, the deposition process is ALD, CVD (such as LPCVD, PECVD, HDP-CVD, or HARP), another suitable technique, or a combination thereof. A planarization process is then performed on the semiconductor structure 100 to remove the dielectric material formed above the metal gate electrode layer 126, in accordance with some embodiments. The planarization may be CMP, etching back process, or a combination thereof.

After the planarization process, the top surfaces of the fin cutting structures 132, the gate cutting structures 128, the metal gate electrode layer 126, the gate spacer layers 114, the contact etching stop layer 118 and the first interlayer dielectric layer 120 are substantially coplanar, in accordance with some embodiments.

Figure 2E:
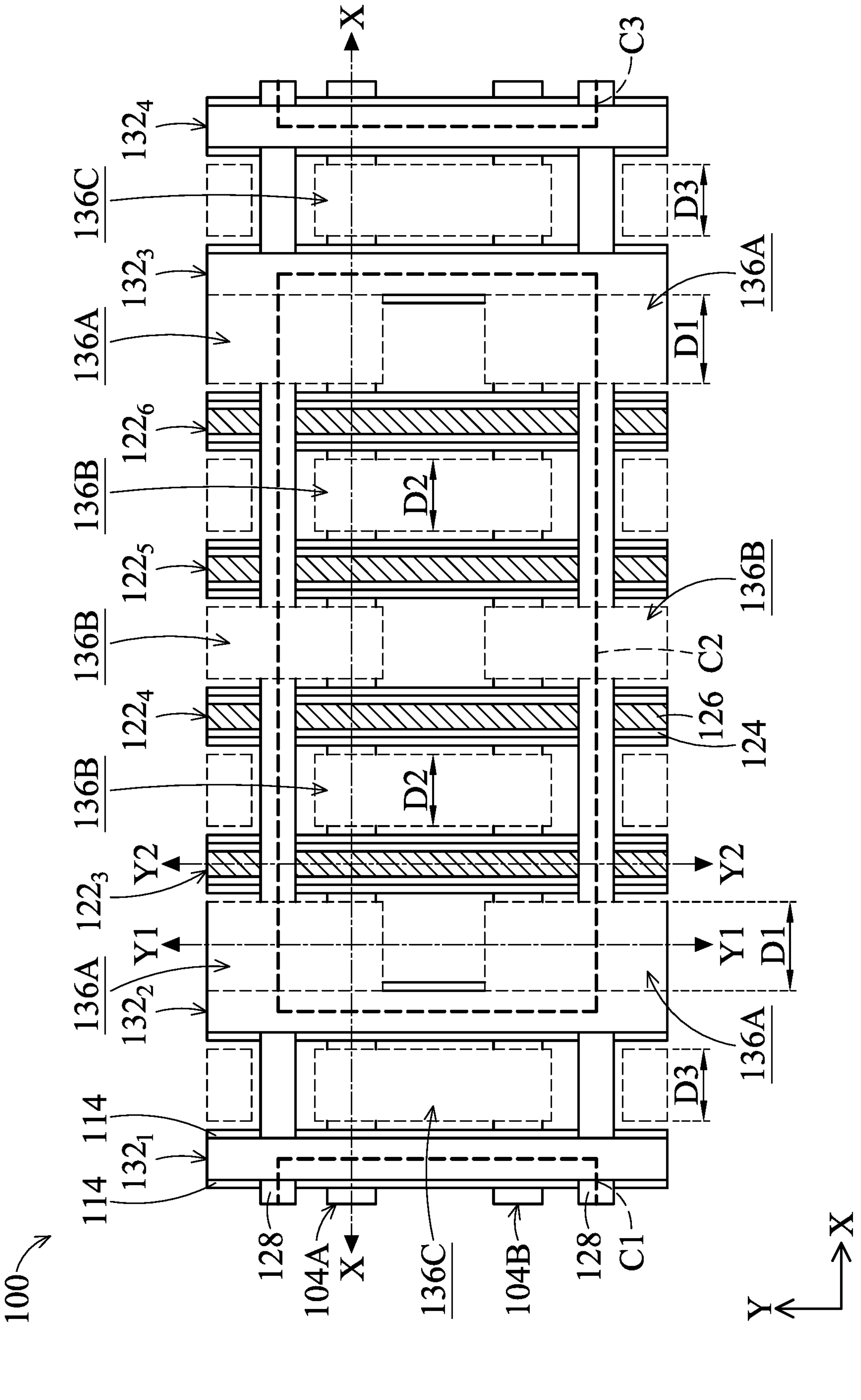
Figures 1, 2E:
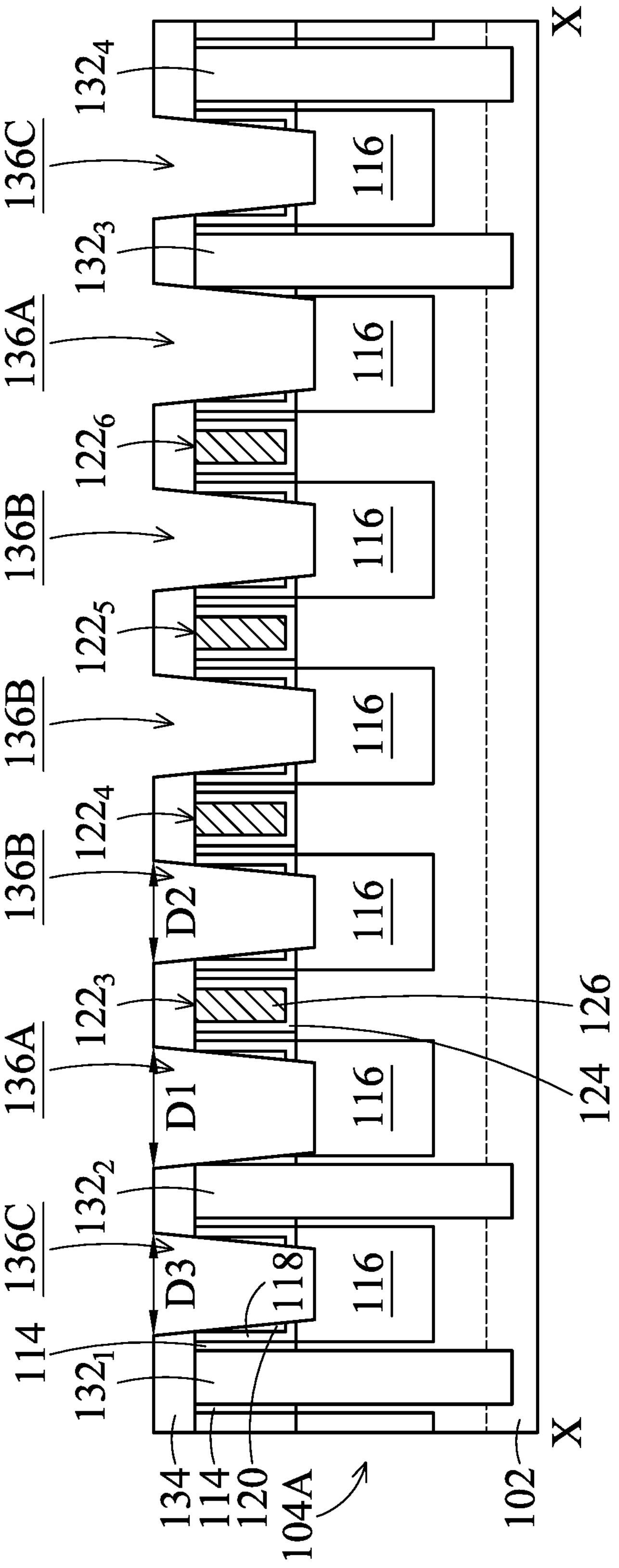
Figures 2, 2E:
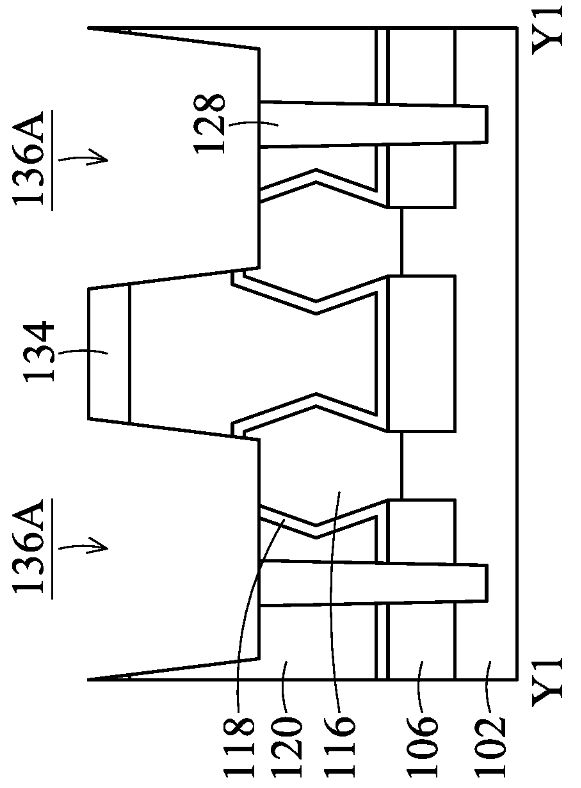
Figures 2, 2E, 3:
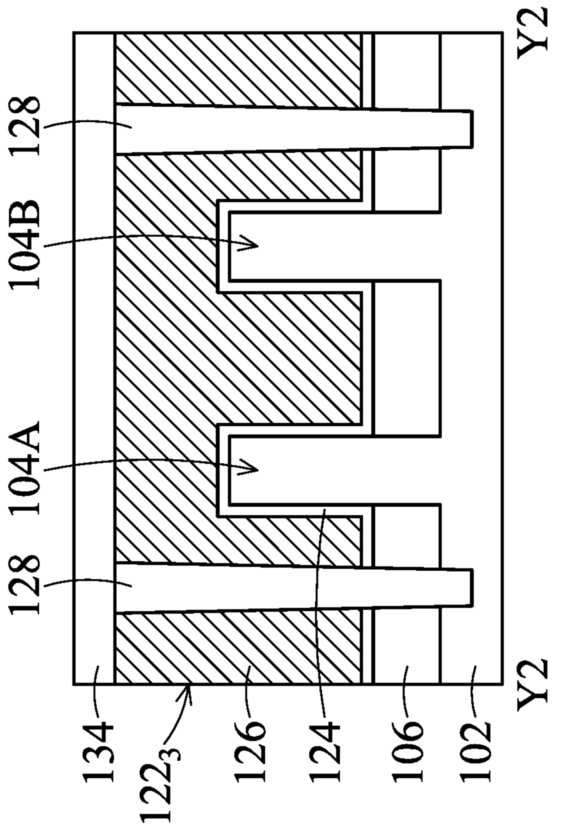

FIGS. 2E through 2E-3 illustrate a semiconductor structure 100 after the formation of a second interlayer dielectric 134 and contact openings 136, in accordance with some embodiments. FIGS. 2E-1, 2E-2 and 2E-3 are cross-sectional views of the semiconductor structure 100 taken along line X-X, line Y1-Y1 and line Y2-Y2 of FIG. 2E, respectively.

A second interlayer dielectric layer 134 is formed over the semiconductor structure 100, as shown in FIGS. 2E-1, 2E-2 and 2E-3, in accordance with some embodiments. In some embodiments, the second interlayer dielectric layer 134 is made of dielectric material, such as USG, BPSG, FSG, PSG, BSG, and/or another suitable dielectric material. In some embodiments, the second interlayer dielectric layer 134 is deposited using such as CVD (such as HDP-CVD, PECVD, HARP or FCVD), another suitable technique, or a combination thereof.

A patterning process is performed on the semiconductor structure 100 to from contact openings 136 (including 136A, 136B and 136C), as shown in FIGS. 2E, 2E-1 and 2E-2, in accordance with some embodiments. The contact openings 136 penetrate through the second interlayer dielectric layer 134, the first interlayer dielectric layer 120 and the contact etching stop layer 118 and expose the source/drain features 116, in accordance with some embodiments.

In some embodiments, the contact openings 136A are located within the cell regions C1, C2 and C3 immediately adjacent to the edges of the cell regions C1, C2 and C3 extending in the Y direction. Specifically, the contact openings 136A are located between the fin cutting structure $132_2$ and the final gate stack $122_3$ and between the fin cutting structure $132_3$ and the final gate stack $122_6$, in accordance with some embodiments. In some embodiments, the contact openings 136A may have portions outside the cell regions C1, C2 and C3. In alternative embodiments, the contact openings 136A may be entirely located within the cell regions C1, C2 and C3. In some embodiments, the contact openings 136A partially penetrate through and expose the gate spacer layers 114 on the sidewalls of the fin cutting structures $132_2$ and $132_3$, as shown in FIG. 2E-1. In some embodiments, the contact openings 136A do not penetrate through the gate spacer layers 114 on the sidewalls of the final gate stacks $122_3$ and $122_6$.

In some embodiments, the contact openings 136B are located within the cell regions C1, C2 and C3 away from the edges of the cell regions C1, C2 and C3 extending in the Y direction. Specifically, the contact openings 136B are located between the final gate stack $122_3$ and $122_4$, between the final gate stack $122_4$ and $122_5$ and between the final gate stack $122_5$ and $122_6$, in accordance with some embodiments. In some embodiments, some of the contact openings 136B have portions outside the cell regions C1, C2 and C3. In some embodiments, some other contact openings 136B are entirely located within the cell regions C1, C2 and C3. In some embodiments, the contact openings 136B do not penetrate through the gate spacer layers 114, as shown in FIGS. 2E and 2E-1.

In some embodiments, the contact openings 136C are located outside the cell regions C1, C2 and C3. Specifically, the contact openings 136C are located between the fin cutting structure $\mathbf{132}_1$ and $\mathbf{132}_2$ and between the fin cutting structure $\mathbf{132}_3$ and $\mathbf{132}_4$, in accordance with some embodiments. In some embodiments, the contact openings 136C do not penetrate through the gate spacer layers 114, as shown in FIGS. 2E and 2E-1.

In some embodiments, the contact openings 136A have dimensions D1 (e.g., widths) in the X direction. In some embodiments, the dimensions D1 of the contact openings 136A are in a range from about 5.5 nm to about 20.5 nm. In some embodiments, the contact openings 136B have dimensions D2 (e.g., widths) in the X direction. In some embodiments, the dimensions D2 of the contact openings 136B are in a range from about 5 nm to about 20 nm. In some embodiments, the contact openings 136C have dimensions D3 (e.g., widths) in the X direction. In some embodiments, the dimensions D3 of the contact openings 136C are in a range from about 5 nm to about 20 nm.

In some embodiments, the contact openings 136A are wider than the contact openings 136B (i.e., D1>D2). In some embodiments, the contact openings 136A are wider than the contact openings 136C (i.e., D1>D3). In some embodiments, the dimensions D2 are substantially the same as the dimensions D3. In some embodiments, the dimensions D1 are greater than the dimensions D2 by about 0.5 nm to about 15 nm. In some embodiments, the ratio (D1/D2) of the dimensions D1 to the dimensions D2 is greater than 1, e.g., in a range from about 1.05 to about 4. In some embodiments, the dimensions D1 are greater than the dimensions D3 by about 0.5 nm to about 15 nm. In some embodiments, the ratio (D1/D3) of the dimensions D1 to the dimensions D3 is greater than 1, e.g., in a range from about 1.05 to about 4.

In some embodiments, the contact openings 136A are closer to the fin cutting features 132 (e.g., $\mathbf{132}_2$ or $\mathbf{132}_3$) than to the final gate stacks 122 (e.g., $\mathbf{122}_3$ or $\mathbf{122}_6$). That is, the distance between the contact opening 136A and the adjacent fin cutting features 132 is shorter than the distance between the contact opening 136A and the adjacent final gate stacks 122. In some embodiments, the distance between the contact opening 136A and the adjacent final gate stacks 122 is substantially the same as the distance between the contact opening 136B and the adjacent final gate stacks 122.

The patterning process for forming the contact opening 136A, 136B and 136C includes forming a patterned mask layer (not shown) over the semiconductor structure 100 using a photolithography process. The patterned mask layer has opening patterns corresponding to the contact openings 136A, 136B and 136C, in accordance with some embodiments. An etching process is then performed using the patterned mask layer to remove portions of the second interlayer dielectric layer 134, the gate cutting structures 128, the first interlayer dielectric layer 120 and the contact etching stop layer 118 that are exposed from the opening patterns, in accordance with some embodiments. The etching processes may include dry etching such as RIE, NBE, ICP etch, CCP etch, another suitable method, or a combination thereof. The patterned mask layer may be removed in the etching process, or by an additional process (such as an ashing process).

Figure 2F:
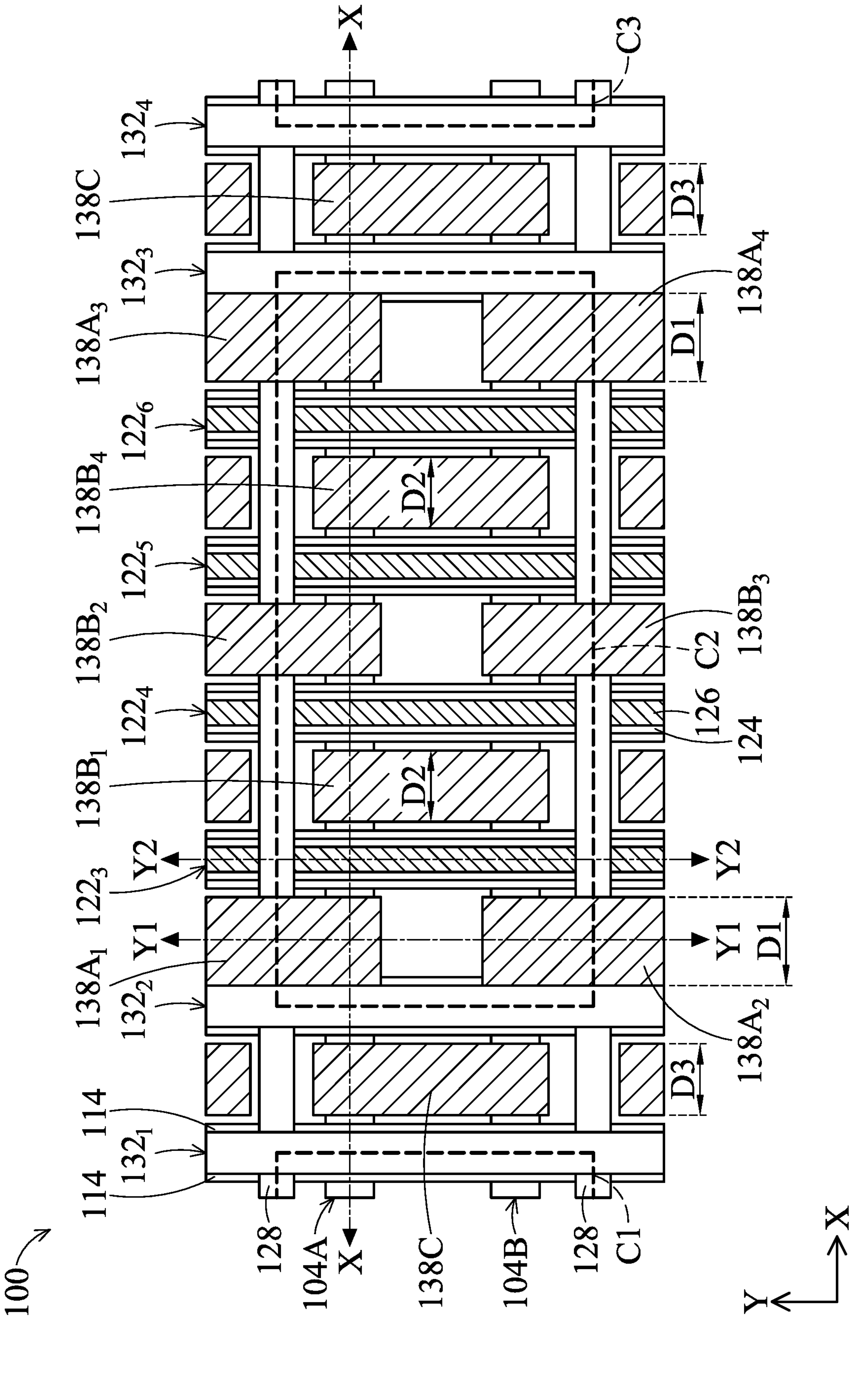
Figures 1, 2F:
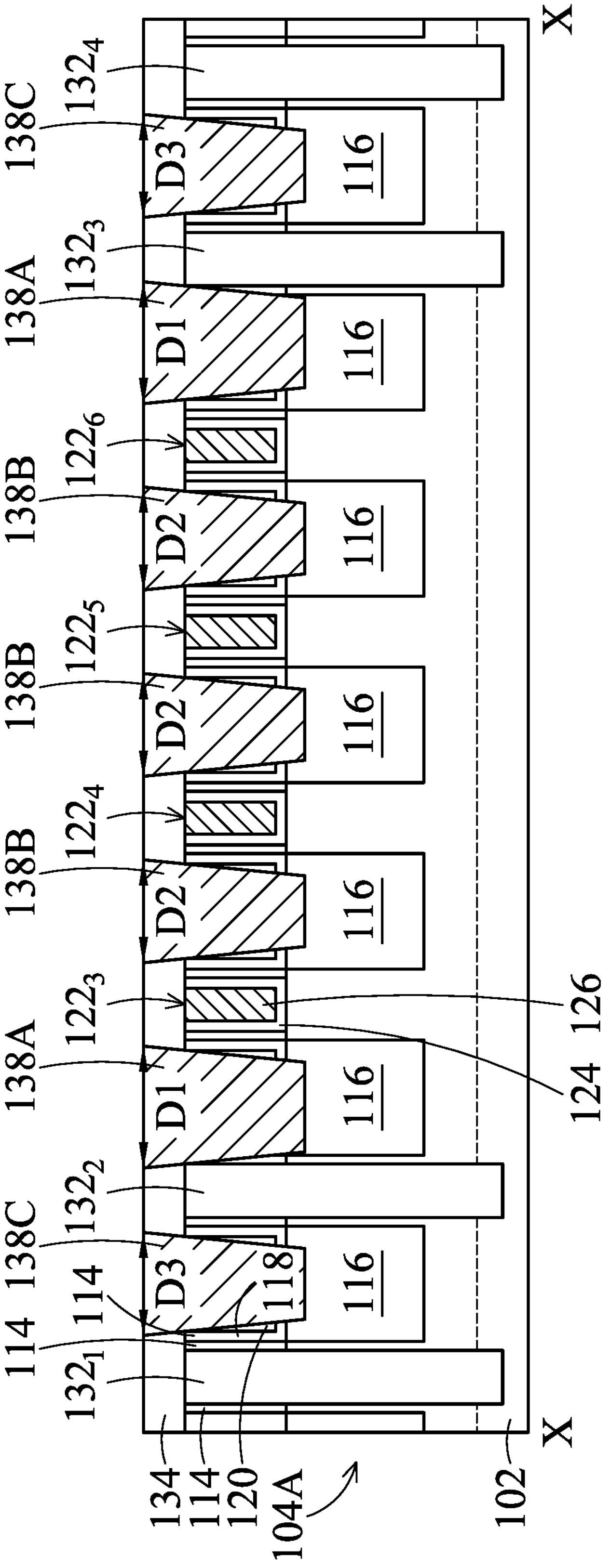
Figures 2, 2F, 3:
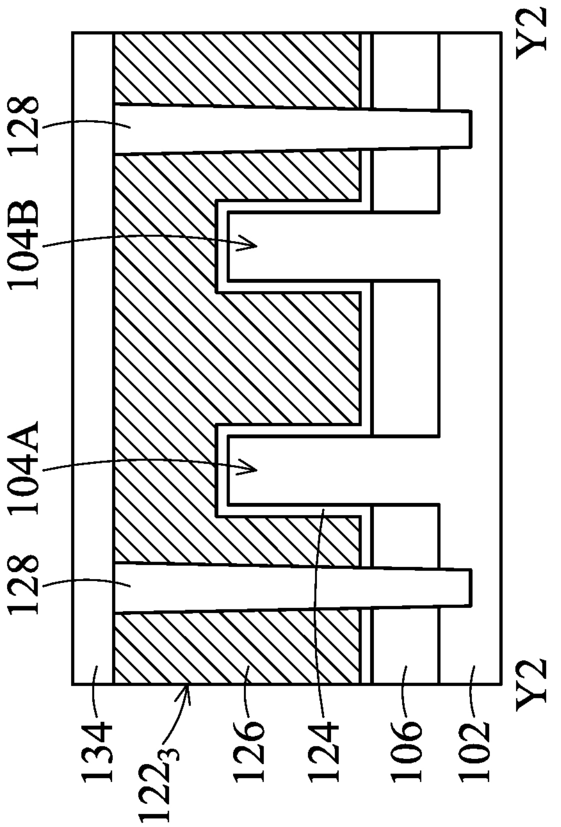
Figures 2, 2F:
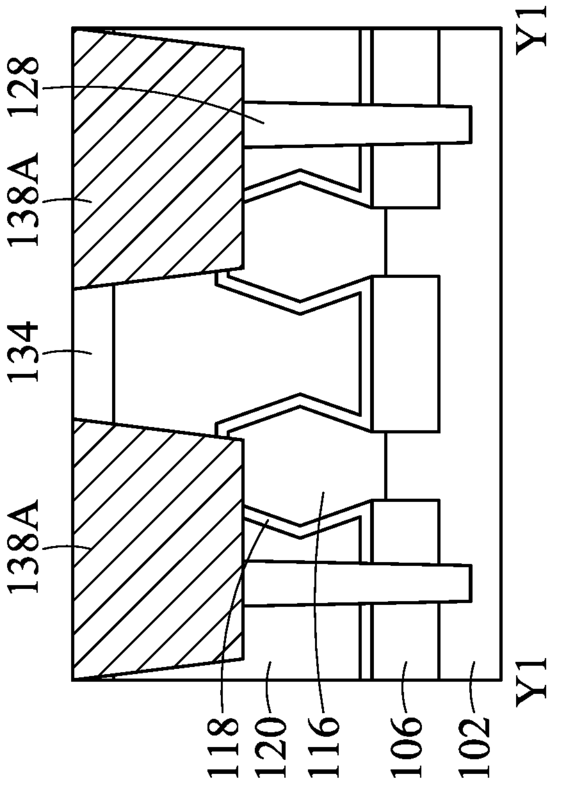

FIGS. 2F through 2F-3 illustrate a semiconductor structure 100 after the formation of contact plugs 138, in accordance with some embodiments. FIGS. 2F-1, 2F-2 and 2F-3 are cross-sectional views of the semiconductor structure 100 taken along line X-X, line Y1-Y1 and line Y2-Y2 of FIG. 2F, respectively.

Contact plugs 138 (including 138A, 138B and 138C) are formed in the contact opening 136A, the contact opening 136B and the contact opening 136C, as shown in FIGS. 2F, 2F-1 and 2F-2, in accordance with some embodiments. The contact plugs 138A, 138B and 138C land on and are electrically connected to the source/drain features 116, in accordance with some embodiments. In some embodiments, the contact plugs $\mathbf{138}\text{A}_{1\text{-}4}$ and $\mathbf{138}\text{B}_2$ and $\mathbf{138}\text{B}_3$ extends beyond the edges of the cell region C2 extending in the X direction and are source contact plug that are electrically connected to the source terminals of the FinFETs. In some embodiments, the contact plugs $\mathbf{138}\text{B}_1$ and $\mathbf{138}_4$ are drain contact plugs that are electrically connected to the drain terminals of the FinFETs. In some embodiments, the contact plugs 138C are dummy contact plugs.

In some embodiments, the contact plugs 138A are located within the cell regions C1, C2 and C3 immediately adjacent to the edges of the cell regions C1, C2 and C3 extending in the Y direction. Specifically, the contact plugs $\mathbf{138}\text{A}_1$ and $\mathbf{138}\text{A}_2$ are located between the fin cutting structure $\mathbf{132}_2$ and the final gate stack $\mathbf{122}_3$, and the contact plugs $\mathbf{138}\text{A}_3$ and $\mathbf{138}\text{A}_4$ are located between the fin cutting structure $\mathbf{132}_3$ and the final gate stack $\mathbf{122}_6$, in accordance with some embodiments. In some embodiments, the contact plugs $\mathbf{138}\text{A}_{1\text{-}4}$ have portions outside the cell region C2. In alternative embodiments, the contact plug 138A may be entirely located within the cell region C2. In some embodiments, the contact plugs 138A are in direct contact with the gate spacer layers 114 on the sidewalls of the fin cutting structures $\mathbf{132}_2$ and $\mathbf{132}_3$, as shown in FIG. 2F-1. In some embodiments, the contact plugs 138A are separated from the gate spacer layers 114 on the sidewalls of the final gate stacks $\mathbf{122}_3$ and $\mathbf{122}_6$.

In some embodiments, the contact plugs 138B are located within the cell regions C1, C2 and C3 away from the edges of the cell regions C1, C2 and C3 extending in the Y direction. Specifically, the contact plug $\mathbf{138}\text{B}_1$ is located between the final gate stack $\mathbf{122}_3$ and $\mathbf{122}_4$, the contact plugs $\mathbf{138}\text{B}_2$ and $\mathbf{138}\text{B}_3$ are located between the final gate stack $\mathbf{122}_4$ and $\mathbf{122}_5$, and the contact plug $\mathbf{138}\text{B}_4$ is located between the final gate stack $\mathbf{122}_5$ and $\mathbf{122}_6$, in accordance with some embodiments. In some embodiments, the contact plugs $\mathbf{138}\text{B}_2$ and $\mathbf{138}\text{B}_3$ have portions outside the cell region C2. In some embodiments, the contact plugs $\mathbf{138}\text{B}_1$ and $\mathbf{138}_4$ are entirely located within the cell region C2. In some embodiments, the contact plugs 138B are separated from the gate spacer layers 114, as shown in FIGS. 2F and 2F-1.

In some embodiments, the contact plugs 138C are located outside the cell regions C1, C2 and C3. Specifically, the contact plugs 138C are located between the fin cutting structure $\mathbf{132}_1$ and $\mathbf{132}_2$ and between the fin cutting structure $\mathbf{132}_3$ and $\mathbf{132}_4$, in accordance with some embodiments. In some embodiments, the contact plugs 138C are separated from the gate spacer layers 114, as shown in FIGS. 2F and 2F-1.

In some embodiments, the contact plugs 138A have the dimensions D1 (e.g., widths) in the X direction. In some embodiments, the dimensions D1 are in a range from about 5.5 nm to about 20.5 nm. In some embodiments, the contact plugs 138B have the dimensions D2 (e.g., widths) in the X direction. In some embodiments, the dimensions D2 are in a range from about 5 nm to about 20 nm. In some embodiments, the contact plugs 138C have the dimensions D3 (e.g., widths) in the X direction. In some embodiments, the dimensions D3 are in a range from about 5 nm to about 20 nm.

In some embodiments, the contact plugs 138A are wider than the contact plugs 138B (i.e., D1>D2). In some embodiments, the contact plugs 138A are wider than the contact plugs 138C (i.e., D1>D3). In some embodiments, the dimensions D2 are substantially the same as the dimensions D3. In some embodiments, the dimensions D1 are greater than the dimensions D2 by about 0.5 nm to about 15 nm. In some embodiments, the ratio (D1/D2) of the dimensions D1 to the dimensions D2 is greater than 1, e.g., in a range from about 1.05 to about 4. In some embodiments, the dimensions D1 are greater than the dimensions D3 by about 0.5 nm to about 15 nm. In some embodiments, the ratio (D1/D3) of the dimensions D1 to the dimensions D3 is greater than 1, e.g., in a range from about 1.05 to about 4.

In some embodiments, the contact plugs 138A are closer to the fin cutting features 132 (e.g., $132_2$ or $132_3$) than to the final gate stacks 122 (e.g., $122_3$ or $122_6$). That is, the distance between the contact plugs 138A and the adjacent fin cutting features 132 is shorter than the distance between the contact plugs 138A and the adjacent final gate stacks 122. In some embodiments, the distance between the contact plugs 138A and the adjacent final gate stacks 122 is substantially the same as the distance between the contact plugs 138B and the adjacent final gate stacks 122.

In accordance with embodiments of the present disclosure, the widths of the contact plugs 138A are enlarged toward the fin cutting structure 132 by reducing the distance between the contact plugs 138A and the fin cutting structure $132_2$ or $132_3$ while keeping the distance between the contact plugs 138A and the adjacent final gate stacks 122 constant, which may not increase the parasitic capacitance (e.g., out-fringing capacitance (Cof), contact-to-gate capacitance (Cco), etc.) of the functional circuit in the cell region C2, in accordance with some embodiments.

The contact plugs 138A with greater widths may reduce the overall resistance (e.g., the resistance of the contact plug itself ($R_{plug}$), and/or the interface resistances ($R_{int}$) between the contact plugs and underlying source/drain features and between the contact plugs and overlying vias) of the functional circuit in the cell region C2. In some embodiments where the functional circuit (e.g., in the cell region C2) includes four functional gates, at least a quarter of the contact plugs have a reduced resistance. Therefore, the performance of the resulting semiconductor devices may be enhanced (e.g., speed).

If the ratio (D1/D2 or the width D1) is too small, the resistance of the contact plugs 138A may be not sufficiently reduced, in accordance with some embodiments. If the ratio (D1/D2 or the width D1) is too large, the difficulty of the etching process for forming the contact openings 136A may be increased.

In some embodiments, the formation of the contact plugs 138A, 138B and 138C includes forming a silicide layer (such as WSi, NiSi, TiSi and/or CoSi) on the exposed source/drain features 116, depositing one or more conductive materials over the silicide layer to fill the contact openings 136A, 136B and 136C, and planarizing the one or more conductive materials until the top surfaces of the second interlayer dielectric layer 134 is exposed using, for example, CMP. In some embodiments, the conductive material is deposited using CVD, PVD, e-beam evaporation, ALD, electroplating (ECP), electroless deposition (ELD), another suitable method, or a combination thereof. After the planarization process, the top surfaces of the contact plugs 138, the top surface of the second interlayer dielectric layer 134 are substantially coplanar, in accordance with some embodiments.

The conductive material may be a multilayer structure including, for example, liner layers, glue layers, barrier layers, seed layers, metal bulk layers, another suitable layer, and/or a combination thereof. For example, a barrier layer (not shown) may be formed along the sidewall and the bottom surface of the contact openings. The barrier layer is used to prevent the metal from the subsequently formed metal material from diffusing into the dielectric material (e.g., the second interlayer dielectric layer 134 and the first interlayer dielectric layer 120). The barrier layer may be made of tantalum (Ta), tantalum nitride (TaN), titanium (Ti), titanium nitride (TiN), cobalt tungsten (CoW), another suitable material, and/or a combination thereof. In alternative embodiments where the subsequently formed metal bulk material does not easily diffuse into the dielectric material, the barrier layer may be omitted.

Furthermore, a glue layer (not shown) may be formed along the sidewall and the bottom surface of the contact openings, and on the barrier layer (if formed). The glue layer is used to improve adhesion between the subsequently formed metal material and the dielectric material (e.g., the second interlayer dielectric layer 134 and the first interlayer dielectric layer 120). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layers are made of one or more conductive materials with low resistance and good gap-fill ability, for example, cobalt (Co), nickel (Ni), tungsten (W), titanium (Ti), tantalum (Ta), copper (Cu), aluminum (Al), ruthenium (Ru), molybdenum (Mo), another suitable metal material, and/or a combination thereof.

Figure 2G:
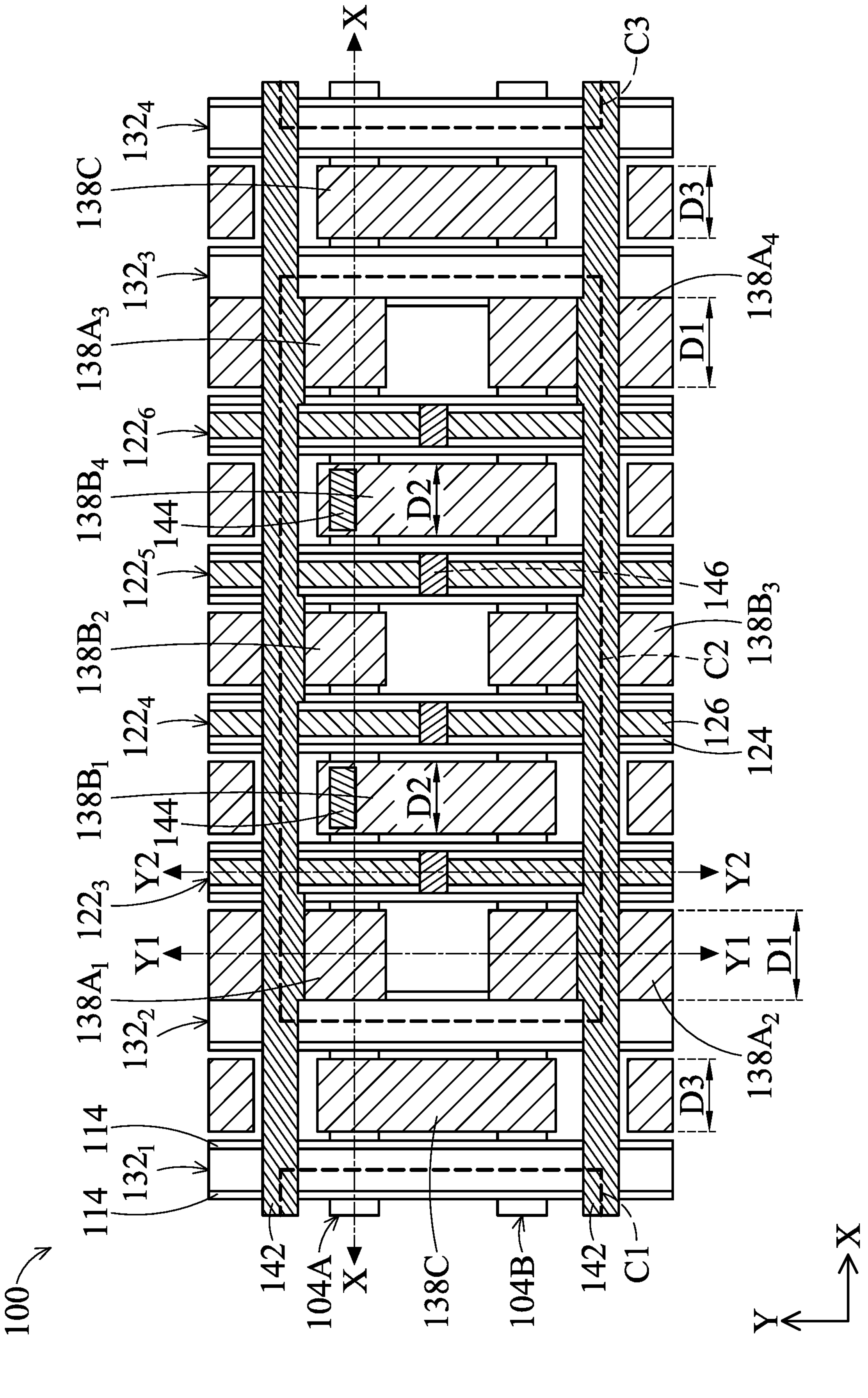
Figures 1, 2G:
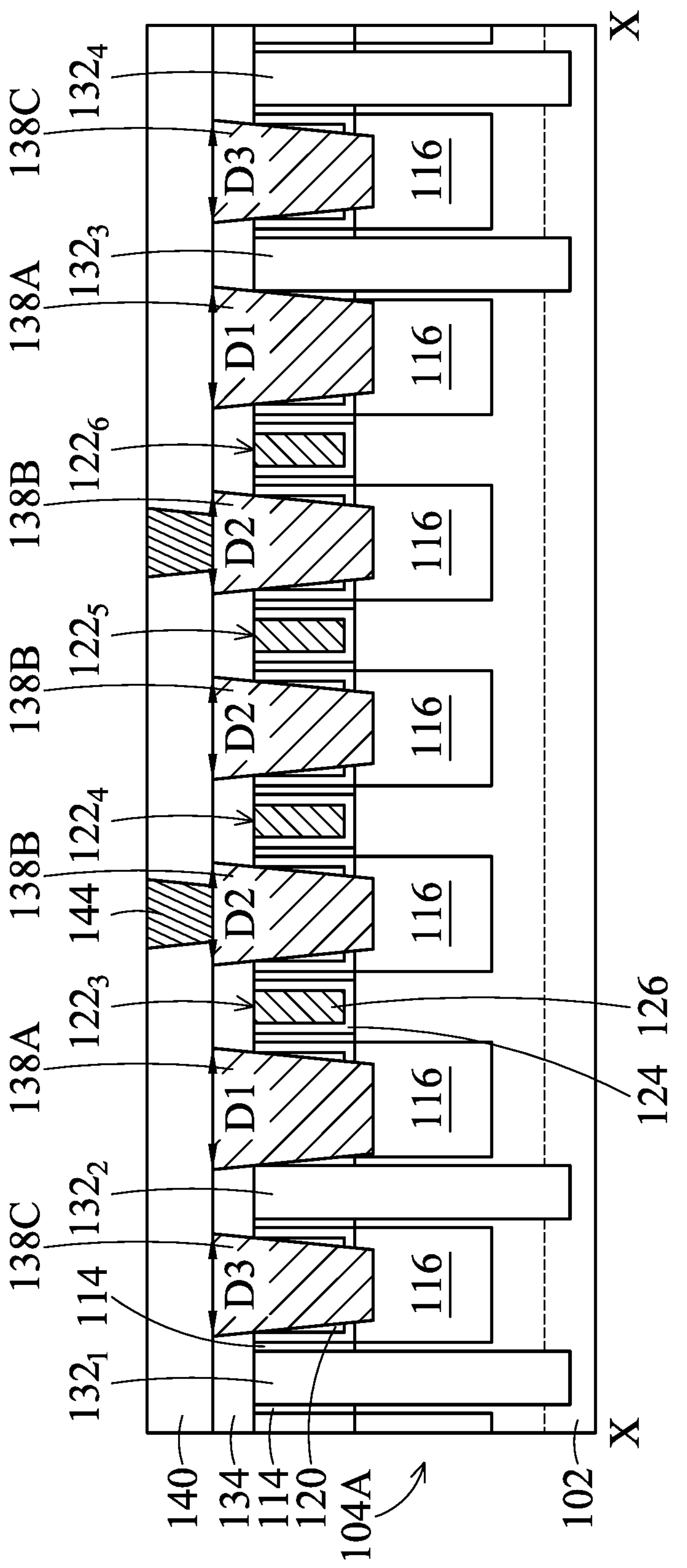
Figures 2, 2G:
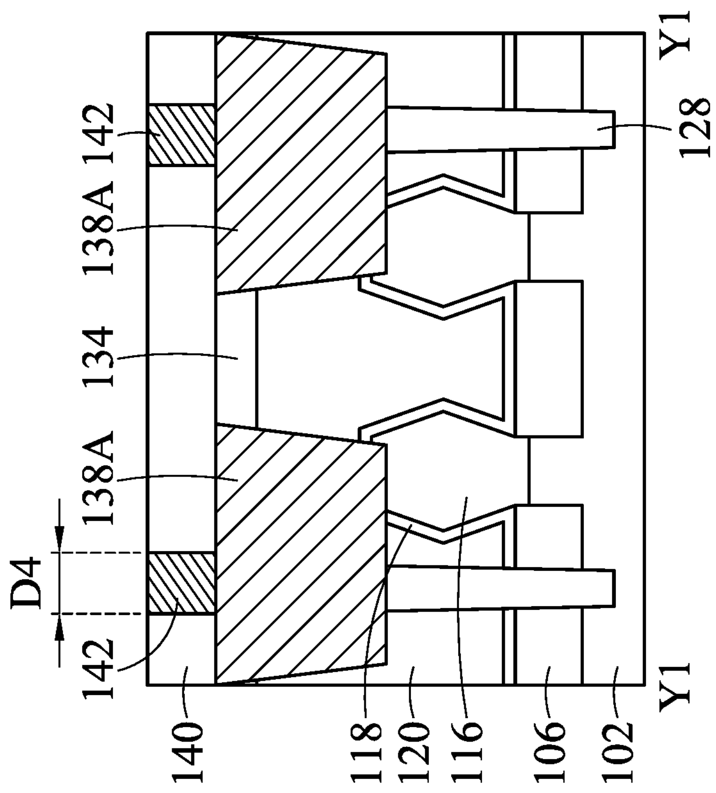
Figures 2, 2G, 3:
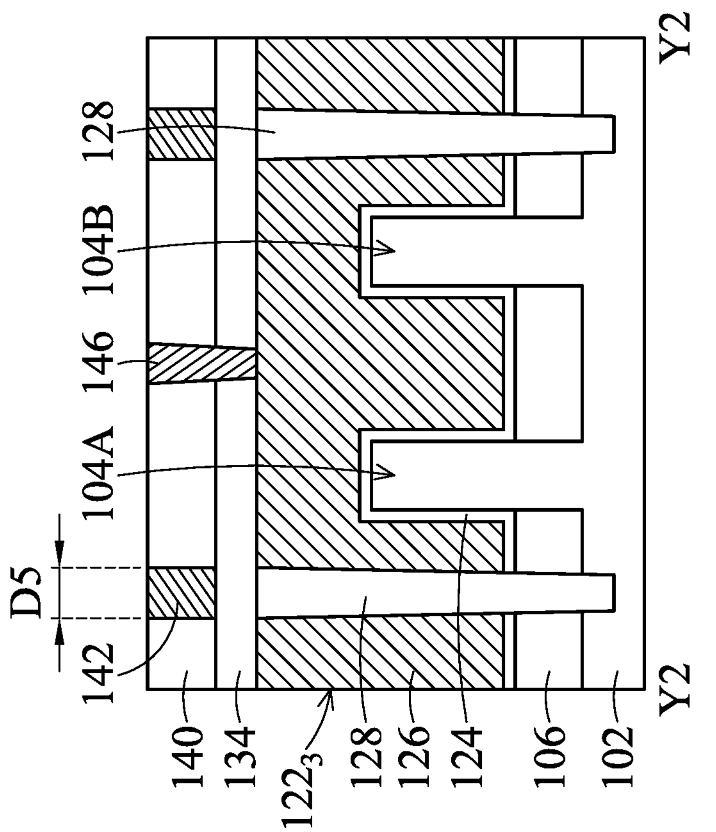
Figure 3:
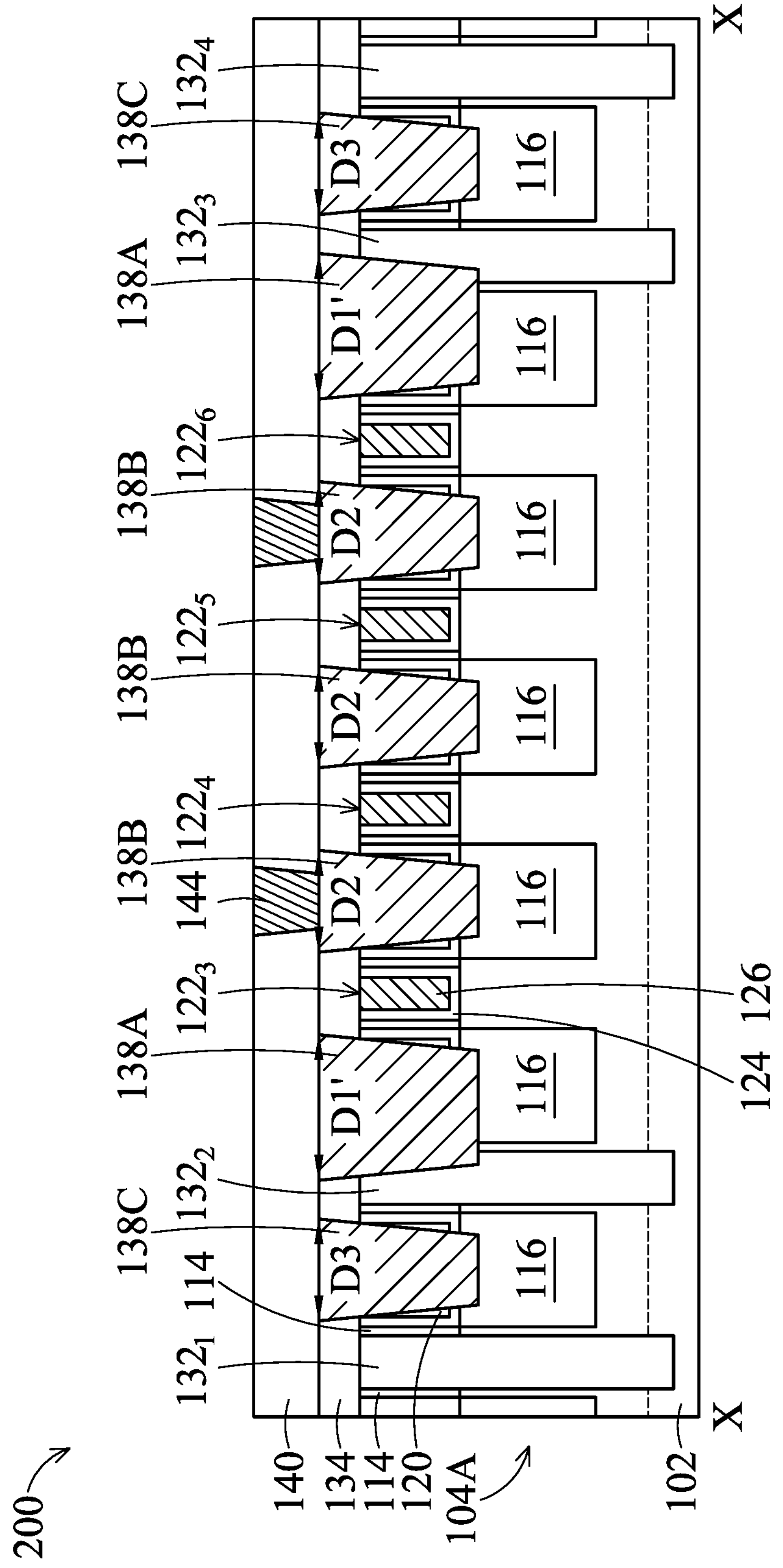

FIGS. 2G through 2G-3 illustrate a semiconductor structure 100 after the formation of vias 142, 144 and 146, in accordance with some embodiments. FIGS. 2G-1, 2G-2 and 2G-3 are cross-sectional views of the semiconductor structure 100 taken along line X-X, line Y1-Y1 and line Y2-Y2 of FIG. 2G, respectively.

A third interlayer dielectric layer 140 is formed over the semiconductor structure 100, as shown in FIGS. 2G-1, 2G-2 and 2G-3, in accordance with some embodiments. In some embodiments, the third interlayer dielectric layer 140 is made of dielectric material, such as USG, BPSG, FSG, PSG, BSG, and/or another suitable dielectric material. In some embodiments, the third interlayer dielectric layer 140 is deposited using such as CVD (such as HDP-CVD, PECVD, HARP or FCVD), another suitable technique, or a combination thereof.

Vias 142 are formed in and/or through the third interlayer dielectric layer 140 and land on and are electrically connected to contact plugs 138$A_{1-4}$ and 138$B_2$ and 138$B_3$, as shown in FIGS. 2G, 2G-2 and 2G-3, in accordance with some embodiments. In some embodiments, the vias 142 are electrically isolated from the contact plugs 138$B_1$ and 138$B_4$ and contact plugs 138C, in accordance with some embodiments. Vias 144 are formed in and/or through the third interlayer dielectric layer 140 and land on and are electrically connected to contact plugs 138$B_1$ and 138$B_4$, as shown in FIGS. 2G and 2G-1, in accordance with some embodiments. Vias 146 are formed in and/or through the third interlayer dielectric layer 140 and the second interlayer dielectric layer 134 and land on and are electrically connected to metal gate electrodes 126 of the final gate stacks $122_{3-6}$, as shown in FIGS. 2G and 2G-3, in accordance with some embodiments.

In some embodiments, the vias 142 may be also referred to as source vias (VS). In some embodiments, the vias 144 may be also referred to as drain vias (VD). In some embodiments, the vias 146 may be also referred to as gate vias (VG). In some embodiments, no vias are formed on the dummy contact plugs 138C.

The vias 142 extend in the X direction, in accordance with some embodiments. The vias 142 have longitudinal axes parallel to the X direction, in accordance with some embodiments. That is, the dimensions (lengths) of the vias 142 in the X direction are greater than the dimensions (widths) of the vias 142 in the Y direction. The vias 142 are aligned with the edges of the cells C1, C2 and C3 extending in the X direction and overlap the gate cutting structures 128, in accordance with some embodiments.

In some embodiments, portions of the vias 142 directly above the source contact plugs $138A_{1-4}$ and $138B_2$ and $138B_3$ protrude toward the fin structures 104A or 104B, as shown in FIG. 2G. The protruding portions of the vias 142, directly above the source contact plugs $138A_{1-4}$ and $138B_2$ and $138B_3$, have dimensions D4 in the Y direction that are greater than the dimensions D5 of the other portion of the vias 142 in the Y direction, as shown in FIGS. 2G-2 and 2G-3, in accordance with some embodiments. The protruding portions of the vias 142 may reduce the resistance (e.g., sheet resistance) from the source/drain features to the overlying metal lines, in accordance with some embodiments.

In some embodiments, the formation of the vias 142, 144 and via 146 includes patterning the third interlayer dielectric layer 140 and the second interlayer dielectric layer 134 to form via openings (where the vias 142, 144 and via 146 are to be formed) using photolithography and etching processes. In some embodiments, the final gate stacks 122 are exposed from the via openings for vias 146, and the contact plugs 138A and 138B are exposed from the via openings for vias 142 and 144. The etch process may include dry etching such as RIE, NBE, ICP etch, CCP etch, another suitable method, or a combination thereof. The patterning process for forming the vias 142, 144 and via 146 may be formed separately.

In some embodiments, one or more conductive materials are deposited using CVD, PVD, e-beam evaporation, ALD, ECP, ELD, another suitable method, or a combination thereof to overfill the via openings. Afterward, the one or more conductive materials over the top surface of the third interlayer dielectric layer 140 are removed using, for example, CMP. After the planarization process, the top surfaces of the vias 142, 144 and 146 and the top surface of the third interlayer dielectric layer 140 are substantially coplanar, in accordance with some embodiments.

The vias 142, 144 and via 146 may have a multilayer structure. For example, a barrier layer (not shown) may optionally be deposited along the sidewalls and the bottom surfaces of the via openings. The barrier layer may be made of tantalum (Ta), tantalum nitride (TaN), titanium (Ti), titanium nitride (TiN), cobalt tungsten (CoW), another suitable material, or a combination thereof. A glue layer (not shown) may optionally be deposited along the sidewalls and the bottom surfaces of the via openings, and on the barrier layer (if formed). The glue layer may be made of tantalum nitride (TaN), titanium (Ti), titanium nitride (TiN), another suitable material, or a combination thereof. A metal bulk layer is then deposited on the glue layer (if formed) to fill the remainder of the via openings. In some embodiments, the metal bulk layers are made of one or more conductive materials, such as cobalt (Co), nickel (Ni), tungsten (W), titanium (Ti), tantalum (Ta), copper (Cu), aluminum (Al), ruthenium (Ru), molybdenum (Mo), another suitable metal material, or a combination thereof.

It should be understood that the semiconductor structure 100 may undergo further CMOS processes to form various features over the semiconductor structure 100, such as a multilayer interconnect structure (e.g., metal lines, inter metal dielectric layers, passivation layers, etc.). The functional circuits in the cell regions C1, C2 and C3 may be electrically coupled through the multilayer interconnect structure to produce an integrated circuit.

FIG. 3 is a modification of the semiconductor structure 100 of FIG. 2G-1, in accordance with some embodiments of the disclosure. The semiconductor structure 200 of FIG. 3 is similar to the semiconductor structure 100 of FIG. 2G-1 except that the contact plugs 138A have even larger widths.

The contact plugs 138A partially cut through the fin cutting structure 132 (e.g., $132_2$ and $132_3$) and have a greater dimension D1' in the X direction, as shown in FIG. 3, in accordance with some embodiments. The sidewalls and the bottom surfaces of the contact plugs 138A are in direct contact with the fin cutting structure 132, in accordance with some embodiments.

Figure 4A:
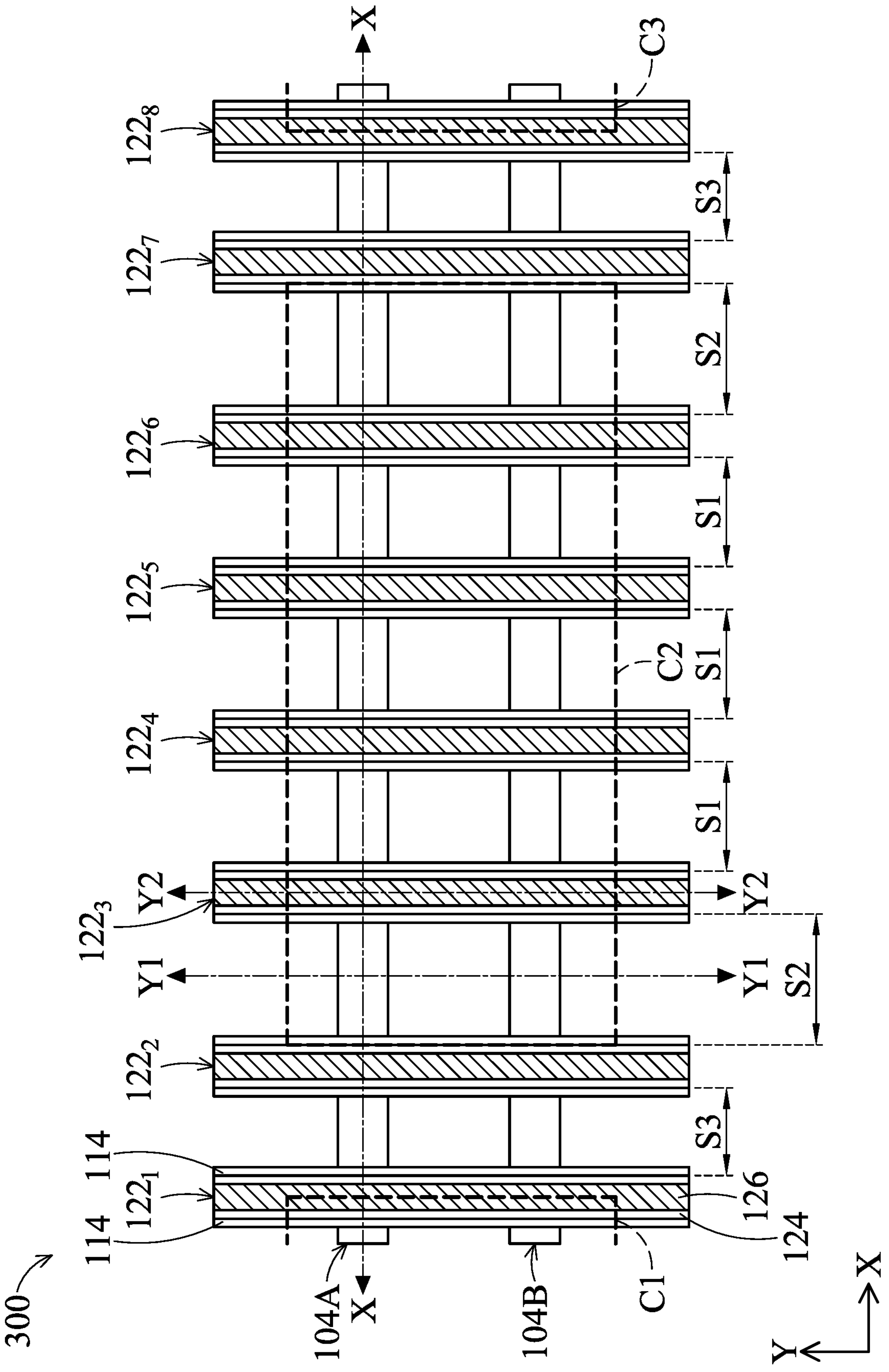
FIGS. 4A, 4B and 4C are plan views illustrating the formation of a semiconductor structure at various intermediate stages, in accordance with some embodiments of the disclosure.
Figure 4B:
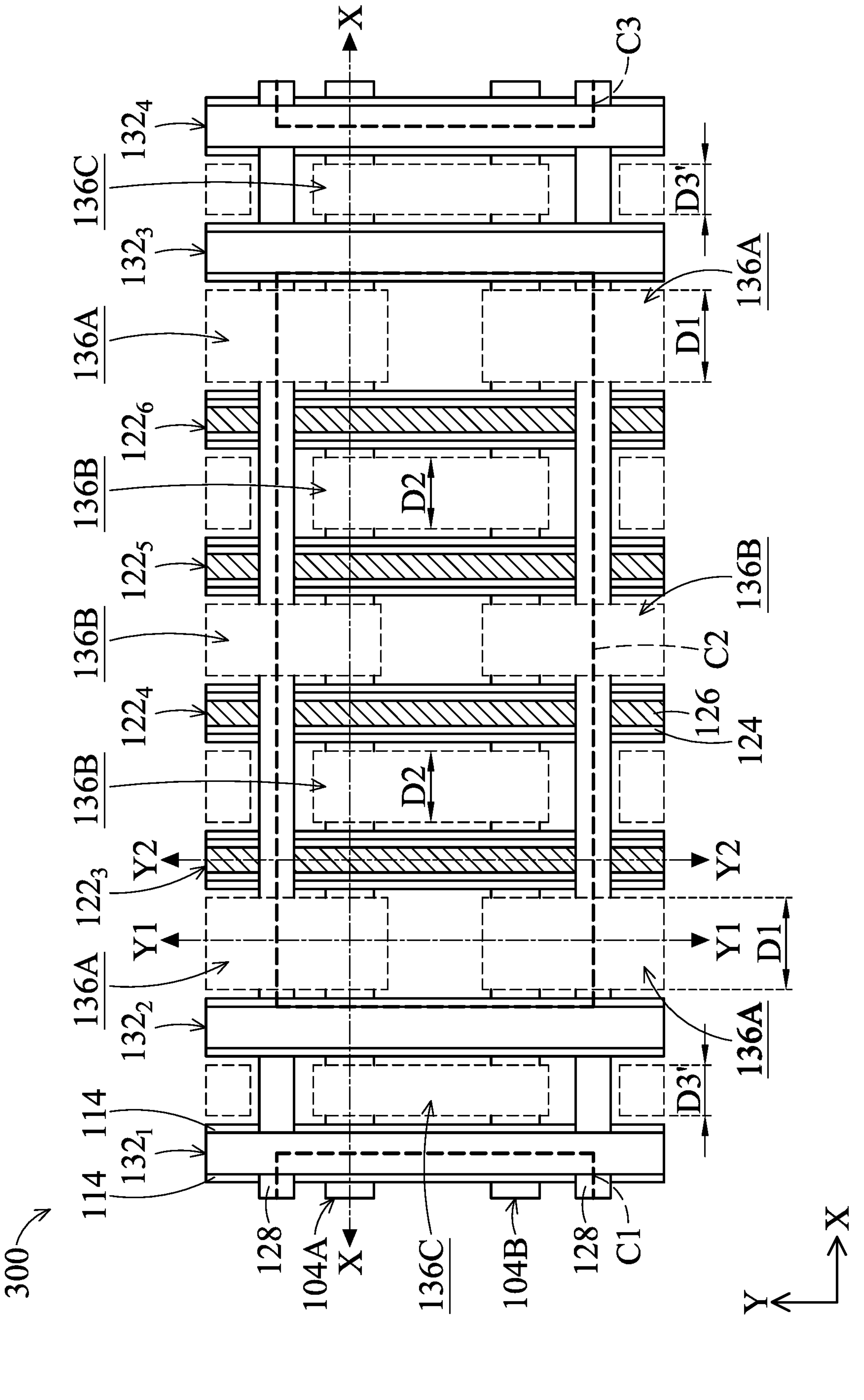
Figures 1, 4B:
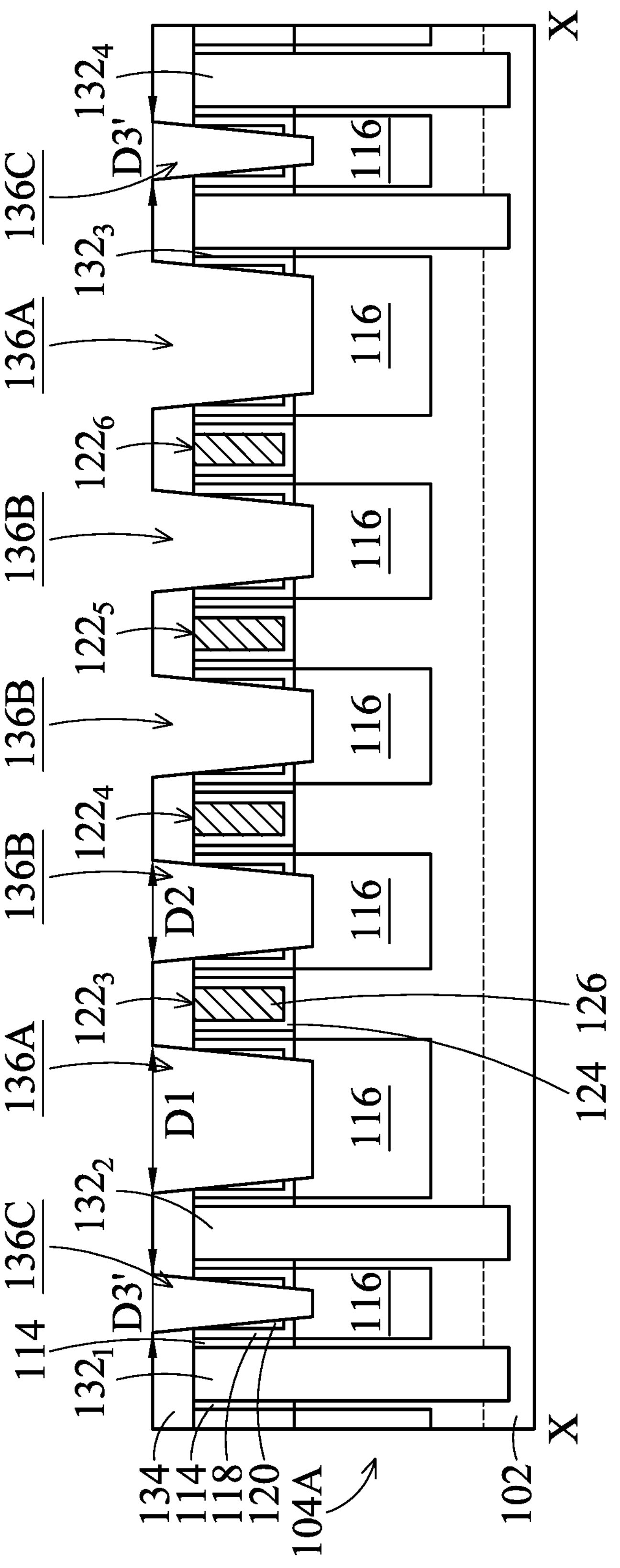
Figure 4C:
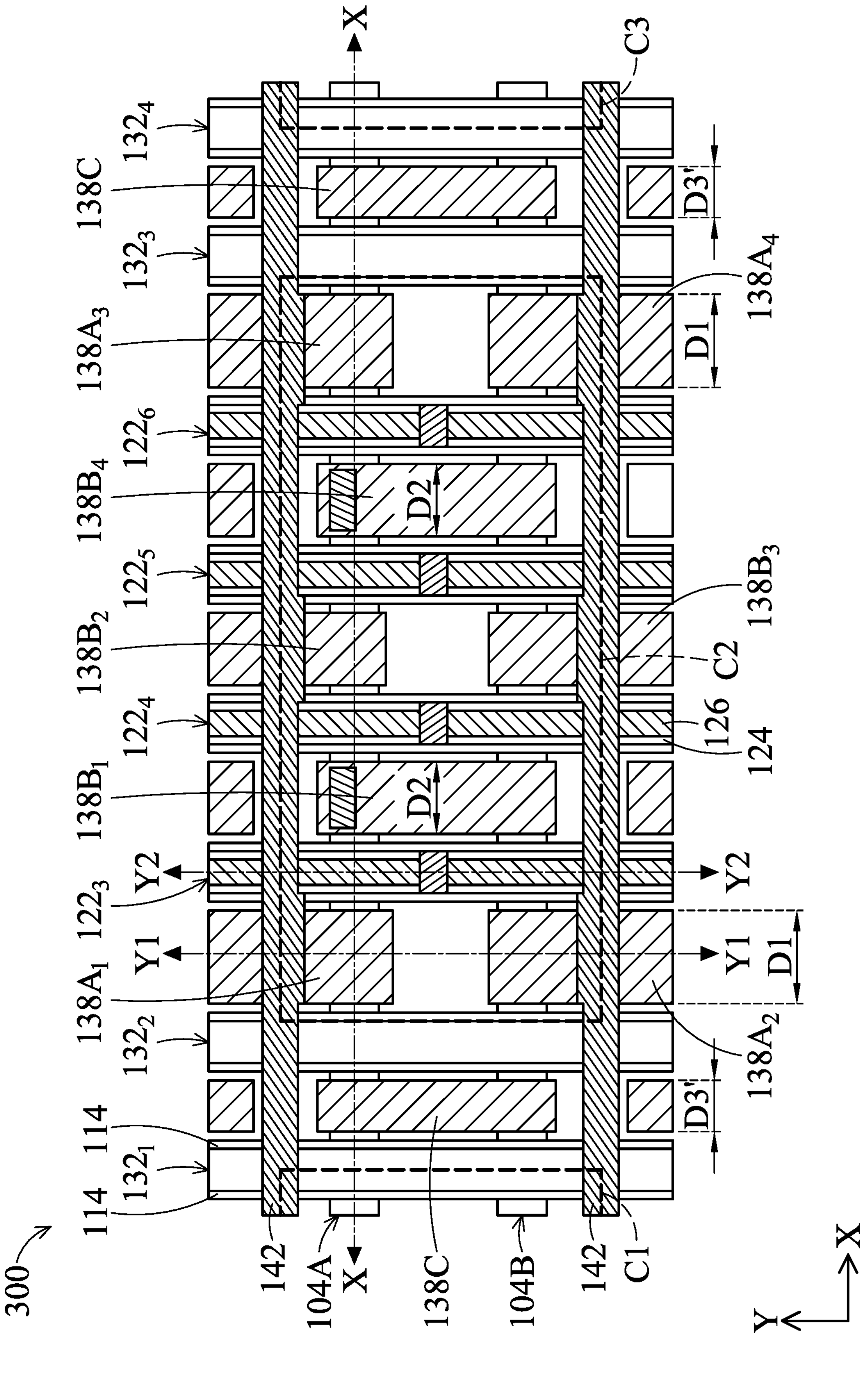
Figures 1, 4C:
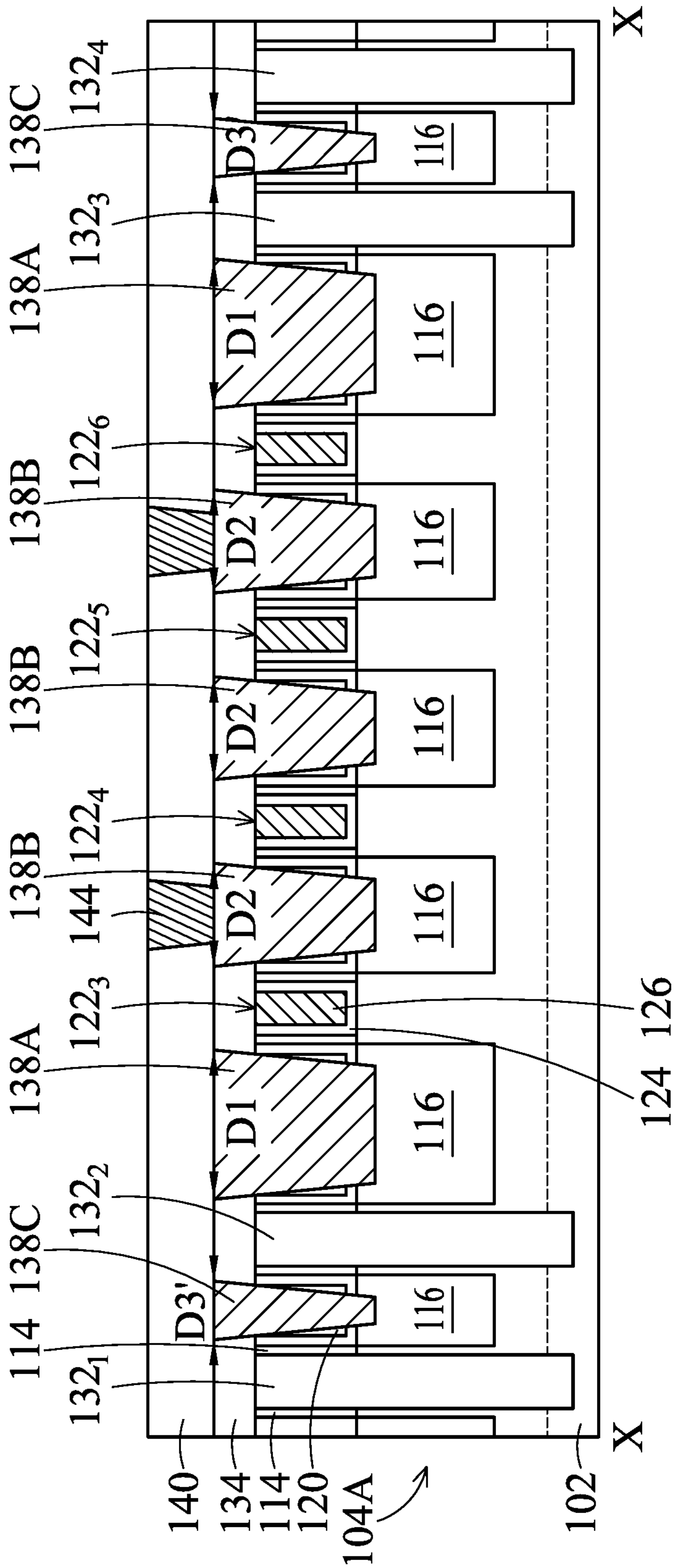
Figures 2, 4C:
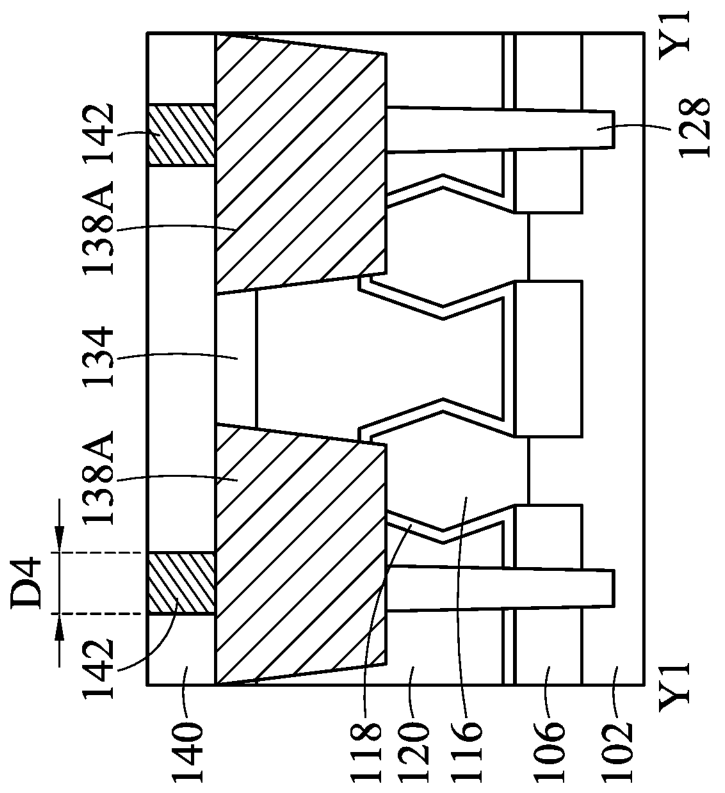
Figures 3, 4C:
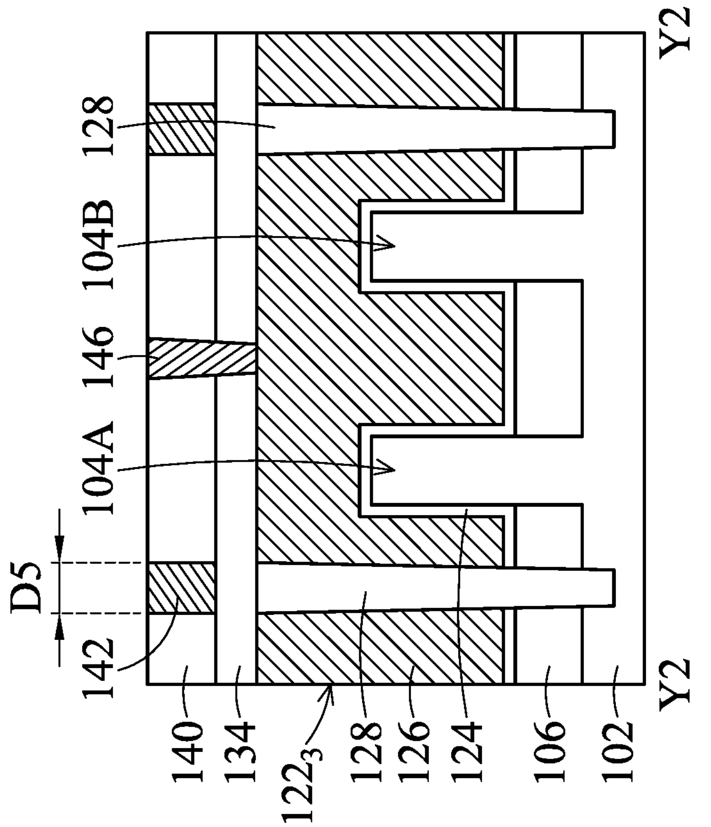

FIGS. 4A, 4B and 4C are plan views illustrating the formation of a semiconductor structure 300 at various intermediate stages, in accordance with some embodiments of the disclosure. The embodiments of FIGS. 4A-4C similar to the embodiments of FIGS. 2A-2G except that the fin cutting structures $132_2$ and $132_3$ are offset.

FIG. 4A illustrates a semiconductor structure 300 after the formation of final gate stacks 122, in accordance with some embodiments.

The steps described above and in FIGS. 2A through 2B-2 are performed, thereby forming the fin structures 104 (including 104A and 104B), the isolation structure 106, the gate spacer layers 114, the source/drain features 116, the contact etching stop layer 118, the first interlayer dielectric layer 120, and the final gate stacks 122 (including $122_{1-8}$), as shown in FIG. 4A, in accordance with some embodiments.

The final gate stack $122_2$ is offset toward the cell region C1, and the final gate stack $122_7$ is offset toward the cell region C3, in accordance with some embodiments. In some embodiments, the distance S2 between the final gate stack $122_2$ and the final gate stack $122_3$ (or between the final gate stack $122_7$ and the final gate stack $122_6$) is greater than the distance S1 between the final gate stacks $122_{3-6}$ within the cell region C2. In some embodiments, the distance S2 is in a range from about 15.5 nm to about 50.5 nm.

In some embodiments, the distance S3 between the final gate stack $122_2$ and the final gate stack $122_1$ (or between the final gate stack $122_7$ and the final gate stack $122_8$) is shorter than the distance S1. In some embodiments, the distance S3 is in a range from about 14.5 nm to about 49.5 nm.

FIGS. 4B and 4B-1 illustrate a semiconductor structure 300 after the formation of contact openings 136, in accordance with some embodiments. FIGS. 4B 1 is a cross-sectional view of the semiconductor structure 300 taken along line X-X of FIG. 4B.

The steps described above and in FIGS. 2C through 2E-3 are performed on the semiconductor structure 300, thereby forming the gate cutting structures 128, the fin cutting structures 132 (including $132_{1-4}$), the second interlayer dielectric layer 134, and the contact openings 136 (including 136A, 136B and 136C), as shown in FIGS. 4B and 4B-1, in accordance with some embodiments.

The fin cutting structure $\mathbf{132}_2$ (in place of the final gate stack $\mathbf{122}_2$) is offset toward the cell region C1, and the fin cutting structure $\mathbf{132}_3$ (in place of the final gate stack $\mathbf{122}_7$) is offset toward the cell region C3, in accordance with some embodiments.

In some embodiments, because the fin cutting structures $\mathbf{132}_2$ and $\mathbf{132}_3$ are offset to the outside of the cell regions C2, the contact openings 136A do not penetrate through the gate spacer layers 114 on the sidewalls of the fin cutting structures $\mathbf{132}_2$ and $\mathbf{132}_3$, as shown in FIG. 4B-1. As a result, the difficulty of the etching process for forming the contact openings 136A may be reduced, in accordance with some embodiments. The contact openings 136A are spaced apart from the fin cutting structures $\mathbf{132}_2$ and $\mathbf{132}_3$ by the gate spacer layers 114 and the contact etching stop layer 118, in accordance with some embodiments.

In some embodiments, the contact openings 136C have smaller dimensions D3' (e.g., widths) in the X direction. In some embodiments, the dimensions D3' of the contact openings 136C are in a range from about 14.5 nm to about 19.5 nm. In some embodiments, the contact openings 136A are wider than the contact openings 136B (i.e., D1>D2). In some embodiments, the contact openings 136B are wider than the contact openings 136C (i.e., D2>D3'). In some embodiments, the ratio (D2/D3) of the dimensions D2 to the dimensions D3' is greater than 1, e.g., in a range from about 1.05 to about 4.

In some embodiments, the distance between the contact opening 136A and the adjacent fin cutting features 132 is substantially the same as the distance between the contact opening 136A and the adjacent final gate stacks 122. In some embodiments, the distance between the contact opening 136A and the adjacent final gate stacks 122 is substantially the same as the distance between the contact opening 136B and the adjacent final gate stacks 122.

FIGS. 4C through 4C-3 illustrate a semiconductor structure 300 after the formation of contact plugs 138 and vias 142, 144 and 146, in accordance with some embodiments. FIGS. 4C-1, 4C-2 and 4C-3 are cross-sectional views of the semiconductor structure 300 taken along line X-X, line Y1-Y1 and line Y2-Y2 of FIG. 4C, respectively.

The steps described above and in FIG. 2F through 2G-3 are performed on the semiconductor structure 300, thereby forming the third interlayer dielectric layer 140, the contact plugs 138A, 138B and 138C and the vias 142, 144 and 146, as shown in FIGS. 4C through 4C-3, in accordance with some embodiments.

In some embodiments, the contact plugs 138C have the dimensions D3' (e.g., widths) in the X direction. In some embodiments, the contact plugs 138A are wider than the contact plugs 138B (i.e., D1>D2). In some embodiments, the contact plugs 138B are wider than the contact plugs 138C (i.e., D2>D3'). In some embodiments, the distance between the contact plugs 138A and the adjacent fin cutting features 132 is substantially the same as the distance between the contact plugs 138A and the adjacent final gate stacks 122. The contact plugs 138A with the greater dimension D1 may reduce the overall resistance of the functional circuit in the cell region C2. Therefore, the performance of the resulting semiconductor devices may be enhanced.

Figure 5A:
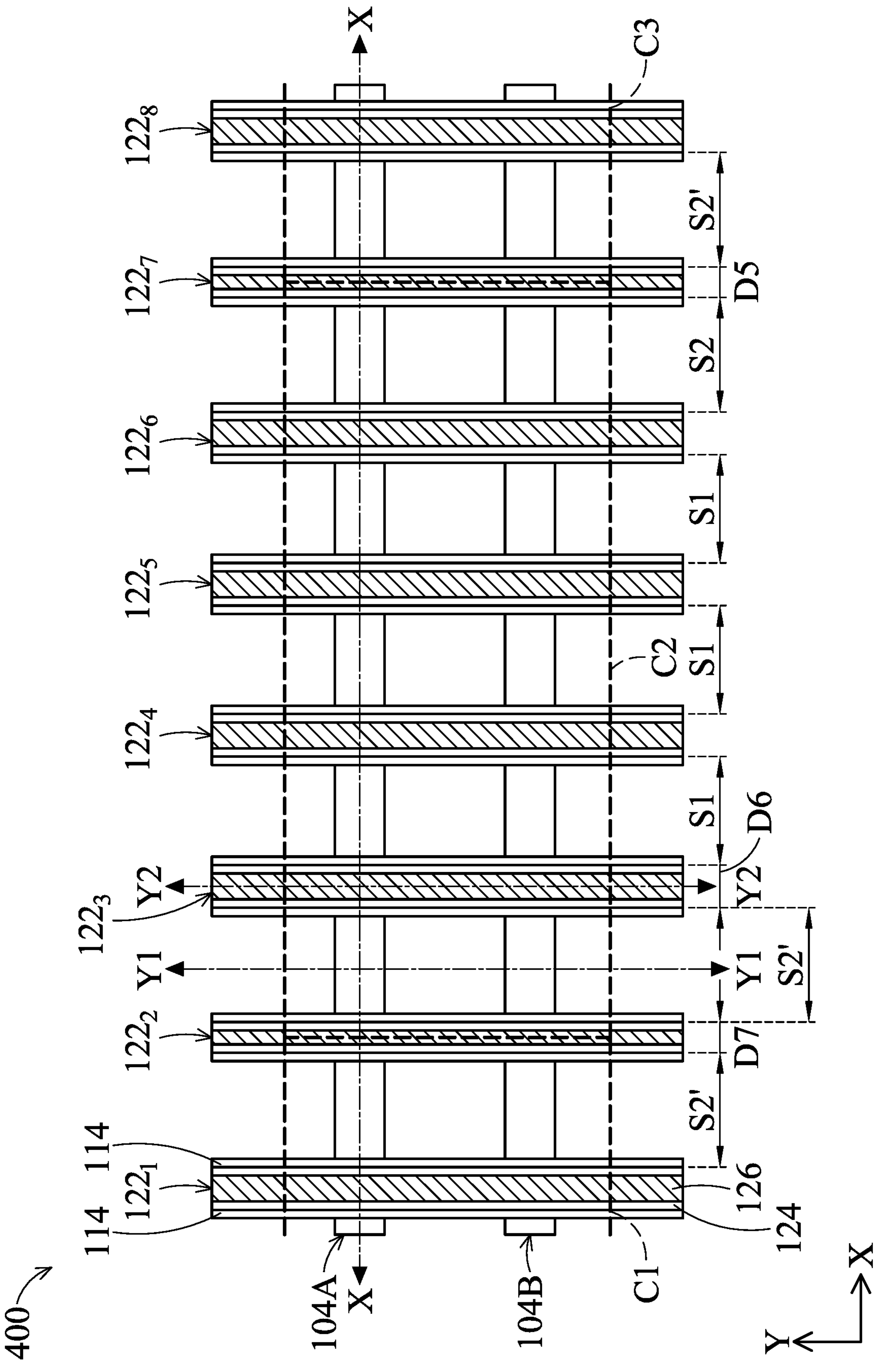
FIGS. 5A, 5B and 5C are plan views illustrating the formation of a semiconductor structure at various intermediate stages, in accordance with some embodiments of the disclosure.
Figure 5B:
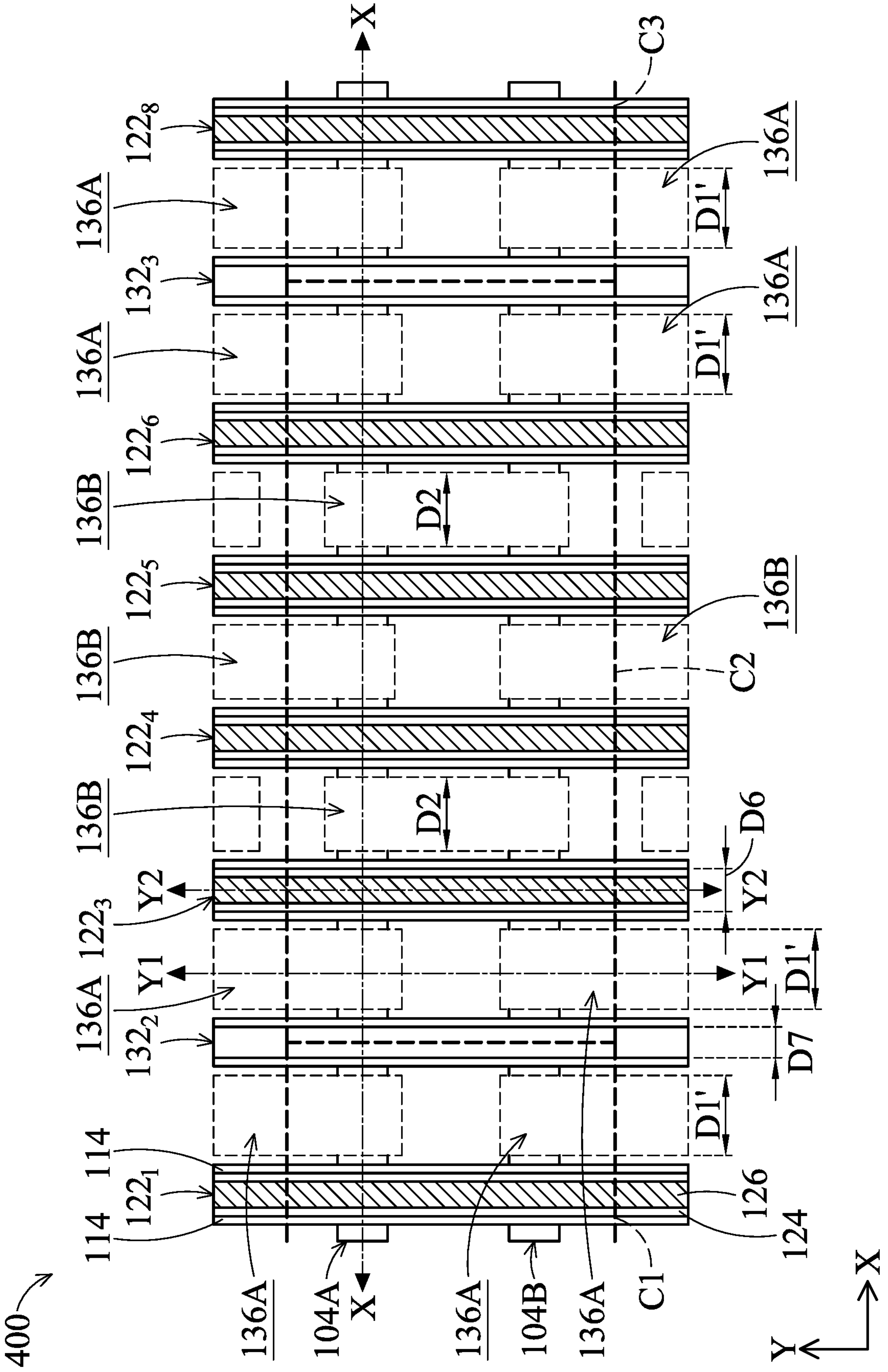
Figures 1, 5B:
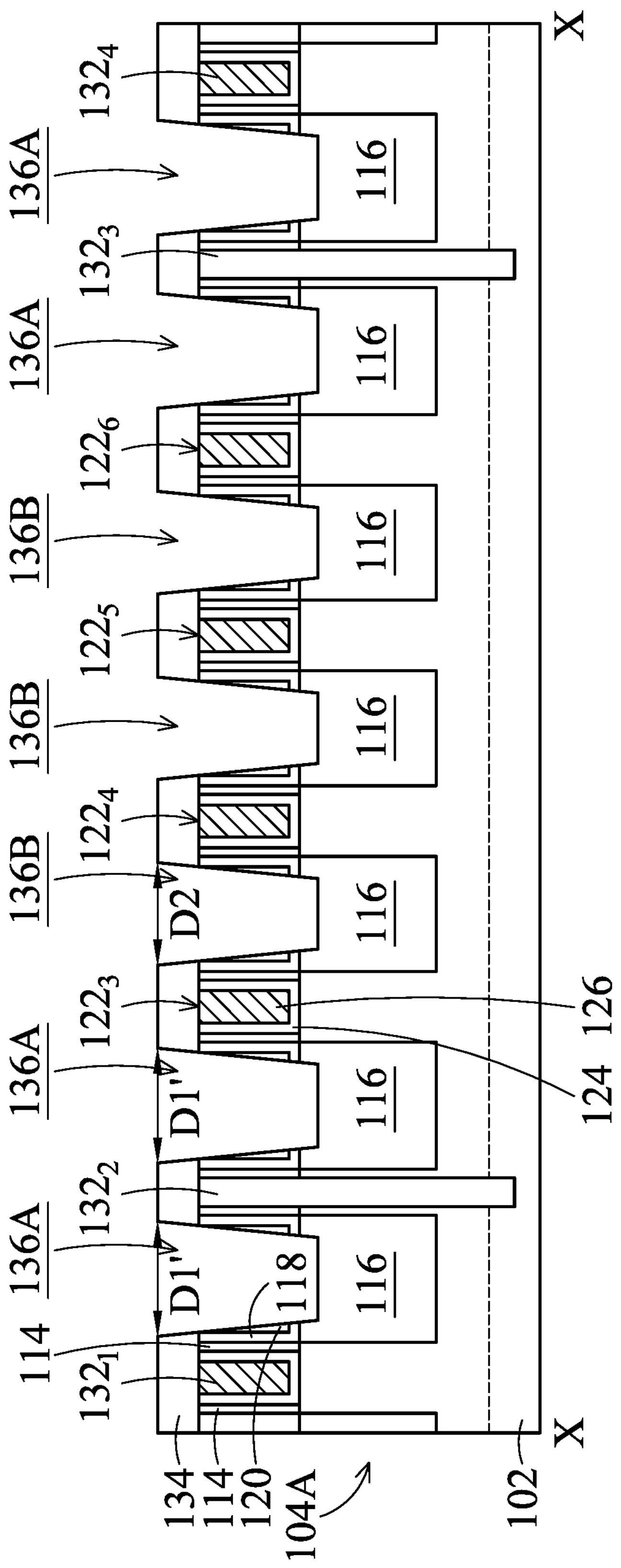
Figure 5C:
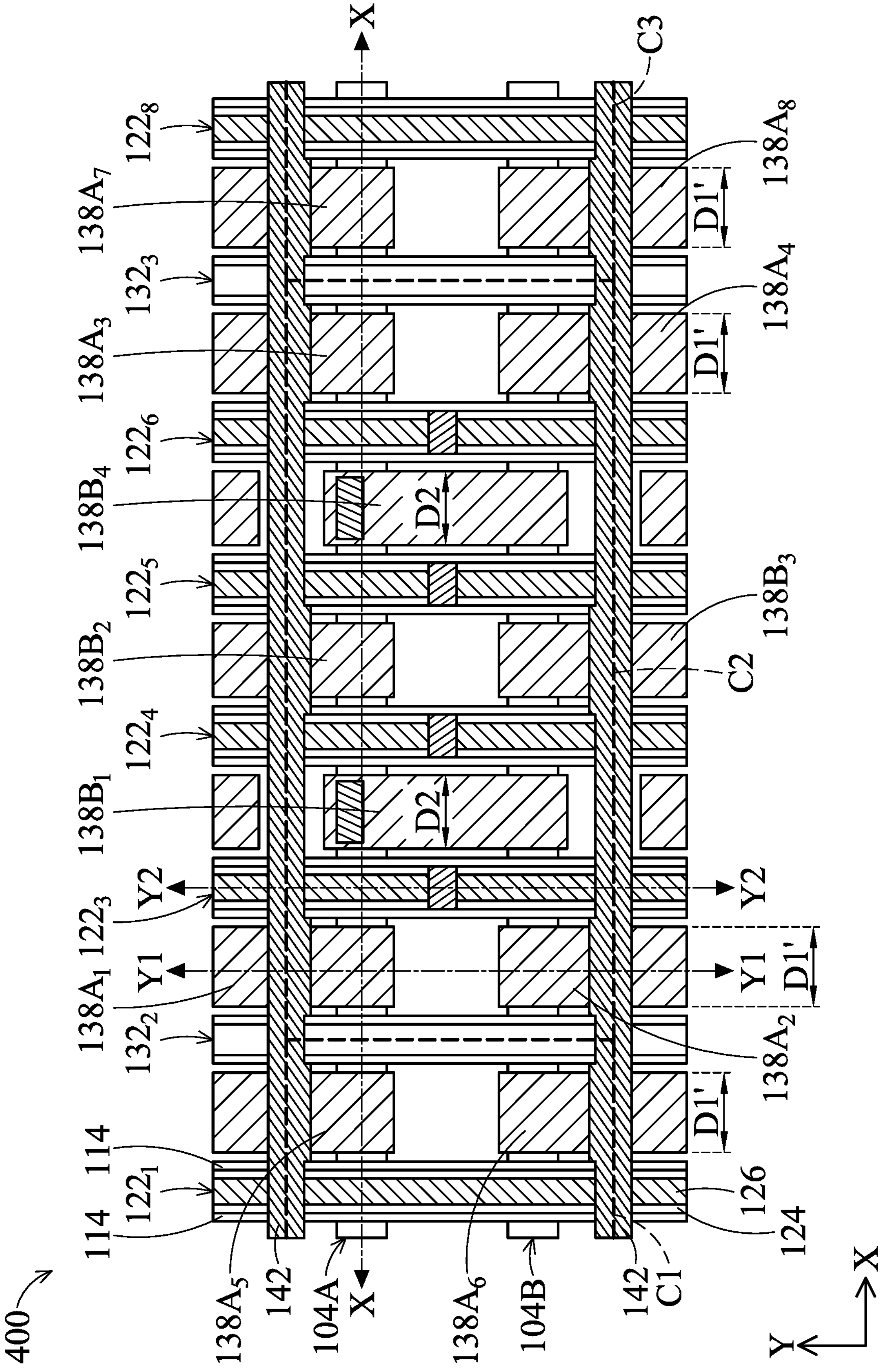
Figures 1, 5C:
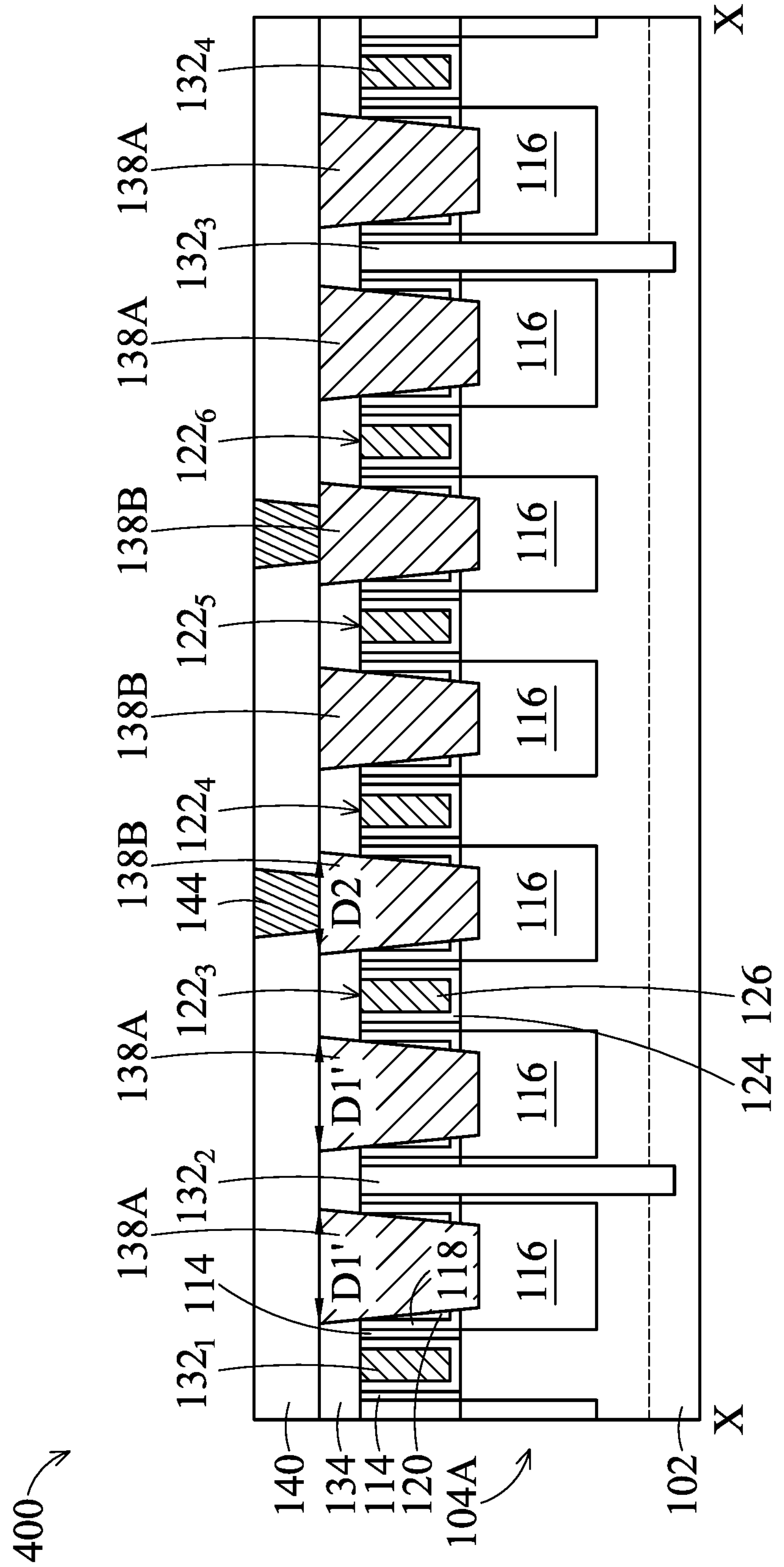
Figures 3, 5C:
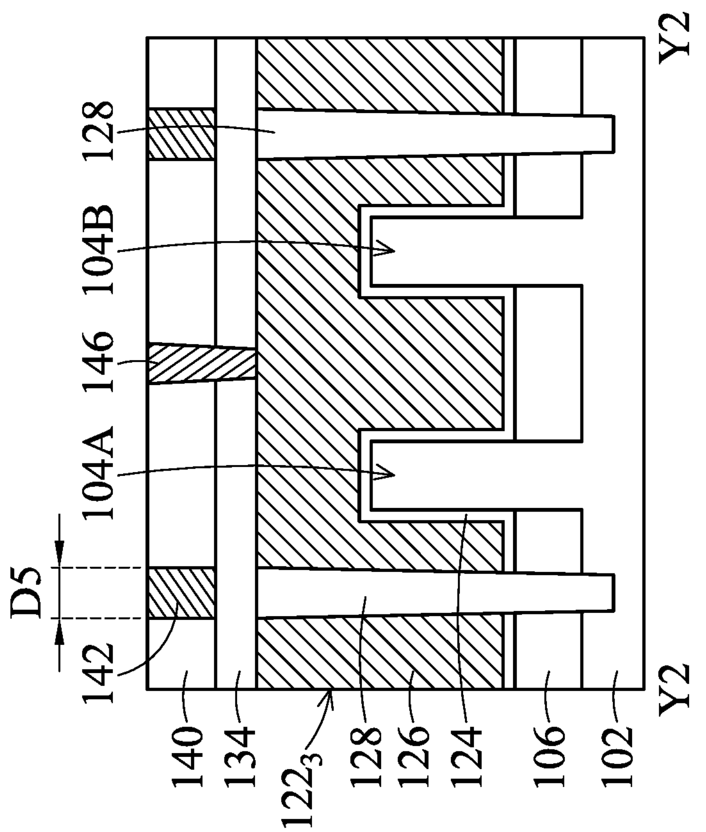
Figures 2, 5C:
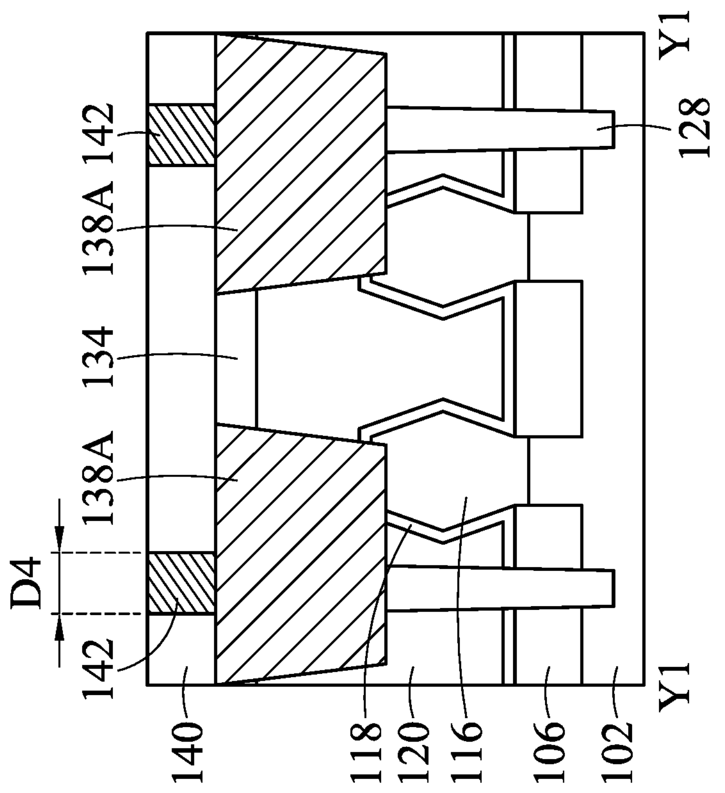

FIGS. 5A, 5B and 5C are plan views illustrating the formation of a semiconductor structure 400 at various intermediate stages, in accordance with some embodiments of the disclosure. The embodiments of FIGS. 5A-5C similar to the embodiments of FIGS. 2A-2G except that the fin cutting structures 132 have smaller widths.

FIG. 5A illustrates a semiconductor structure 400 after the formation of final gate stacks 122, in accordance with some embodiments.

The steps described above and in FIG. 2A through 2B-2 are performed, thereby forming the fin structures 104 (including 104A and 104B), the isolation structure 106, the gate spacer layers 114, the source/drain features 116, the contact etching stop layer 118, the first interlayer dielectric layer 120, and the final gate stacks 122 (including $\mathbf{122}_{1\text{-}8}$), as shown in FIG. 5A, in accordance with some embodiments.

The cell regions C1, C2 and C3 are connected to each other, in accordance with some embodiments. In some embodiments, the boundary between the cell region C1 and the cell region C2 is aligned with the final gate stack $\mathbf{122}_2$. In some embodiments, the boundary between the cell region C2 and the cell region C3 is aligned with the final gate stack $\mathbf{122}_7$.

In some embodiments, the final gate stacks $\mathbf{122}_1$, $\mathbf{122}_{3\text{-}6}$ and $\mathbf{122}_8$ within the cell regions C1, C2 and C3 have dimensions D6 (e.g., widths) in the X direction. In some embodiments, the dimensions D6 are in a range from about 10 nm to about 25 nm. In some embodiments, the final gate stacks $\mathbf{122}_2$ and $\mathbf{122}_7$ on the cell boundaries have dimensions D7 (e.g., widths) in the X direction. In some embodiments, the dimensions D7 are shorter than the dimensions D6 and in a range from about 9 nm to about 24 nm.

In some embodiments, the distances S2' between the final gate stack $\mathbf{122}_2$ and the final gate stack $\mathbf{122}_3$ (or $\mathbf{122}_1$) and between the final gate stack $\mathbf{122}_7$ and the final gate stack $\mathbf{122}_6$ (or $\mathbf{122}_8$) are in a range from about 15.5 nm to about 50.5 nm. In some embodiments, the distance S2' is greater than the distance S1 between the final gate stacks $\mathbf{122}_{3\text{-}6}$ within the cell region C2.

FIGS. 5B and 5B-1 illustrate a semiconductor structure 400 after the formation of contact openings 136, in accordance with some embodiments. FIGS. 5B 1 is a cross-sectional view of the semiconductor structure 400 taken along line X-X of FIG. 5B.

The steps described above and in FIGS. 2C through 2E-3 are performed on the semiconductor structure 400, thereby forming the gate cutting structures 128, the fin cutting structures 132 (including $\mathbf{132}_2$ and $\mathbf{132}_3$), the second interlayer dielectric layer 134, and the contact openings 136 (including 136A and 136B), as shown in FIGS. 4B and 4B-1, in accordance with some embodiments.

In some embodiments, the final gate stacks $\mathbf{122}_1$ and $\mathbf{122}_8$ within the cell regions C1 and C3 are functional gates and are not replaced by the fin cutting structures 122. In some embodiments, the fin cutting structures $\mathbf{132}_2$ and $\mathbf{132}_3$ (in place of the final gate stacks $\mathbf{122}_2$ and $\mathbf{122}_7$) on the cell boundaries have the dimensions D7 (e.g., widths) in the X direction. In some embodiments, the dimensions D5 are shorter than the dimensions D6 of the final gate stack $\mathbf{122}_1$, $\mathbf{122}_{3\text{-}6}$ and $\mathbf{122}_8$.

In some embodiments, because the fin cutting structures $\mathbf{132}_2$ and $\mathbf{132}_3$ have small widths, the contact openings 136A do not penetrate through the gate spacer layers 114 on the sidewalls of the fin cutting structures $\mathbf{132}_2$ and $\mathbf{132}_3$, as shown in FIG. 5B-1. As a result, the difficulty of the etching process for forming the contact openings 136A may be reduced, in accordance with some embodiments. The contact openings 136A are spaced apart from the fin cutting structures $\mathbf{132}_2$ and $\mathbf{132}_3$ by the gate spacer layers 114 and the contact etching stop layer 118, in accordance with some embodiments.

In some embodiments, the contact openings 136A have dimensions D1' (e.g., widths) in the X direction. In some embodiments, the dimensions D1' are in a range from about 5.5 nm to about 20.5 nm. In some embodiments, the contact openings 136A are wider than the contact openings 136B (i.e., D1'>D2). In some embodiments, the ratio (D1'/D2) of the dimensions D1' to the dimensions D2 is greater than 1, e.g., in a range from about 1.05 to about 4.

In some embodiments, the distance between the contact opening 136A and the adjacent fin cutting features 132 is substantially the same as the distance between the contact opening 136A and the adjacent final gate stacks 122. In some embodiments, the distance between the contact opening 136A and the adjacent final gate stacks 122 is substantially the same as the distance between the contact opening 136B and the adjacent final gate stacks 122.

FIGS. 5C through 5C-3 illustrate a semiconductor structure 400 after the formation of contact plugs 138 and vias 142, 144 and 146, in accordance with some embodiments. FIGS. 5C-1, 5C-2 and 5C-3 are cross-sectional views of the semiconductor structure 400 taken along line X-X, line Y1-Y1 and line Y2-Y2 of FIG. 5C, respectively.

The steps described above and in FIGS. 2F through 2G-3 are performed on the semiconductor structure 400, thereby forming the third interlayer dielectric layer 140, the contact plugs 138A and 138, and the vias 142, 144 and 146, as shown in FIGS. 5C through 5C-3, in accordance with some embodiments.

In some embodiments, the contact plugs 138A have the dimensions D1' (e.g., widths) in the X direction. In some embodiments, the contact plug 138A are wider than the contact plug 138B (i.e., D1'>D2). The contact plugs 138A with the greater dimension D1' may reduce the overall resistance of the functional circuit in the cell region C2. Therefore, the performance of the resulting semiconductor devices may be enhanced.

Figure 6:
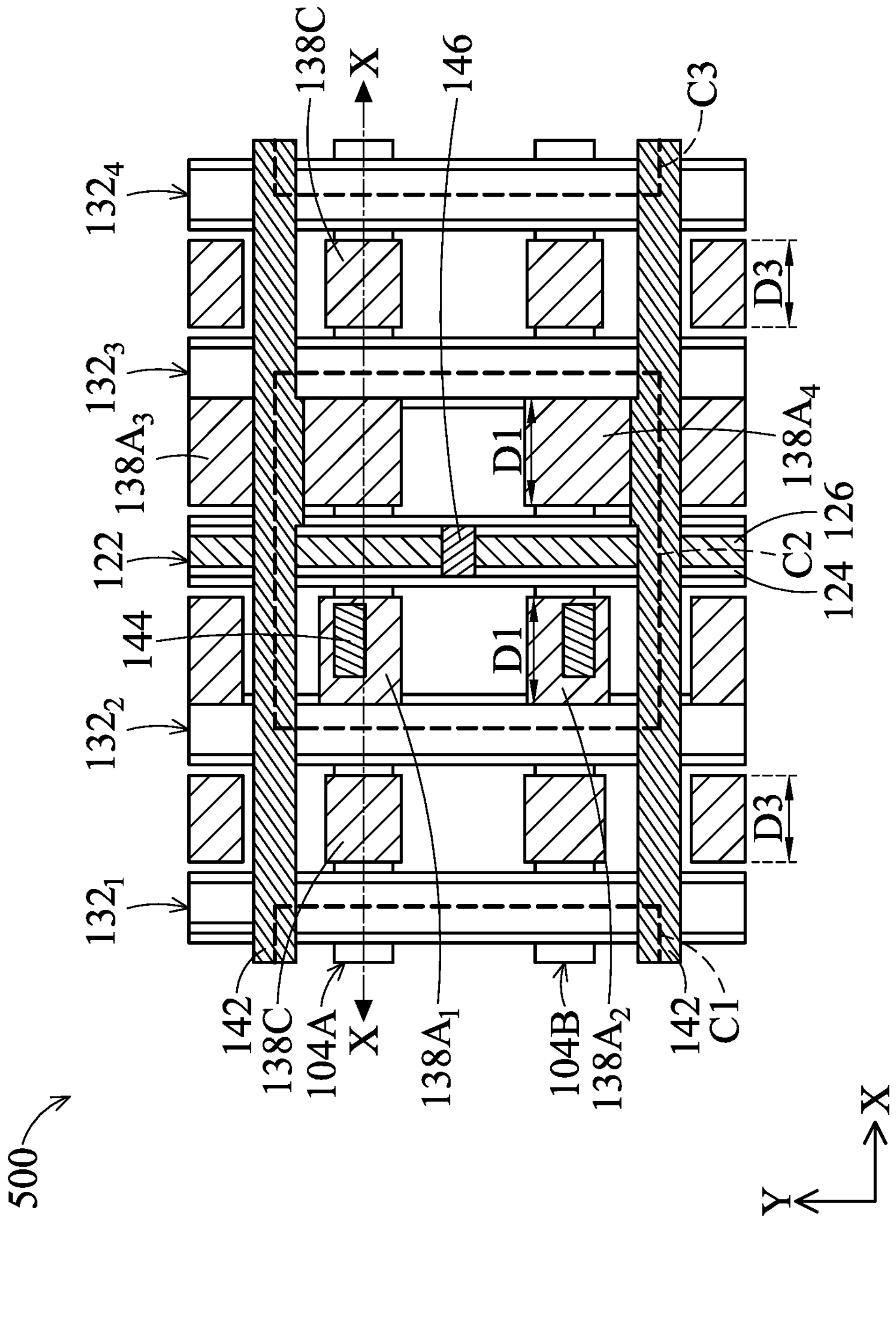
FIG. 6 is a plan view illustrating a semiconductor structure, in accordance with some embodiments of the disclosure.
Figures 1, 6:
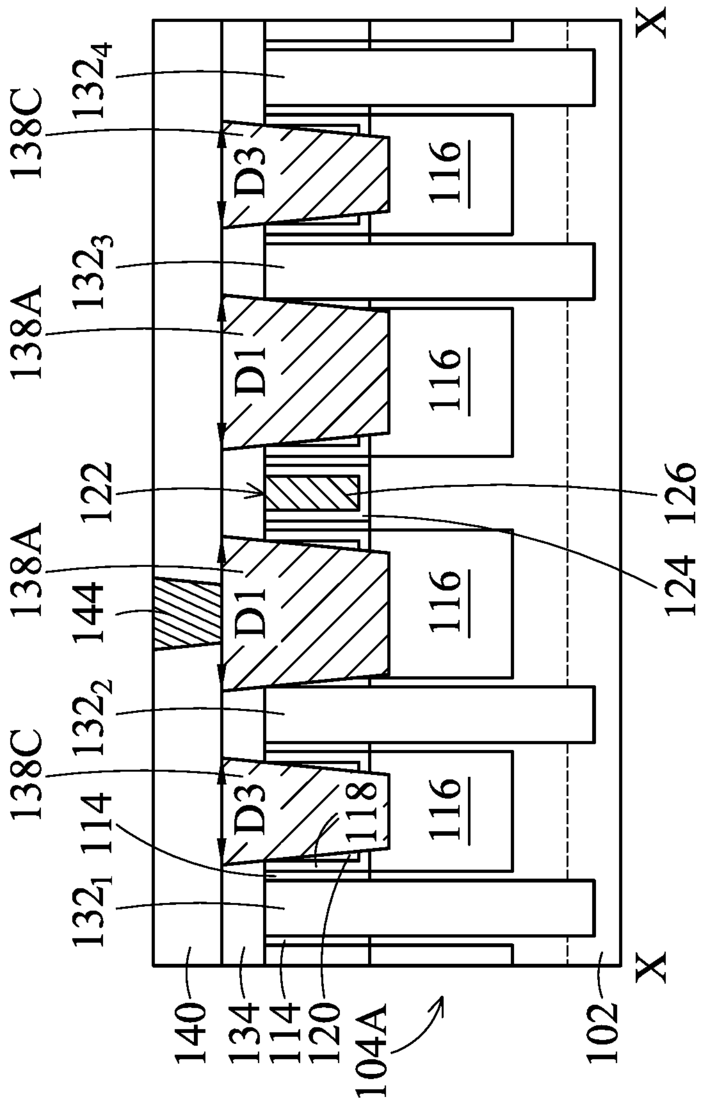

FIG. 6 is a plan view illustrating a semiconductor structure 500, in accordance with some embodiments of the disclosure. FIG. 6-1 is a cross-sectional view of the semiconductor structure 500 taken along line X-X of FIG. 6, in accordance with some embodiments of the disclosure. The semiconductor structure 500 of FIG. 6 is similar to the semiconductor structure 100 of FIG. 2G-1 except that the cell region C2 includes one functional gate.

In some embodiments, the functional circuit in the cell region C2 includes two functional transistors, which are located at the cross points between the fin structures 104A and 104B and the final gate stacks 122, as shown in FIG. 6. In some embodiments, the edges of the cell region C2 with respect to the X direction (extending in the Y direction) are aligned with the fin cutting structures $\mathbf{132_2}$ and $\mathbf{132_3}$. In an embodiment, the cell region C2 is an INVD1 (inverter with a driving strength of 1) cell which includes one functional gate, in accordance with some embodiments. The formation of the semiconductor structure 500 may be similar to the formation of the semiconductor structure 100 described above and in FIGS. 2A through 2G-3.

The contact plugs 138A and 138C land on and are electrically connected to the source/drain features 116, as shown in FIGS. 6 and 6-1, in accordance with some embodiments. In some embodiments, the contact plugs $\mathbf{138}A_1$ and $\mathbf{138}A_2$ are drain contact plugs that are electrically connected to the drain terminals of the FinFETs. In some embodiments, the vias 144 land on and are electrically connected to contact plugs $\mathbf{138}A_1$ and $\mathbf{138}A_2$.

In some embodiments, the contact plugs $\mathbf{138}A_3$ and $\mathbf{138}A_4$ are source contact plugs that are electrically connected to the source terminals of the FinFETs. In some embodiments, the vias 142 land on and are electrically connected to contact plugs $\mathbf{138}A_3$ and $\mathbf{138}A_4$. In some embodiments, the contact plugs 138C are located outside the cell regions C1, C2 and C3 and are dummy contact plugs with no vias are formed thereon.

In some embodiments, the contact plugs 138A have the dimensions D1 (e.g., widths) in the X direction. In some embodiments, the dimensions D1 are in a range from about 5.5 nm to about 20.5 nm. In some embodiments, the contact plugs 138C have the dimensions D3 (e.g., widths) in the X direction. In some embodiments, the dimensions D3 are in a range from about 5 nm to about 20 nm. In some embodiments, the contact plugs 138A are wider than the contact plugs 138C (i.e., D1>D3). In some embodiments, the dimensions D1 are greater than the dimensions D3 by about 0.5 nm to about 15 nm. In some embodiments, the ratio (D1/D3) of the dimensions D1 to the dimensions D3 is greater than 1, e.g., in a range from about 1.05 to about 4.

In some embodiments, the contact plugs 138A are closer to the fin cutting features 132 (e.g., $\mathbf{132_2}$ or $\mathbf{132_3}$) than to the final gate stacks 122. That is, the distance between the contact plugs 138A and the adjacent fin cutting features 132 is shorter than the distance between the contact plugs 138A and the adjacent final gate stacks 122. In some embodiments, the distance between the contact plugs 138A and the adjacent fin cutting features 132 is shorter than the distance between the contact plugs 138C and the fin cutting features 132.

In accordance with embodiments of the present disclosure, the widths of the contact plugs 138A are enlarged toward the fin cutting structure 132 while keeping the distance between the contact plugs 138A and the adjacent final gate stacks 122 constant, which may not increase the parasitic capacitance of the functional circuit in the cell region C2. The contact plugs 138A with the greater dimension D1 may reduce the overall resistance of the functional circuit in the cell region C2. In some embodiments where the functional circuit (e.g., in the cell region C2) includes one functional gate, all of the contact plugs have a reduced resistance. Therefore, the performance of the resulting semiconductor devices may be enhanced (e.g., speed).

Figure 7:
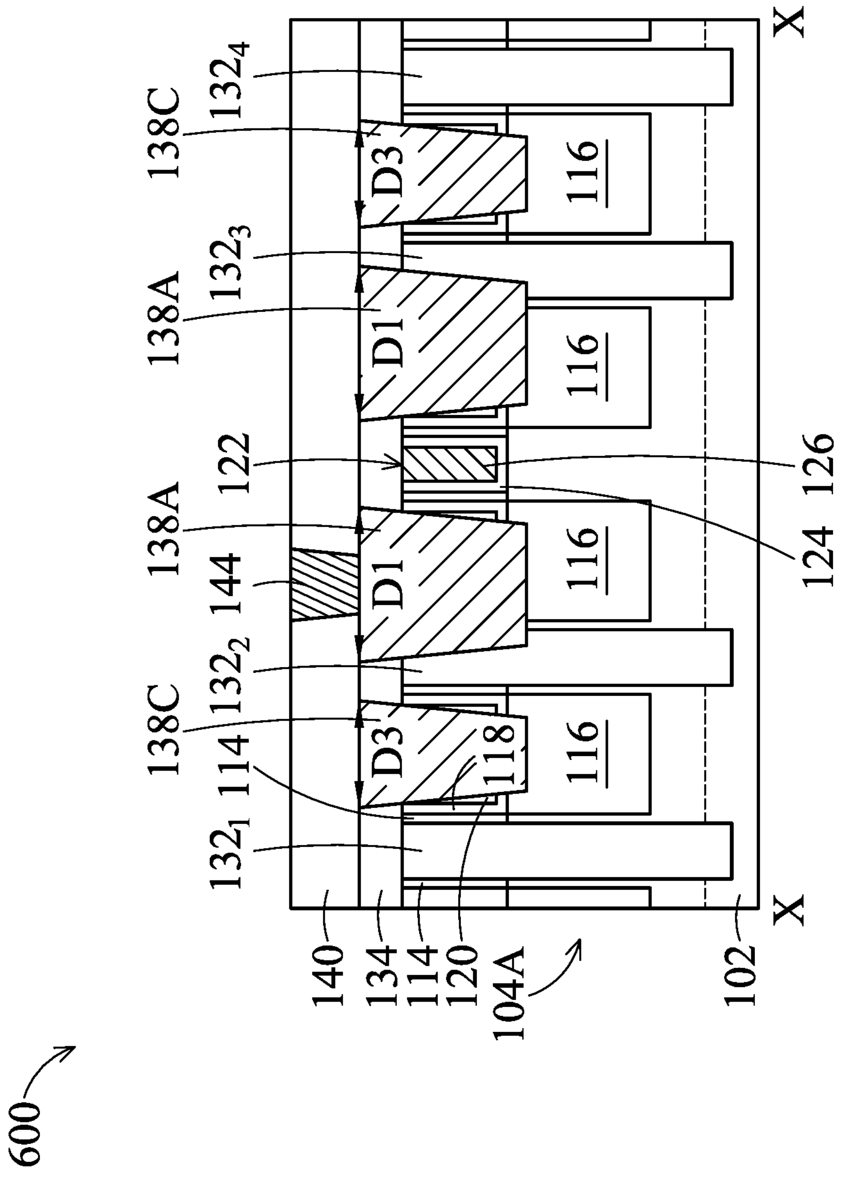
FIG. 7 is a modification of the semiconductor structure of FIG. 6, in accordance with some embodiments of the disclosure.

FIG. 7 is a modification of the semiconductor structure 500 of FIG. 6-1, in accordance with some embodiments of the disclosure. The semiconductor structure 600 of FIG. 7 is similar to the semiconductor structure 500 of FIG. 6-1 except that the contact plugs 138A have even larger widths.

The contact plugs 138A partially cut through the fin cutting structure 132 (e.g., $\mathbf{132_2}$ and $\mathbf{132_3}$) and have a greater dimension D1' in the X direction, as shown in FIG. 7, in accordance with some embodiments. The sidewalls and the bottom surfaces of the contact plugs 138A are in direct contact with the fin cutting structure 132, in accordance with some embodiments.

Figure 8:
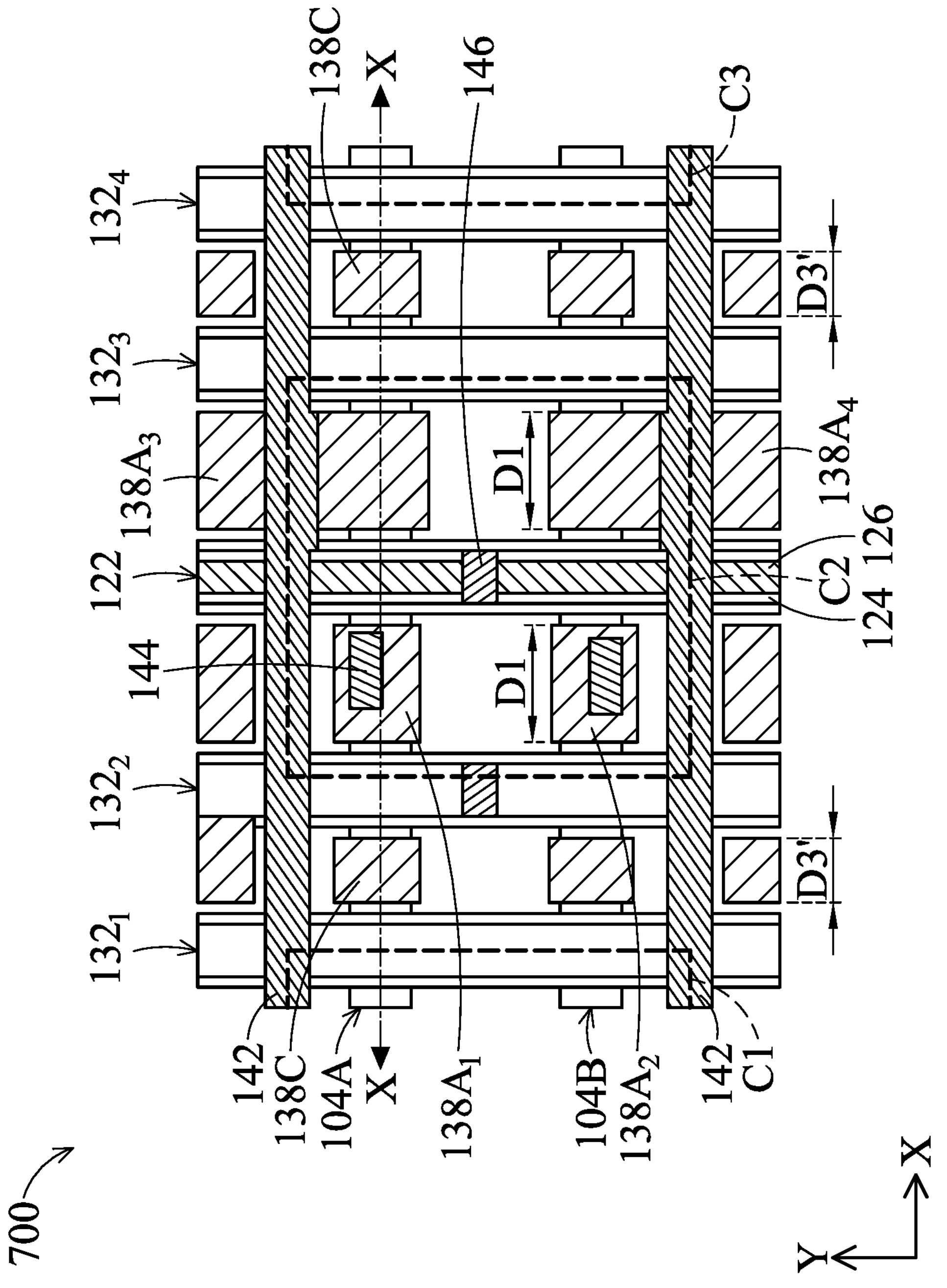
FIG. 8 is a plan view illustrating a semiconductor structure, in accordance with some embodiments of the disclosure.
Figures 1, 8:
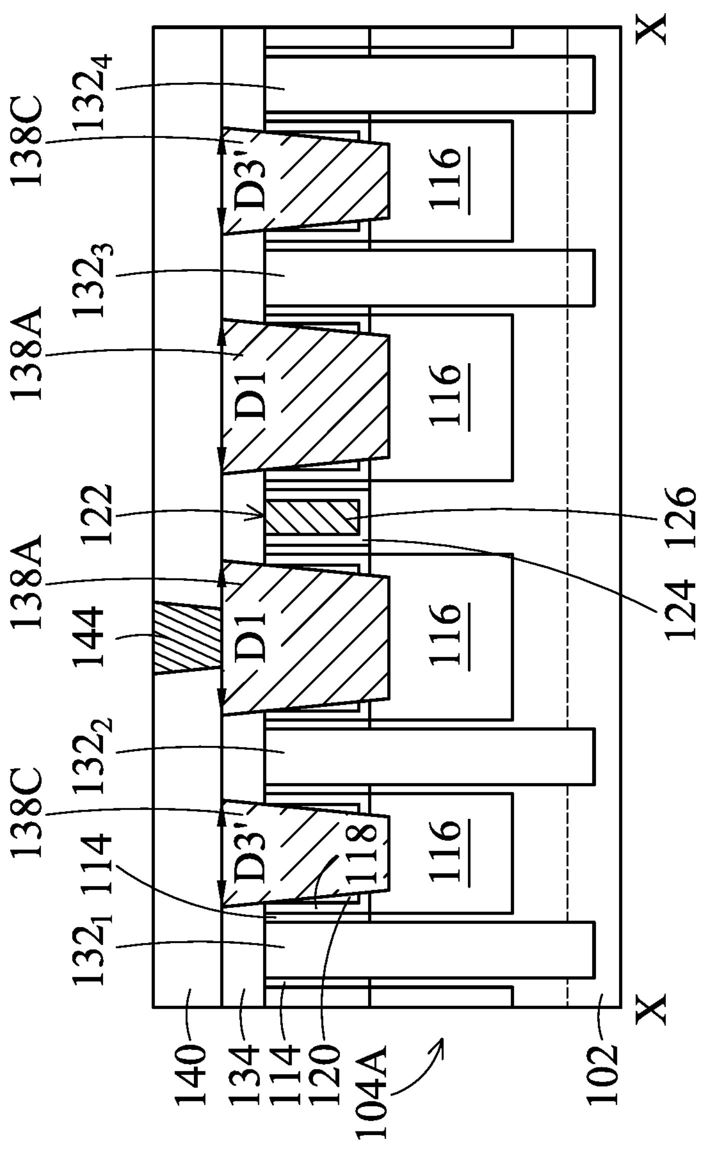

FIG. 8 is a plan view illustrating a semiconductor structure 700, in accordance with some embodiments of the disclosure. FIG. 8-1 is a cross-sectional view of the semiconductor structure 700 taken along line X-X of FIG. 8, in accordance with some embodiments of the disclosure. The semiconductor structure 700 of FIGS. 8 and 8-1 is similar to the semiconductor structure 500 of FIGS. 6 and 6-1 except that the fin cutting structures $\mathbf{132_2}$ and $\mathbf{132_3}$ are offset.

The fin cutting structure $\mathbf{132_2}$ (in place of the final gate stack $\mathbf{122_2}$) is offset toward the cell region C1, and the fin cutting structure $\mathbf{132_3}$ (in place of the final gate stack $\mathbf{122_7}$) is offset toward the cell region C3, in accordance with some embodiments.

The contact plugs 138A are spaced apart from the fin cutting structures $132_2$ and $132_3$ by the gate spacer layers 114 and the contact etching stop layer 118, as shown in FIGS. 8 and 8-1, in accordance with some embodiments. In some embodiments, the contact plugs 138C have smaller dimensions D3' (e.g., widths) in the X direction. In some embodiments, the dimensions D3' of the contact plug 138C are in a range from about 4.5 nm to about 19.5 nm. In some embodiments, the contact plug 138A are wider than the contact plug 138C (i.e., D1>D3'). The contact plugs 138A with the greater dimension D1 may reduce the overall resistance of the functional circuit in the cell region C2. Therefore, the performance of the resulting semiconductor devices may be enhanced.

Figure 9:
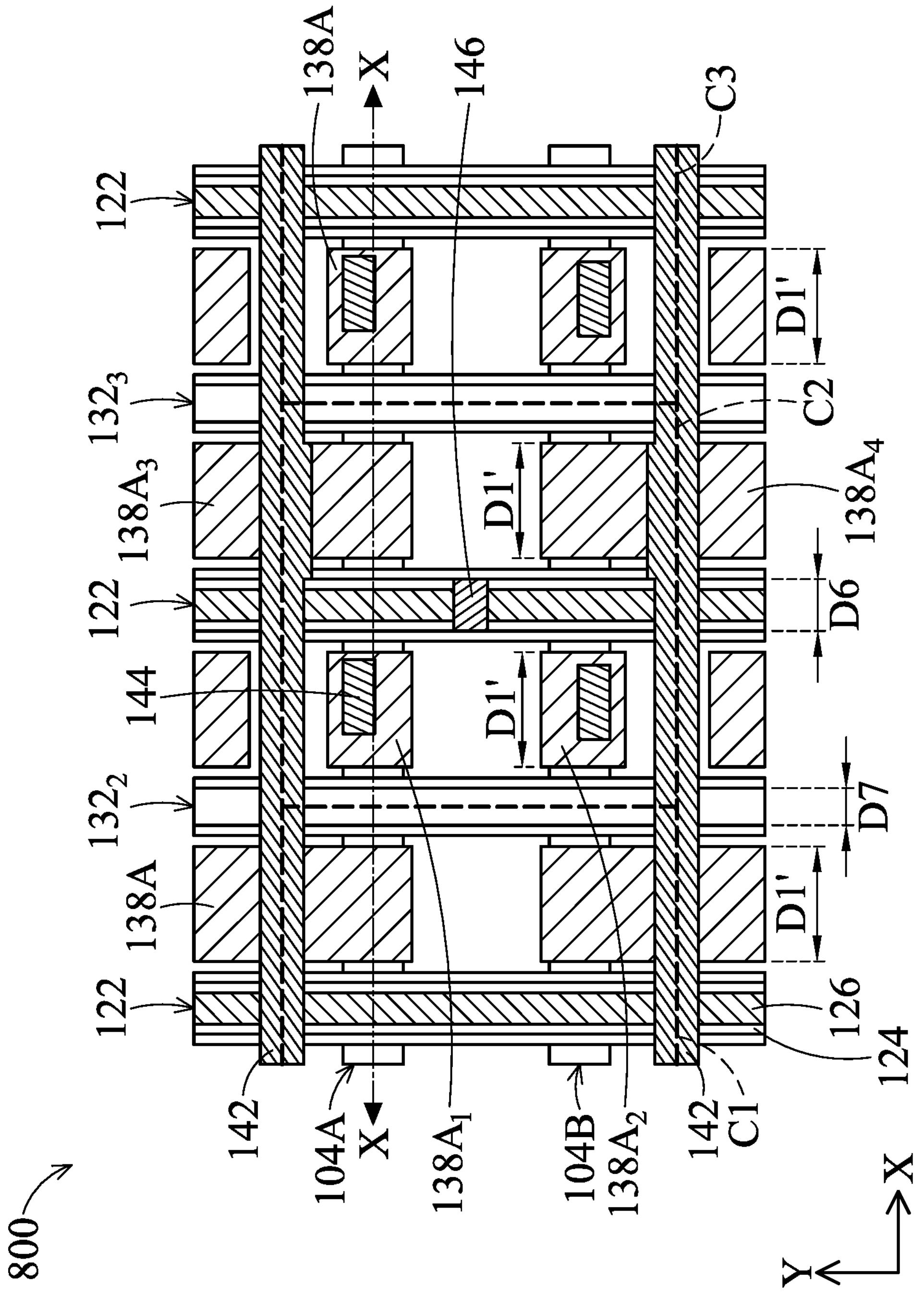
FIG. 9 is a plan view illustrating a semiconductor structure, in accordance with some embodiments of the disclosure.
Figures 1, 9:
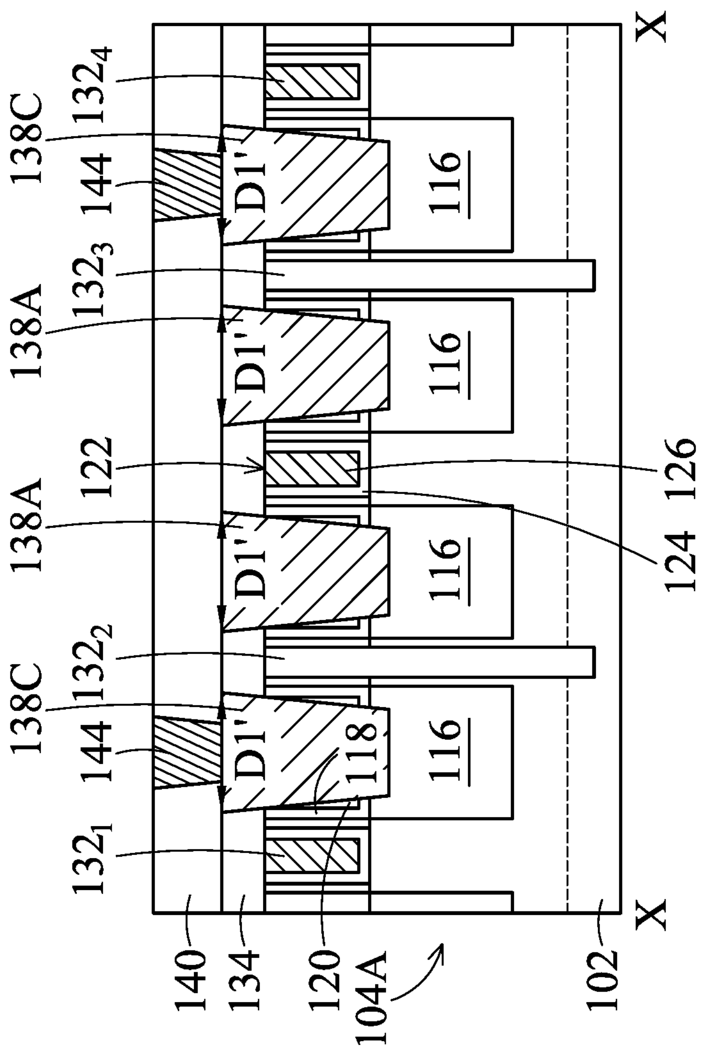

FIG. 9 is a plan view illustrating a semiconductor structure 800, in accordance with some embodiments of the disclosure. FIG. 9-1 is a cross-sectional view of the semiconductor structure 800 taken along line X-X of FIG. 9, in accordance with some embodiments of the disclosure. The semiconductor structure 800 of FIGS. 9 and 9-1 is similar to the semiconductor structure 500 of FIGS. 6 and 6-1 except that the fin cutting structures 132 have smaller widths.

The cell regions C1, C2 and C3 are connected to each other, in accordance with some embodiments. In some embodiments, the boundary between the cell region C1 and the cell region C2 is aligned with the fin cutting structure $132_2$. In some embodiments, the boundary between the cell region C2 and the cell region C3 is aligned with the fin cutting structure $132_3$.

In some embodiments, the final gate stacks 122 within the cell regions C1, C2 and C3 have dimensions D6 (e.g., widths) in the X direction. In some embodiments, the dimensions D6 are in a range from about 10 nm to about 25 nm. In some embodiments, the fin cutting structure $132_2$ and $132_3$ (in place of the final gate stacks 122 on the cell boundaries) have dimensions D7 (e.g., widths) in the X direction. In some embodiments, the dimensions D7 are shorter than the dimensions D6 and in a range from about 9 nm to about 24 nm.

In some embodiments, the contact plugs 138A are spaced apart from the fin cutting structures $132_2$ and $132_3$ by the gate spacer layers 114 and the contact etching stop layer 118, as shown in FIGS. 9 and 9-1, in accordance with some embodiments. In some embodiments, the contact plugs 138A have the dimensions D1' (e.g., widths) in the X direction. In some embodiments, the contact plug 138A are wider than the contact plug (not shown) located within the cell regions (e.g., C1 or C3) away from the cell boundaries. The contact plugs 138A with the greater dimension D1' may reduce the overall resistance of the functional circuit in the cell region C2. Therefore, the performance of the resulting semiconductor devices may be enhanced.

As described above, the semiconductor structure includes a contact plug 138A within the cell region C2 immediately adjacent to the cell edge, and a fin cutting structure 132 on the cell edge. The contact plug 138A is formed with a wider dimension by reducing the distance between the contact plug 138A and the fin cutting structure 132 while keeping the distance between the contact plug 138A and the adjacent final gate stack 122 constant. Therefore, the resistance of the functional circuit in the cell region C2 may be reduced, while the parasitic capacitance of the functional circuit may be not increased.

Embodiments of a semiconductor structure and the method for forming the same may be provided. The method for forming a semiconductor structure may include forming a first contact plug between a cutting structure and a first gate stack and a second contact plug between the first gate stack and the second gate stack. The first contact plug may be wider than the second contact plug. Therefore, the resistance of the functional circuit may be reduced, while the parasitic capacitance of the functional circuit may be not increased.

In some embodiments, a method for forming a semiconductor structure is provided. The method for forming the semiconductor structure includes forming a fin structure over a substrate in a first direction, forming a first gate stack, a second gate stack and a third gate stack across the fin structure, and removing the first gate stack to form a trench. The fin structure is cut into two segments by the trench. The method also includes depositing a cutting structure in the trench, and forming a first contact plug between the cutting structure and the second gate stack and a second contact plug between the second gate stack and the third gate stack. A first dimension of the first contact plug in the first direction is greater than a second dimension of the second contact plug in the first direction.

In some embodiments, a method for forming a semiconductor structure is provided. The method for forming the semiconductor structure includes forming a first fin structure over a substrate, forming a first source/drain feature and a second source/drain feature over the first fin structure, and forming an interlayer dielectric layer over the first source/drain feature and the second source/drain feature. The method also includes forming a first gate stack, a second gate stack and a third gate stack that are arranged consecutively in a direction over the first fin structure. The first source/drain feature is located between the first and second gate stacks. The second source feature is located between the second and third gate stacks. A first distance, which is the distance between the first gate stack and the second gate stack, is shorter than a second distance, which is the distance between the second gate stack and the third gate stack. The method also includes replacing the first gate stack and the second gate stack with a first cutting structure and a second cutting structure, respectively, and etching the interlayer dielectric layer to form a first opening exposing the second source/drain feature.

In some embodiments, a semiconductor structure is provided. The semiconductor structure includes a fin structure over a substructure. The semiconductor structure also includes a cutting structure, a first gate stack and a second gate stack that are arranged consecutively in a first direction and extends across the fin structure. The semiconductor structure also includes a first contact plug over a first source/drain region of the fin structure between the cutting structure and the first gate stack. The semiconductor structure also includes a second contact plug over a second source/drain region of the fin structure between the first gate stack and the second gate stack. A first dimension of the first contact plug in the first direction is greater than a second dimension of the second contact plug in the first dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a fin structure over a substrate in a first direction;

forming a first gate stack, a second gate stack and a third gate stack across the fin structure;

removing the first gate stack to form a trench, wherein the fin structure is cut into two segments by the trench;

depositing a cutting structure in the trench; and forming a first contact plug between the cutting structure and the second gate stack and a second contact plug between the second gate stack and the third gate stack, wherein a first dimension of the first contact plug in the first direction is greater than a second dimension of the second contact plug in the first direction;

wherein a first distance between the first gate stack and the second gate stack is greater than a second distance between the second gate stack and the third gate stack.

2. The method for forming the semiconductor structure as claimed in claim 1, wherein a first distance between the first contact plug and the cutting structure is shorter than a second distance between the first contact plug and the second gate stack.

3. The method for forming the semiconductor structure as claimed in claim 1, wherein the first contact plug is in contact with the cutting structure.

4. The method for forming the semiconductor structure as claimed in claim 1, comprising forming a third contact plug between the cutting structure and a second cutting structure, the third contact plug having a third dimension in the first direction different than the first dimension and the second dimension.

5. The method for forming the semiconductor structure as claimed in claim 1, further comprising:

forming an isolation structure surrounding a lower portion of the fin structure, wherein the first gate stack, the second gate stack and the third gate stack are formed over the isolation structure, where a bottom surface of the cutting structure is lower than a bottom surface of the isolation structure.

6. The method for forming the semiconductor structure as claimed in claim 1, further comprising:

forming a fourth gate stack across the fin structure, wherein the fourth gate stack is located in a first cell region of the substrate, the second gate stack and the third gate stack are located in a second cell region of the substrate, and the first gate stack extends along the first direction into a space between the first cell region and the second cell region.

7. The method for forming the semiconductor structure as claimed in claim 6, wherein a first distance between the first gate stack and the second gate stack is greater than a second distance between the first gate stack and the fourth gate stack.

8. The method for forming the semiconductor structure as claimed in claim 1, further comprising:

forming a via directly over the cutting structure, the first contact plug and the second gate stack and the third gate stack, wherein the via is electrically connected to the first contact plug and electrically isolated from the second contact plug.

9. The method for forming the semiconductor structure as claimed in claim 1, wherein a ratio of the first dimension to the second dimension is in a range from about 1.05 to about 4.

10. A method for forming a semiconductor structure, comprising:

forming a first fin structure over a substrate;

forming a first source/drain feature and a second source/drain feature over the first fin structure;

forming a first interlayer dielectric layer over the first source/drain feature and the second source/drain feature;

forming a first gate stack, a second gate stack and a third gate stack that are arranged consecutively in a first direction over the first fin structure, wherein the first source/drain feature is located between the first and second gate stacks, the second source feature is located between the second and third gate stacks, and a first distance between the first gate stack and the second gate stack is shorter than a second distance between the second gate stack and the third gate stack;

replacing the first gate stack and the second gate stack with a first cutting structure and a second cutting structure, respectively; and etching the first interlayer dielectric layer to form a first opening exposing the second source/drain feature.

11. The method for forming the semiconductor structure as claimed in claim 10, further comprising:

etching the first interlayer dielectric layer to form a second opening exposing the first source/drain feature, wherein the second opening is narrower than the first opening.

12. The method for forming the semiconductor structure as claimed in claim 10, further comprising:

forming a third source/drain feature over the first fin structure, wherein the first interlayer dielectric layer is formed over the third source/drain feature;

forming a fourth gate stack over the first fin structure, wherein the third gate stack is located between the second and fourth gate stacks, and the third source/drain feature is located between the third and fourth gate stacks; and etching the first interlayer dielectric layer to form a second opening exposing the third source/drain feature, wherein the second opening is narrower than the first opening.

13. The method for forming the semiconductor structure as claimed in claim 10, further comprising:

forming a second fin structure over a substrate, wherein the second cutting structure cuts through the first fin structure and the second fin structure.

14. The method for forming the semiconductor structure as claimed in claim 10, wherein replacing the first gate stack and the second gate stack with the first cutting structure and the second cutting structure comprises:

etching the first gate stack, the second gate stack and the first fin structure to form a first trench and a second trench, wherein the first trench and the second trench extend into the substrate; and depositing a dielectric material in the first trench and in second trench, wherein a first portion of the dielectric material in the first trench forms the first cutting structure, and a second portion of the dielectric material in the second trench forms the second cutting structure.

15. The method for forming the semiconductor structure as claimed in claim 10, further comprising:

forming a contact plug in the first opening; and forming a via over the second cutting structure and the contact plug, wherein the via includes:

a first portion directly above the third gate stack, having a first dimension in a second direction perpendicular to the first direction; and a second portion directly above the contact plug, having a second dimension in the second direction, wherein the second dimension is greater than the first dimension.

16. A method, comprising:

forming a fin structure extending lengthwise in a first direction;

forming a first gate stack, a plurality of second gate stacks, and a third gate stack across the fin structure;

forming a first trench by removing the first gate stack and a second trench by removing the third gate stack;

forming a first cutting structure in the first trench and a second cutting structure in the second trench;

forming a first contact plug between the first cutting structure and a first of the plurality of second gate tack stacks;

forming a second contact plug between a second of the plurality of second gate stacks and the second cutting structure; and forming a third contact plug between the first of the plurality of second gate stacks and the second of the plurality of second gate stacks, wherein a first dimension of the first contact plug in the first direction is different than a second dimension of the third contact plug in the first direction.

17. The method of claim 16, wherein forming the third contact plug comprises forming the third contact plug having a third dimension in the first direction that is different than the second dimension.

18. The method of claim 16, wherein forming the third contact plug comprises forming the third contact plug having a third dimension in the first direction that is substantially equal to the first dimension.

19. The method of claim 16, comprising:

forming a fourth gate stack adjacent the first gate stack;

replacing the fourth gate stack with a third cutting structure; and forming a fourth contact plug between the first cutting structure and the third cutting structure, the fourth contact plug having a third dimension in the first direction that is different than the first dimension and the second dimension.

20. The method of claim 19, wherein:

forming the fourth contact plug comprises forming the fourth contact plug having the third dimension that is less than the second dimension; and the second dimension is less than the first dimension.

* * * * *